(12) United States Patent
Ooishi

(10) Patent No.: US 6,473,360 B2
(45) Date of Patent: Oct. 29, 2002

(54) SYNCHRONOUS SEMICONDUCTOR MEMORY DEVICE CAPABLE OF HIGH SPEED READING AND WRITING

(75) Inventor: Tsukasa Ooishi, Hyogo (JP)

(73) Assignee: Mitsubishi Denki Kabushki Kaisha, Tokyo (JP)

( * ) Notice: Subject to any disclaimer, the term of this patent is extended or adjusted under 35 U.S.C. 154(b) by 0 days.

(21) Appl. No.: 09/882,037

(22) Filed: Jun. 18, 2001

(65) Prior Publication Data

US 2001/0043507 A1 Nov. 22, 2001

Related U.S. Application Data

(63) Continuation of application No. 09/593,957, filed on Jun. 15, 2000, now Pat. No. 6,272,066, which is a continuation of application No. 09/246,726, filed on Feb. 9, 1999, now Pat. No. 6,134,179.

(30) Foreign Application Priority Data

May 22, 1998 (JP) ............................................. 10-141621
Sep. 7, 1998 (JP) ............................................. 10-252893

(51) Int. Cl.[7] ................................................ G11C 13/00
(52) U.S. Cl. .................. 365/233; 365/189.05; 365/221; 365/230.08
(58) Field of Search ................................. 365/233, 221, 365/230.08, 189.05

(56) References Cited

U.S. PATENT DOCUMENTS

| | | | | |
|---|---|---|---|---|
| 5,034,962 A | * | 7/1991 | Yamamoto et al. | ............. 375/8 |
| 5,323,426 A | * | 6/1994 | James et al. | ................ 375/118 |
| 5,617,393 A | * | 4/1997 | Itami et al. | .................. 369/58 |
| 5,673,233 A | | 9/1997 | Wright et al. | |
| 5,923,595 A | | 7/1999 | Kim | |
| 5,926,434 A | | 7/1999 | Mori | |
| 5,982,697 A | | 11/1999 | William et al. | |
| 6,037,925 A | * | 3/2000 | Kim | ............................ 345/99 |

FOREIGN PATENT DOCUMENTS

JP  7-140207  6/1995

\* cited by examiner

*Primary Examiner*—Son T. Dinh
(74) *Attorney, Agent, or Firm*—McDermott, Will & Emery

(57) ABSTRACT

An address input is received earlier than data input, and a result of decoding of a column address at the time of writing and results of substitution determination for a redundancy memory column are held in a latch circuit corresponding to each bank. When the data arrives at the bank, the data is immediately written to each bank, utilizing the results of address processing. Operation frequency of the chip is not limited by the conventionally experienced wasteful wait time for the data in the process of writing, and efficient data input/output is possible.

7 Claims, 53 Drawing Sheets

FIG. 4 CHIP PROCESSING METHOD

DATA FLOW AT THE TIME OF READING HALF REGION OF THE CHIP

TRANSMISSION OF READ DATA TO DQ FROM THE BANKS IN THIS REGION IS FAST (FAR BANK)

TRANSMISSION OF READ DATA TO DQ FROM THE BANKS IN THIS REGION IS SLOW (CLOSE BANK)

DATA FLOW AT THE TIME OF WRITING

SYNCHRONOUS SEMICONDUCTOR MEMORY DEVICE CAPABLE OF HIGH SPEED READING AND WRITING

This application is a Continuation of application Ser. No. 09/593,957, filed Jun. 15, 2000, now U.S. Pat. No. 6,272,066, which is a Continuation application of Ser. No. 09/246,726, filed Feb. 9, 1999, now U.S. Pat. No. 6,134,179.

BACKGROUND OF THE INVENTION

1. Field of the Invention

The present invention relates to a synchronous semiconductor device and, more specifically, to a synchronous semiconductor memory device capable of high speed operation.

2. Description of Background of Art

In a conventional memory, processing of an input address proceeds in most cases simultaneously with processing of data. Here, as to the time of processing until the data is written to a memory cell, the time necessary for processing an address is longer than the time necessary for data processing. Processing of address takes time as it involves complicated processes such as determination of the necessity of redundancy processing for repairing defective memory cell and internal re-addressing. This time limits operation performance of the chip.

FIG. 55 represents the conventional flow of address processing.

Referring to FIG. 55, at the time of writing, an externally input address and data are taken through an input buffer to the semiconductor memory device approximately at the same time. Thereafter, data is distributed to the memory array along a data path. The address, on the other hand, may be subjected to logic conversion or logical processing such as redundancy determination for repairing defect, if any, or a process for generating burst addresses. The time necessary for address processing increases as the process content becomes complicated. After the end of logical processing, decoding takes place for activating a selecting signal YS for column selection. By this time, the data has already been transmitted to the memory array. In other words, the data is kept waiting until the selecting signal YS is activated, and this wasteful wait time limits operation frequency of the chip.

Various and many forms of memories have been proposed to realize high speed operation in recent semiconductor memory devices. High speed operation is also demanded for address processing.

SUMMARY OF THE INVENTION

An object of the present invention is to prevent the time necessary for complicated address processing, especially the redundancy determination for repairing defect or the process of internal address conversion from limiting data transmission, and to improve operation performance of a semiconductor memory device.

Another object of the present invention is to increase speed of redundancy determination for a plurality of addresses while suppressing increase in chip area.

A further object of the present invention is to reduce power consumption at the time of self refresh.

Briefly stated, the present invention provides a synchronous semiconductor memory device receiving address signals and control signals in synchronization with an external clock signal and inputs/outputs stored data, including a plurality of memory cell blocks, an address bus and a plurality of selecting circuits.

The plurality of memory cell blocks each includes a plurality of memory cells arranged in a matrix of rows and columns. The address bus is provided common to the plurality of memory cell blocks, and transmits the address signals to each of the plurality of memory cell blocks. The address bus includes an address signal line for time-divisionally transmitting a row address signal designating a memory cell position in the row direction and a column address signal designating a memory cell position in the column direction. The plurality of selecting circuits are provided corresponding to the memory cell blocks, and select a memory cell in response to the address signals from the address bus. Each selecting circuit includes a column selecting circuit holding a data corresponding to the column address signal and selecting a column of the memory cells in response to the column address signal.

According to another aspect, the present invention provides a synchronous semiconductor memory device receiving address signals and control signals in synchronization with an external clock signal and inputting/outputting stored data, including a plurality of memory cell blocks, an address bus, a plurality of redundancy determining circuits, and an address converting circuit.

The plurality of memory cell blocks each include a plurality of memory cells arranged in a matrix of rows and columns. The address bus is provided common to the plurality of memory cell blocks, and transmits the address signals to each of the plurality of memory cell blocks. The address bus includes an address signal line for time divisionally transmitting a row address signal designating a memory cell position in the row direction and a column address signal designating a memory cell position in the column direction. Each memory cell block includes a plurality of normal memory portions holding stored data and a plurality of redundant memory portions for repairing defective memory cell. The address converting circuit generates a plurality of addresses corresponding to the address signals. The plurality of redundancy determining circuits each determine whether the normal memory portions should be substituted for by the plurality of redundant memory portions in response to the address signals. Each redundancy determining circuit includes an address setting unit for setting a substitute address corresponding to an address of a defective memory cell, and plurality of comparing circuits provided corresponding to the plurality of addresses respectively, comparing and detecting matching between the substitute address and the plurality of addresses.

According to a still further aspect, the present invention provides a synchronous semiconductor memory device receiving address signals and control signals in synchronization with an external clock signal and inputting/outputting stored data, including a plurality of memory cell blocks, an address bus, a plurality of selecting circuits, a self refresh control circuit and a refresh address bus.

The plurality of memory cell blocks each include a plurality of memory cells arranged in a matrix of rows and columns. The address bus is provided common to the plurality of memory cell blocks and transmits the address signals to each of the plurality of memory cell blocks. The address bus includes an address signal line for time-divisionally transmitting a row address signal designating a memory cell position in the row direction and a column address signal designating a memory cell position in the column direction. The plurality of selecting circuits are provided corresponding to the memory cell blocks and select a memory cell in response to the address signals from the address bus. Each selecting circuit includes a holding circuit for holding data corresponding to the address signals. The self refresh control circuit generates a refresh address data in a self refresh mode. The refresh address bus transmits the refresh address data to the holding circuit.

Accordingly, an advantage of the present invention is that address related pre-processing is terminated before data arrival in column selection, and therefore input/output of data arriving at the memory block earlier than at a terminal is not limited by the address related pre-processing or the like, whereby high speed data input/output is possible.

Another advantage of the present invention is that, as redundancy determination for a plurality of addresses is performed in parallel, the speed of operation is increased, and that, as the portion for setting the substitute address is shared, chip area is not increased.

A still further advantage of the present invention is that power supply to the decode circuit and the like provided corresponding to the memory cell blocks can be kept off, and therefore power consumption at the time of self refresh can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
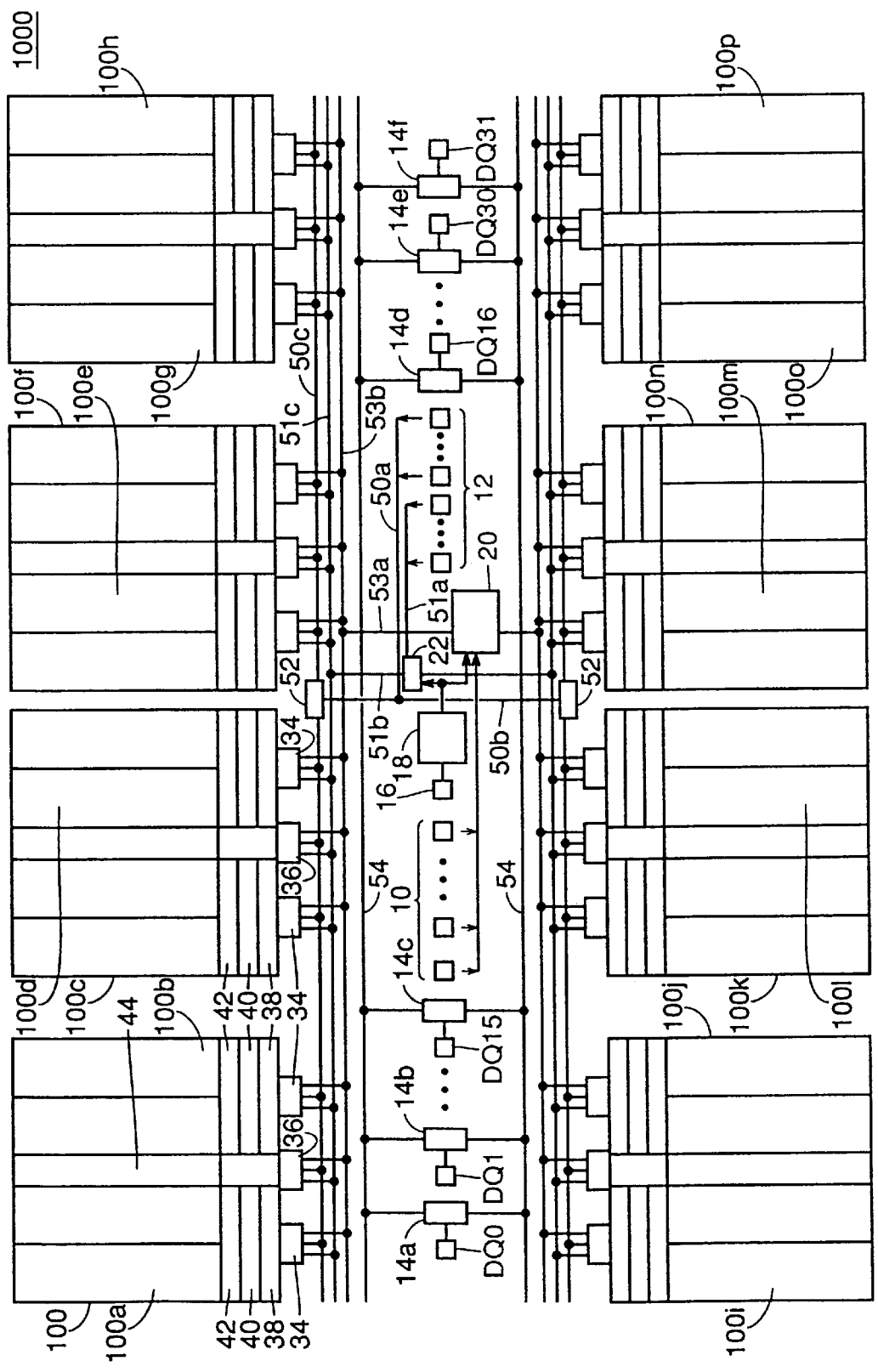
FIG. 1 schematically shows an overall configurations synchronous semiconductor memory device 1000 in accordance with a first embodiment of the present invention.

FIG. 1 schematically shows an overall configuration of a synchronous semiconductor memory device 1000 in accordance with a first embodiment of the present invention.

Referring to FIG. 1, synchronous semiconductor memory device 1000 includes a control circuit 20 receiving external control signals /RAS, /CAS, /W, /CS and the like applied through external control signal input terminals 10, decoding these signals and generating internal control signals, command data buses 53a and 53b for transmitting the internal control signals output from control circuit 20, and a memory cell array 100 including a plurality of memory cells arranged in rows and columns.

Memory cell array 100 is arranged divided into a total of 16 memory cell blocks 100a to 100p, as shown in FIG. 1. For example, assuming that storage capacity of synchronous semiconductor memory device 1000 is 1 G bits, each memory cell block has the capacity of 64 M bits. Each block is adapted to be operable as a bank independently.

Synchronous semiconductor memory device 1000 further includes an internal synchronous signal generating circuit 18 receiving an external clock signal Ext. CLK applied to clock signal input terminal 16, starting synchronous operation under the control by control circuit 20, outputting an internal clock signal int. CLK.

Internal synchronous signal generating circuit 18 generates, by a delay locked loop circuit (hereinafter referred to as a DLL circuit) or the like, an internal dock signal int. CLK which is synchronized with the external clock signal Ext. CLK.

External address signals A0 to Ai (i: natural number) applied through address signal input terminals 12 are taken into synchronous semiconductor memory device 1000 in synchronization with internal clock signal int. CLK under the control of control circuit 20.

Of the external address signals A0 to Ai, a prescribed number of bits are applied through address bus 51a to bank decoder 22. From bank decoder 22, decoded bank addresses B0 to B7 are transmitted to respective banks through address buses 51b and 51c.

Meanwhile, other external address signals applied to address signal input terminals 12 are transmitted through address buses 50a and 50b to address driver 52. Further, address signals are transmitted to respective banks (memory cell blocks) from address driver 52 to address bus 50c.

Synchronous semiconductor memory device 1000 further includes: a row predecoder 36 provided for each pair of memory cell blocks, for latching and predecoding a row address transmitted by address bus 50c under the control of control circuit 20; a row decoder 44 for selecting a corresponding row (word line) of the selected memory cell block based on an output from row predecoder 36; a column predecoder 34 provided for each memory cell block for latching and predecoding a column address transmitted by address bus 50c under the control of control circuit 20; a column predecoder line 40 transmitting an output from predecoder 34; and a column decoder 42 for selecting a corresponding column (bit line pair) of the selected memory cell block based on an output from column predecoder line 40.

Synchronous semiconductor memory device 1000 includes: input terminals DQ0 to DQ15 and DQ16 to DQ31 arranged in a region along a longer side at a central portion of the chip and outside that region where external control signal input terminals 10 and address signal input terminals 12 are provided; input/output buffer circuits 14a to 14f provided corresponding to data input/output terminals DQ0 to DQ31; a data bus 54 for transmitting data between the input/output buffers and the corresponding memory cell blocks; and read/write amplifiers 36 each provided corresponding to paired ones of memory cell blocks 100a to 100p, respectively, for exchanging data with data bus 54 and selected column of memory cells.

The signal /RAS applied to external control signal input terminals 10 is a row address strobe signal for starting internal operation of synchronous semiconductor memory device 1000 and determining active period of the internal operation. In response to activation of the signal /RAS, circuits related to row selecting operation of memory cell array 100, such as row decoder 44, are set to an active state.

The signal /CAS applied to external control signal input terminals 10 is a column address strobe signal for setting circuits related column selection in memory cell array 100 to an active state.

The signal /CS applied to external control signal input terminals 10 is a chip select signal indicating that the synchronous semiconductor memory device 1000 is selected, and the signal /W designates writing operation to synchronous semiconductor memory device 1000.

The operation of taking signals /CS, /RAS, /CAS and /W takes place in synchronization with internal dock signal int. CLK.

Further, the operation of taking address signals applied to address signal input terminals 12 and exchange of data through data input/output terminals DQ0 to DQ31 also take place in synchronization with internal clock signal int. CLK.

Data input/output terminals DQ0 to DQ31 are allocated 16 by 16 to two portions, divided along the longer side of the chip, and each terminal inputs/outputs data to and from the memory array. This configuration is referred to as Outer DQ Inner Clock (hereinafter referred ODIC).

Figure 2:
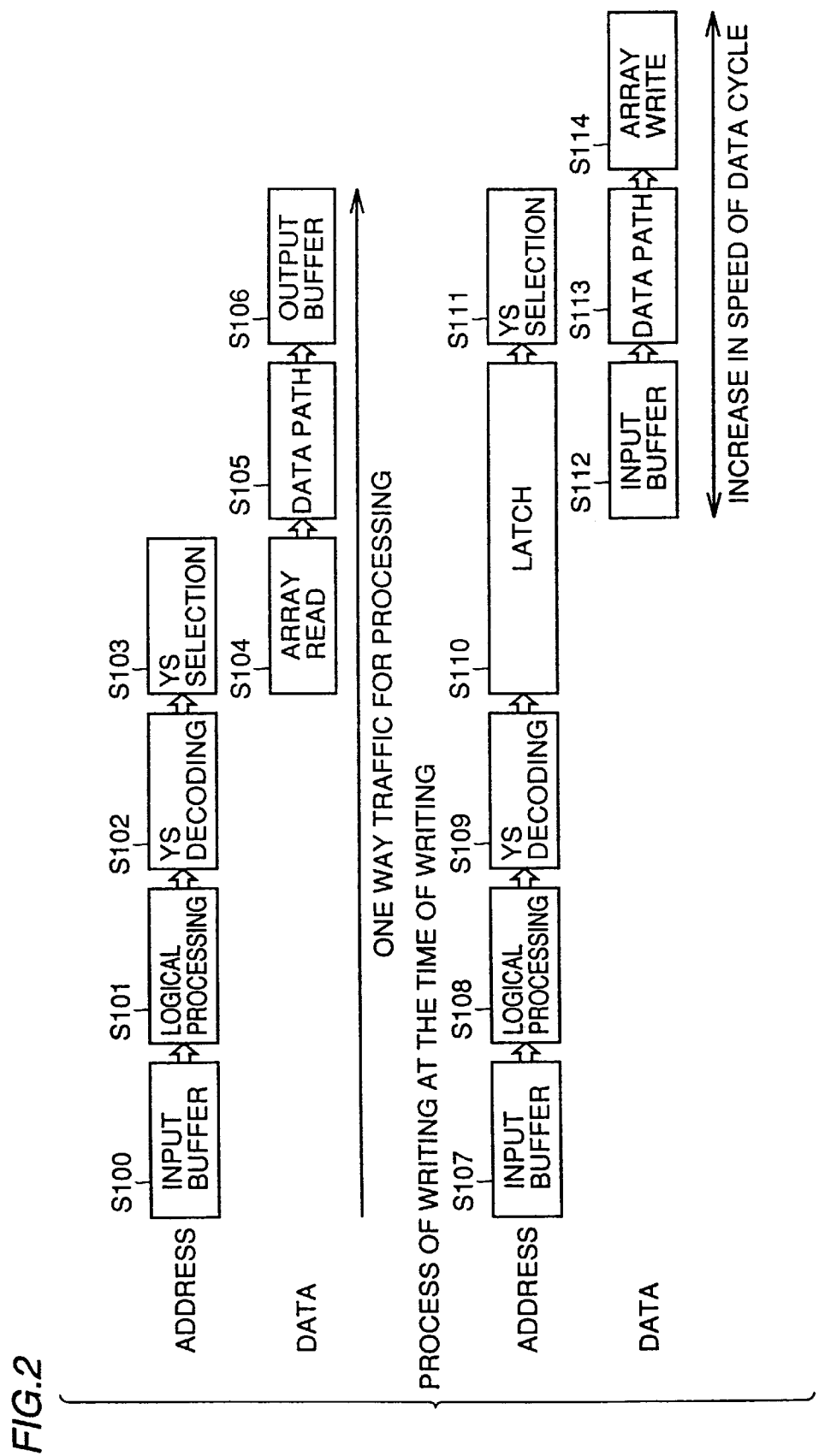
FIG. 2 is an illustration representing a flow of control at the time of reading and writing adopted in the present invention.

FIG. 2 is an illustration showing a flow of control at the time of reading and writing adopted in the present invention.

Referring to FIG. 2, at the time of reading, an address is input to an input buffer in step S100. The input address is subjected to logical processing such as burst address processing or address conversion, in step S101. Thereafter, a selecting signal YS for the memory cell is decoded in step S102, and the selecting signal YS corresponding to a normal memory cell is selected and activated in step S103.

When the selecting signal YS is activated, data is read from the memory array in step S104, output to a data path in step S105, and the data is read from the output buffer to the outside in step S106.

In a very large chip having the capacity as large as 1 G bits, internal signal propagation time so increases as to limit operation frequency of the chip. Therefore, in the method of control adopted in the present invention, one way traffic of signal flow is provided to enable optimal signal cycle for each bank, so as to prevent generation of waste time.

At the time of writing, an address is input to the input buffer in step S107. The input address is subjected to logical processing such as burst address processing or address conversion in step S108. Thereafter, the selecting signal YS corresponding to a normal memory cell is decoded in step S109, and latched and held temporarily in the memory block to wait for data arrival in step S110. The data is input to the chip in step S112 delayed from the address, by a process of a system outside the chip. The delay may be derived from intentional delayed input of the data, or unavoidable natural delay caused by the specification of external bus of the chip.

Thereafter, the data is transmitted through the data path to the memory block in step S113. Upon data arrival, selecting signal YS is activated in step S111, and the data is written to the memory array in step S114.

Therefore, the chip operation frequency is not limited by the wasteful data wait time experienced in the conventional process of writing described with reference to FIG. 50, and efficient data exchange is possible.

Control in a very large chip will be described.

Here, a bank near the central portion of the chip will be referred to as a central bank, and a bank far from the central portion of the chip will be referred to as a far bank. The central bank is determined not merely by the physical arrangement of the memory bank in the chip, and the central bank refers to that bank which is positioned at a highest position among flow of addresses and command signals. By contrast, the far bank refers to that bank which is positioned at the lowest position among the flow of addresses and command signals. Though two banks, that is, central and far banks will be discussed in the following, the banks may be classified into finer groups with different delays, or the bank may further be divided.

In the configuration shown in FIG. 1, the central bank for the address input may be memory cell blocks 100*d* and 100*e*, while far bank may correspond to memory cell blocks 100*a* and 100*h*. For data input/output, the far bank may be memory cell blocks 100*d* and 100*e*, while the central bank may be memory cell blocks 100*a* and 100*h*, in contrast to those for the address input.

This is one of the features of the aforementioned ODIC configuration.

Figure 3:
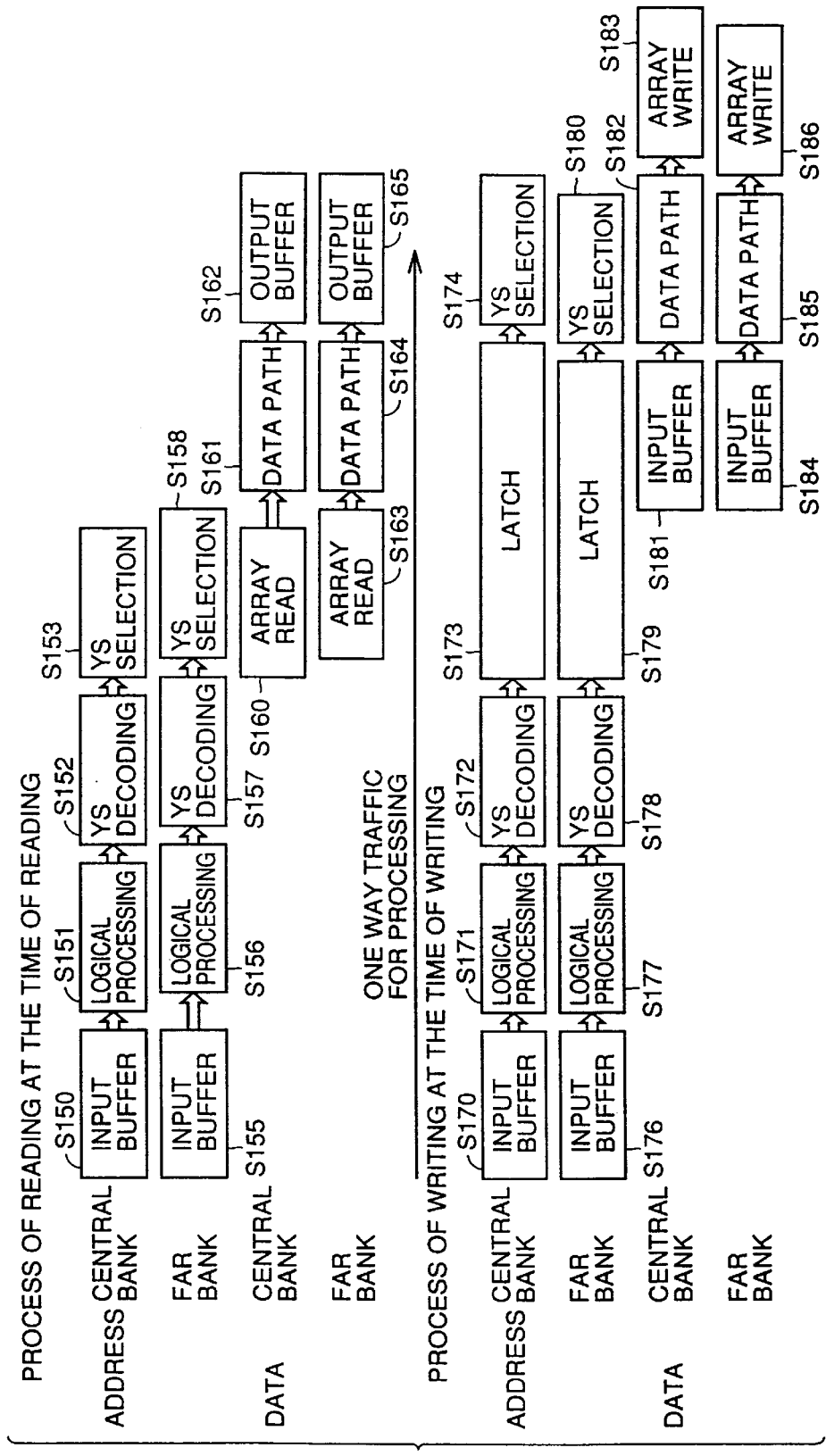
FIG. 3 is an illustration representing control in reading and writing on a very large chip.

FIG. 3 is an illustration related to control in reading and writing in a very large chip.

Referring to FIG. 3, at the time of reading, an address is input to the input buffer in step S150 for the central bank. The input address is subjected to logical processing such as burst address processing or address conversion in step S151. Thereafter, the corresponding selecting signal YS is decoded in step S152, and the selecting signal YS is selected and activated in step S153.

In the far bank, by contrast, the address is input at the same timing as to the central bank (step S155) while the subsequent processing is performed with a delay as extra time is necessary until reaching the bank (step S156 to S158).

Therefore, the timing at which the data is read from a memory array of the bank is earlier in the central bank (step S160) than the timing in the far bank (step S163). The central bank, however, is further away from data terminal DQ than the far bank, and therefore the time of propagation of the data is longer for the central bank (steps S161, S162) than the far bank (steps S164, S165). Therefore, the time from the input of the address to the input buffer to the output of data from the output buffer is almost the same between the central bank and the far bank.

More specifically, by the ODIC configuration, the sum of the time necessary for address and command signal transmission and the time necessary for data transmission is made smaller than the prior art example in any bank, and the absolute value of the sum of the time for data transmission is also made smaller.

At the time of writing, in the central bank, the address is input to the input buffer and subjected to logical processing, the selecting signal YS is decoded, and activating information for the selecting signal YS is held in a latch (steps S170 to S173). Similarly, in the far bank, the address is input to the input buffer and subjected to logical processing, the selecting signal YS is decoded and the activating information for the selecting signal YS is held in the latch (steps S176 to S179).

The data is input to the input buffer delayed from the address buffer and arrives at the central bank and the far bank at different timings (steps S181 to S182, S184 to S185). Thereafter, upon arrival of the data, the selecting signal YS is activated. When the selecting signal YS is activated, writing to the memory array takes place (steps S183, S186).

Figure 4:
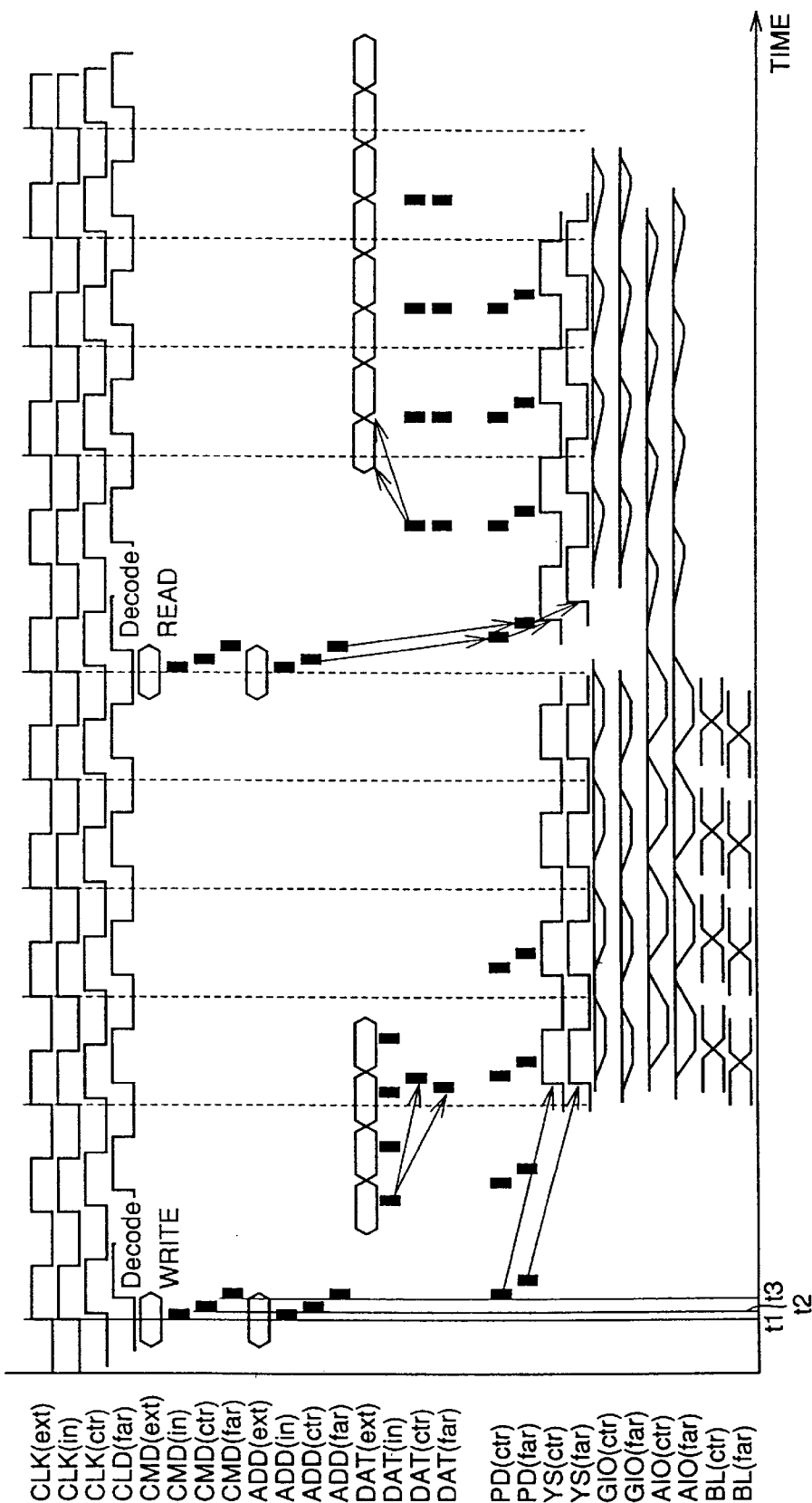
FIG. 4 is a diagram of waveforms related to data input/output to and from a bank.

FIG. 4 is a diagram of waveforms illustrating data exchange to and from the bank.

Referring to FIG. 4, the reference characters in the parenthesis following the name of signals will be described. Here, (ext) represents a signal in a stage of input from the outside to the pad, (in) refers to a signal at an inner central processing portion, (ctr) represents a signal at the central bank portion, and (far) represents a signal at the far bank portion.

The externally input CLK (ext) has its waveform reproduced by a DLL circuit or the like, and therefore the internal clock CLK (in) has almost the same waveform as the external clock signal CLK (ext). At time t1, in synchronization with the rise of clock signal CLK, a command CMI) (ext) and an address ADD (ext) are input. When the commands and addresses are distributed to the banks, there is generated a difference in the time of arrival at the central bank portion and the far bank portion. At time t2, command CMD (ctr) and address (ctr) arrive at the central bank almost simultaneously, and at time t3, command CMD (far) and address (far) arrive at the far bank almost simultaneously. More specifically, when the central bank portion and the far bank portion are compared, the addresses have phases shifted. Provided that the addresses and the commands are transmitted in the same direction, however, skew in these among banks is small, while operation margin in the bank is increased.

In a synchronous dynamic random access memory (hereinafter referred to as an SDRAM) which is a synchronous semiconductor memory device, it is necessary to perform address processing (generation of an initial value of the address, generation of burst addresses, redundancy determination for the generated address) when an external address is input.

At the time of writing, the aforementioned process is performed in an address input cycle, and thereafter the result of processing is latched internally. In a cycle in which the data is actually transmitted, it is possible to activate the selecting signal YS corresponding to the result of processing and to write data at high speed upon triggering, simply by transmitting the latched result of processing to the array.

Conventionally, address processing takes time, and the dining of activation of the selecting signal YS is delayed relative to the arrival of the data at the memory array. In the synchronous semiconductor memory device in accordance with the present invention, when the data is actually input, the selecting signal YS is activated simply by transmitting the processed address to the memory array, timed with the data transmission.

Therefore, even when the operation cycle mode changes in the case of a reading operation following a writing operation and thus equalization or precharging is required, sufficient time is ensured.

Figure 5:
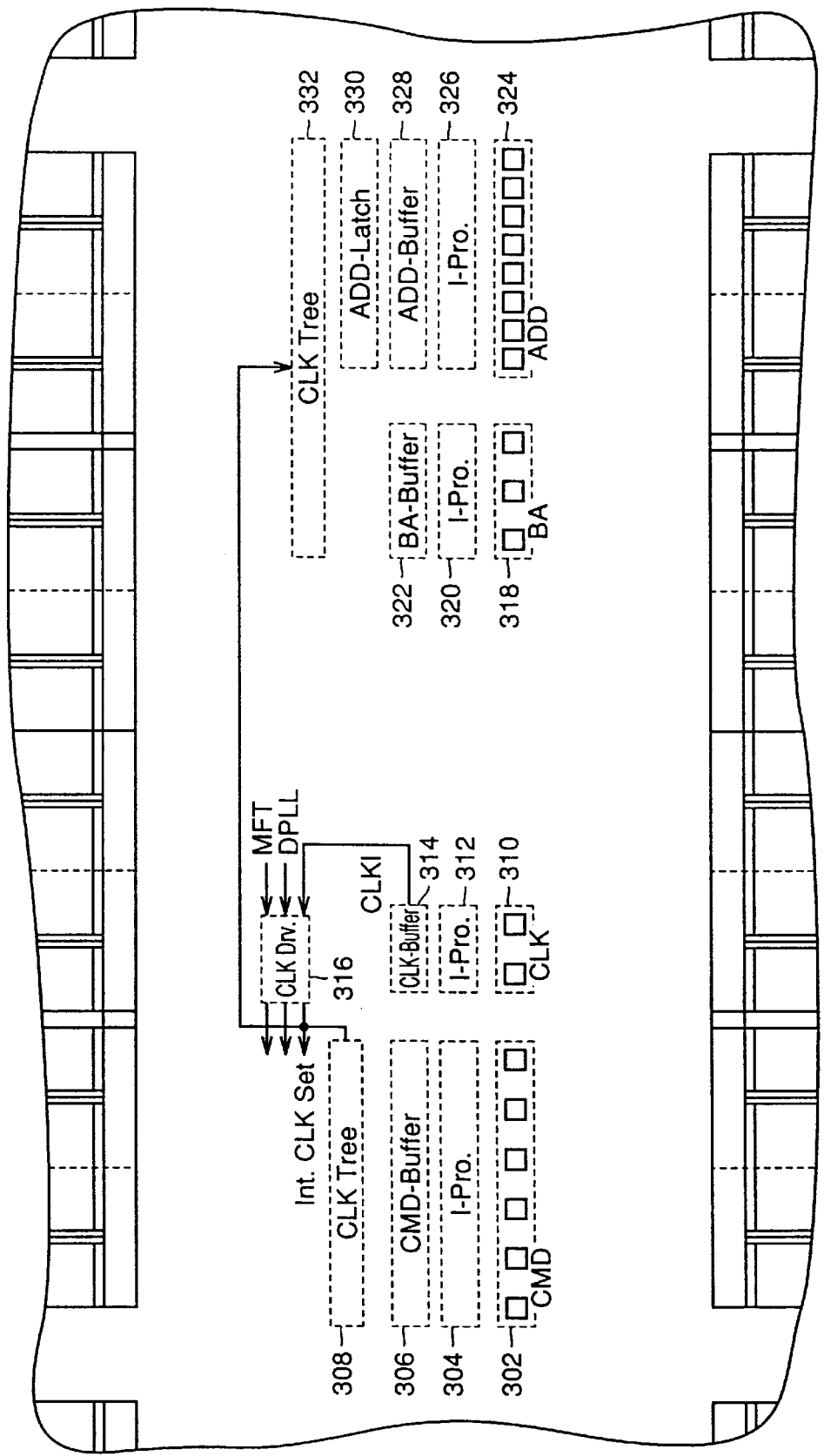
FIG. 5 schematically shows portions near input pads provided at a central portion of a semiconductor memory device in accordance with the first embodiment of the present invention.

FIG. 5 schematically shows portions near the input pads provided at the central portion of the semiconductor memory device in accordance with the first embodiment.

Referring to FIG. 5, the command signal input to a pad 302 is passed through an input protecting circuit 304, input to command buffer 306 and distributed to the overall chip. A clock signal input to a pad 310 is passed through an input protecting circuit 312, input to clock buffer 314 to be a clock signal CLKI which is input to clock driver 316, and an internal clock is formed. A combination of a plurality of clocks Int.CLK set necessary for control output from clock driver 316 is input to clock trees 308 and 332 and transmitted to the overall chip.

A bank address signal input to a pad 318 is passed through an input protecting circuit 320, input to a bank address buffer 322 and distributed to the overall chip.

An address signal input to a pad 324 is passed through an input protecting circuit 326, input to address buffer 328 and thereafter, temporarily stored as information in an address latch 330.

Figure 6:
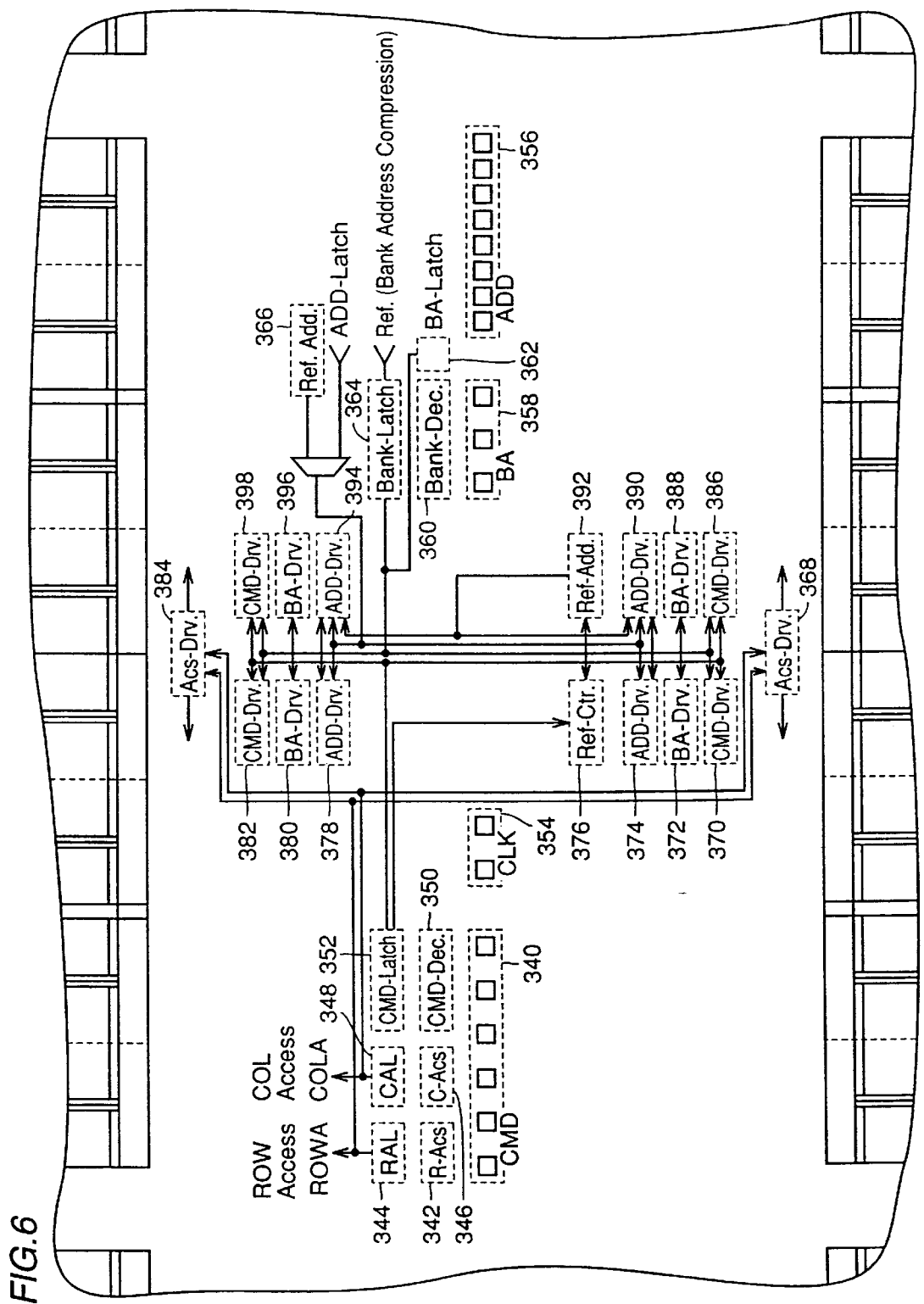
FIG. 6 schematically shows a portion near a central portion of a 1G bit semiconductor memory device.

FIG. 6 shows schematically a portion near the central portion of a 1 G bit semiconductor memory device.

Referring to FIG. 6, a command input to a pad 340 is decoded by a command decoder 350 and temporarily stored as information in a latch 352. A bank address input to a pad 358 is also decoded by a bank decoder 360, and temporarily stored as information in a latch 364. Thus the time of decoding is reduced. The latched command is distributed by driver circuits 382, 398, 370 and 386 to respective banks. The bank addresses are distributed by driver circuits 380, 396, 372 and 388 to respective banks.

Figure 7:
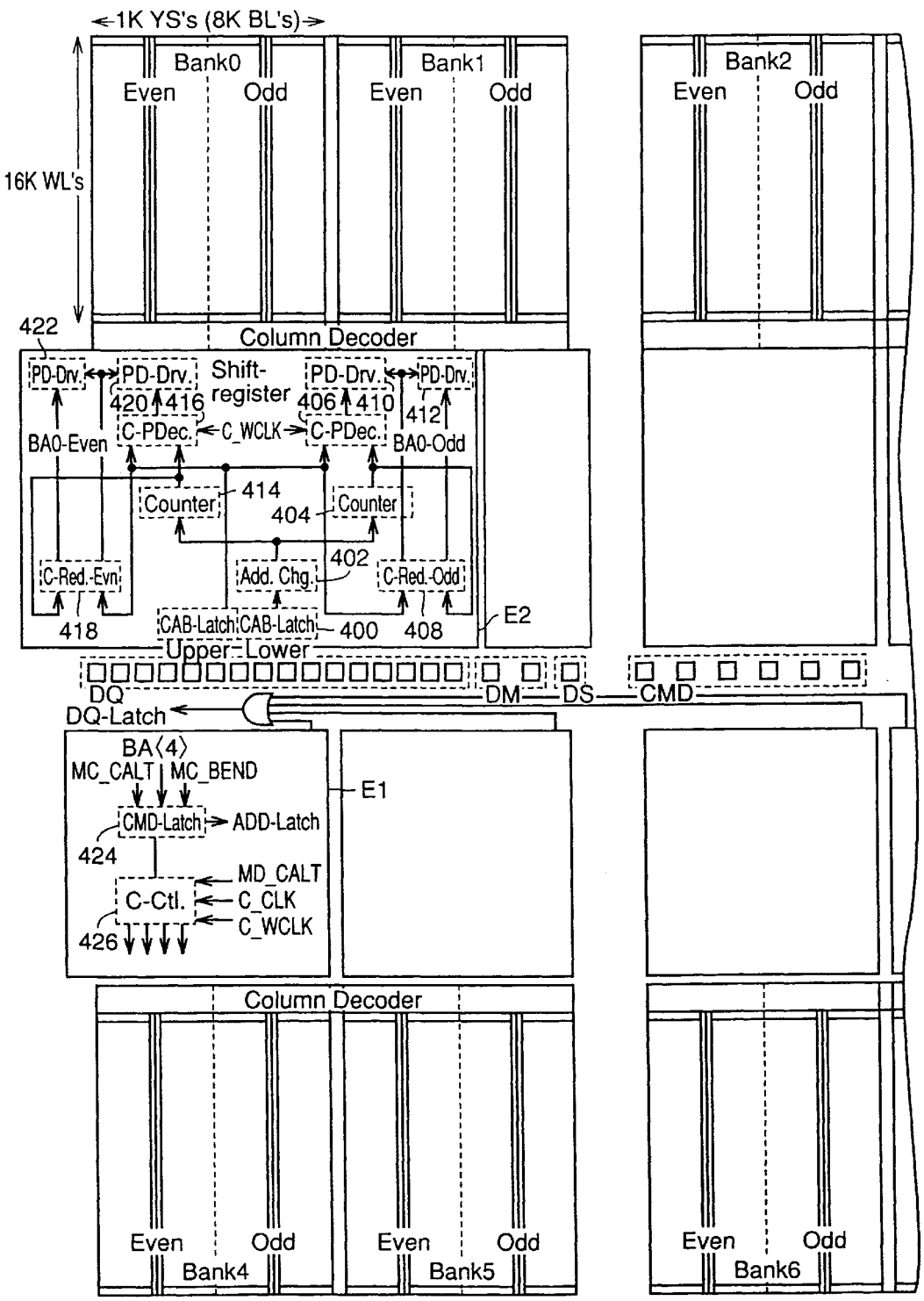
FIG. 7 is an illustration representing a column related configuration of each bank of the 1G bit semiconductor memory device.

FIG. 7 is an illustration of a column related configuration of each bank of the 1 G bit semiconductor memory device.

FIG. 7 shows a left half of a chip. The portion E1 of FIG. 7 relates to command processing, while the portion E2 of FIG. 7 relates to address control, provided for each bank.

Referring to FIG. 7, in command processing portion E1, when a bank address BA<4> is overlapped with a column related access signal (not shown), a column related access is recognized, and flag is activated in a command latch 424. Though there are bank addresses BA<0> to BA<4> one corresponding to bank 4 is shown as a representative here, and the bank address BA<4> is input.

Based on the flag activated inside command latch 424, a signal ADD-LATCH for activating an address is issued. Further, the flag activates a column control related circuit C-Ctl. and transmits a control signal to the array portion (not shown). The column related clock signal MD-CALT, read clock signal C-CLK and write clock signal C-WCLK are used as a references for the control signal output to the array portion.

The address processing portion E2 is under the control signal. Of the column address latched by latch 400, lower 3 bits are subjected to address converting process at an address conversion processing portion 402 and count processing by counters 404 and 414. The column address is transmitted to predecoders 406 and 416 as well as to redundancy determining portions 408 and 418. Redundancy determining portion 408 is provided for odd-numbered bits of the column address, while redundancy determining portion is 418 is provided for even-numbered bits of the column address. Based on the result of determination at redundancy determining portions 408 and 418, predecoders 416 and 406 are activated, and transmit a predecode signal through drivers 410 and 420 to the array side. Though not shown in FIG. 7, a decode circuit on the side of the array performs decoding process based on the predecode signal and activates the selecting signal YS. The decoding process itself is similar to the process performed in the conventional semiconductor memory device, and therefore description thereof is not given.

Address processing will be described in greater detail in the following.

Figure 8:
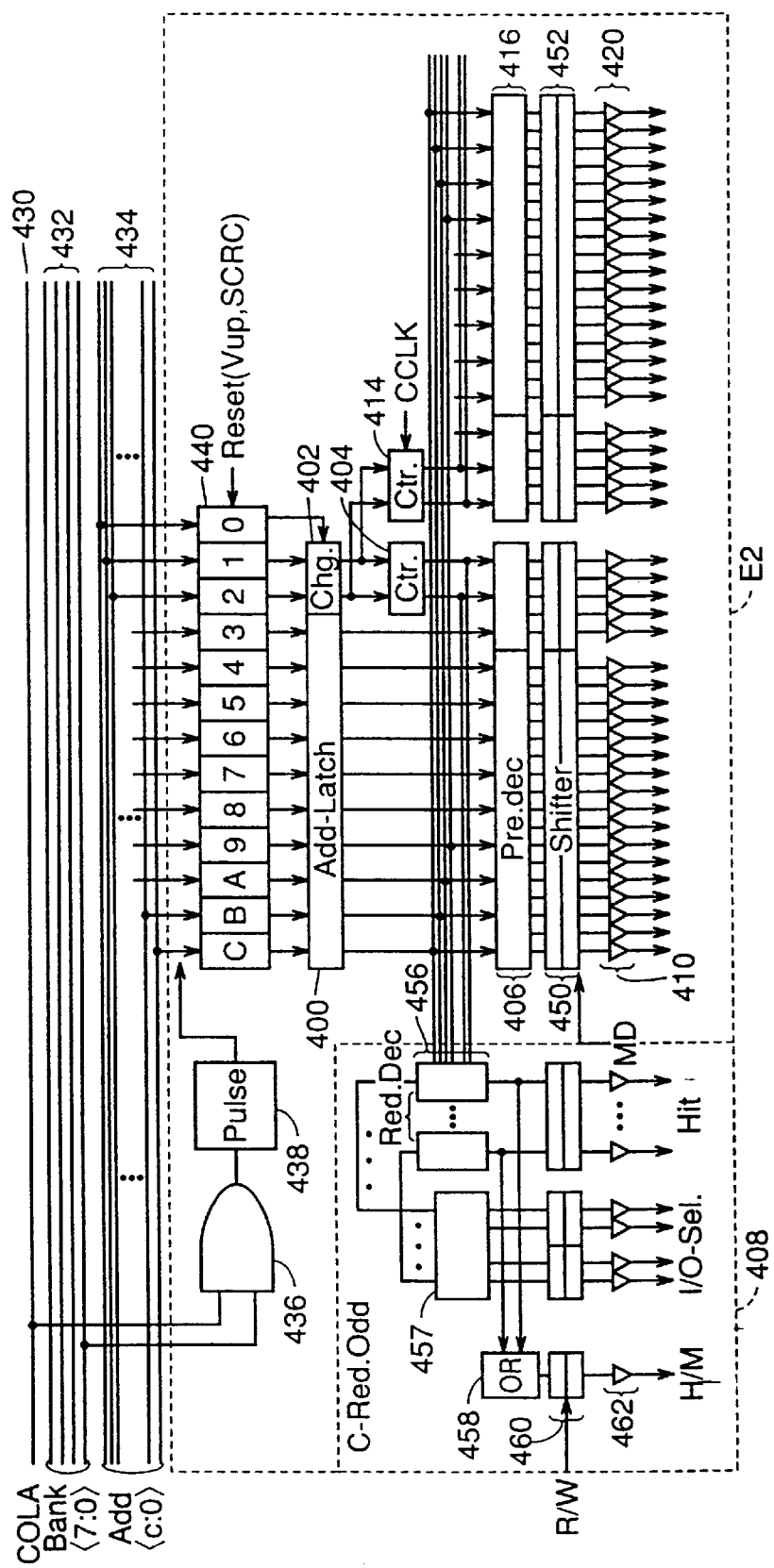
FIG. 8 represents relation between a column predecoder and a redundancy determining portion.

FIG. 8 represents relation between the column predecoder and the redundancy determining portion.

Referring to FIG. 8, address processing portion E2 includes: an AND circuit 436 receiving, as inputs, a column access signal COLA and the bank address signal; a pulse generating circuit 438 receiving an output from AND circuit 436 and generating a 1 shot pulse; a primary latch circuit 440 taking 13 bits of address Add<C:0> transmitted from the central portion through address bus 434 in response to an output from pulse generating circuit 438; latch circuit 400 latching a column address output from primary latch circuit 440; an address converting circuit 402 for address-converting lower 3 bits of primary latch circuit 440; counters 404 and 414 receiving an output from address converting circuit 402 and counting for burst operation, in synchronization with the clock signal CCLK; predecoders 406 and 416 receiving outputs from latch circuit 400 and counters 404 and 414; shifters 450 and 452 for delaying outputs of predecoders 406 and 416 in accordance with the signal R/W and outputting the resulting signals when there is no mask by a signal MD; drivers 410 and 420 for providing the output from shifters 450 and 452 to the memory array; and a redundancy determining portion 408 receiving the address signal latched by latch circuit 400 and performing redundancy determination. The signal MD is a mask signal for a invalidating an externally input data.

FIG. 8 shows only the redundancy determining portion 408 for the odd-numbered address, and the redundancy determining portion for the even-numbered address is not shown, as it has similar configuration.

Redundancy determining portion 408 includes a redundancy determining circuit 456, an input/output selecting circuit 457 and an OR circuit 458 receiving an output from redundancy determining circuit 456, a shifter 460 delaying outputs from redundancy determining circuit 456, input/output selecting circuit 457 and OR circuit 458 and providing the delayed outputs, and a driver 462 providing an output from shifter 460 to the memory array.

The operation will be briefly described in the following

The address transmitted from the central portion is taken in as a column address at primary latch circuit 440 in accordance with the output of pulse generating circuit 438 based on the column access signal COLA and the bank address. Primary latch circuit 440 transmits the column address to latch 400 and the address converting circuit and is reset by a signal SCRC. Primary latch circuit 440 is also reset at the time of power on, by a signal Vup which is generated only at the power on.

The lower 3 bits of the column address are involved in the process for burst operation, and therefore after subjected to address converting process, input to a counter. Actually, as the odd-numbered address and the even-numbered address are processed simultaneously, the least significant address is common, and therefore 2 bits among the lower 3 bits are subjected to counting. The result of address conversion processing is transmitted to predecoders of the odd-numbered address region and the even-numbered address region of the memory array in the bank. Further, the column address is also input to the redundancy determining circuit, and the result of redundancy determination with respect to the column address is recognized as a hit signal designating substitution of a column of redundant memories. The results of determination of the plurality of redundancy determining circuits provided corresponding to the odd-numbered address portion are subjected to OR processing in OR circuit 458, and recognized as a result of determination as to whether any redundancy substitution has been performed.

Figure 9:
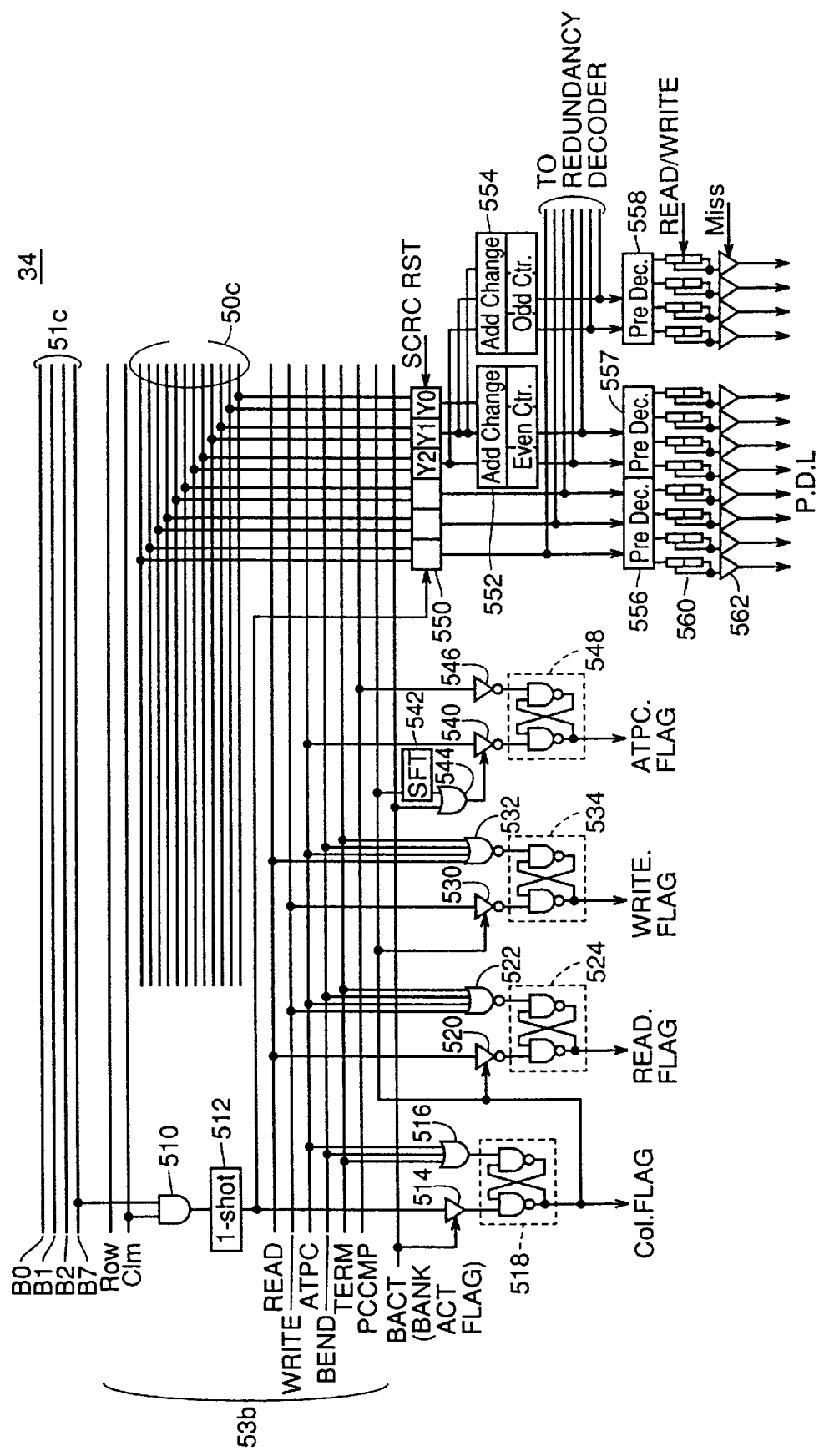
FIG. 9 is an schematic block diagram showing a configuration of column predecoder 34.

FIG. 9 is a schematic block diagram showing a configuration of column predecoder 34.

Referring to FIG. 9, a control circuit 20 transmits the following signals: a read related access identifying signal READ for designating a reading operation through a command data bus 53b; a write related access identifying signal WRITE for designating a write operation; an auto precharge identifying signal ATPC for designating an auto precharge operation; a burst end identifying signal BEND for designating end of a burst operation bank by bank; a termination identifying signal TERAM for designating, when a bank is selected during a column selecting operation, forced termination of the column selecting operation; and a precharge operation identifying signal PCCMP for designating end of a precharging operation.

A signal BACT is a flag signal held in a bank as the bank is selected.

Column predecoder circuit 34 includes; an AND circuit 510 receiving a signal Clm transmitted through a command data bus 13b and a corresponding bank address signal B7; a one shot pulse generating circuit 510 for outputting a one shot pulse signal in response to activation of an output from AND circuit 510; a drive circuit 514 activated in response to activation of the flag signal BACT for driving an output of one shot pulse generating circuit 512; an OR circuit 516 receiving signals ATPC, BEND and TERM; and a flipflop circuit 518 set by an output of drive circuit 514 and reset by an output of OR circuit 516, for outputting a column flag signal Col. FLAG indicating that column related operation is activated. Column predecoder 34 further includes: an inverter circuit 520 activated in response to activation of column flag signal Col.FLAG for driving the signal READ transmitted through command data bus 53b; OR circuit 522 receiving signals WRITE, ATPC, BEND and TERM; and a flipflop circuit 524 set by an output of inverter circuit 520 and reset by an output of an OR circuit 522 for outputting read flag signal READ.FLAG indicating that waiting operation is activated.

Column predecoder circuit 34 further includes: an inverter circuit 530 activated in response to activation of the column flag signal Col. FLAG, for driving the signal WRITE transmitted though command data bus 53b; an OR circuit 532 receiving signals READ, ATPC, BEND and TERM; and a flipflop circuit 534 set by an output of inverter circuit 530 and reset by an output of OR circuit 532 for outputting a write flag signal WRITE.FLAG indicating that write operation is activated.

Column predecoder circuit 34 further includes: a shift circuit 542 receiving and delaying by a prescribed clock time, the column flag signal Col. FLAG; an OR circuit 544 receiving the flag signal BACT and output of shift circuit 542; an inverter circuit 540 activated in response to activation of an output of OR circuit 544 for driving the signal ATPC transmitted though command data bus 53b; an inverter circuit 546 receiving the signal PCCMP transmitted through command data bus 53b; and a flipflop circuit 548 set by an output of inverter circuit 540 and reset by an output of inverter circuit 546 and outputting an auto precharge flag signal ATPC.FLAG indicating that an auto precharge operation is activated.

Column predecoder circuit 34 further includes a latch circuit 550 activated in response to an output signal of one shot pulse generating circuit 512 and taking in a column signal transmitted through an address bus 50c. Latch circuit 550 is reset in response to activation of the signal SCRC.

Column predecoder circuit 34 further includes: an even-numbered bit changing circuit 552 and an odd-numbered bit changing circuit 554 for changing a lower bit of an address signal corresponding to a column selecting line (not shown) to be activated, in accordance with a lower bit of the column address held in latch circuit 550; a predecoder 556 for predecoding upper bit data from latch circuit 550; a predecoder 557 for predecoding lower bit data from even-numbered bit changing circuit 552; a predecoder 558 for predecoding lower bit data from odd-numbered bit changing circuit 554; a shift circuit 560 activated by the signal READ or WRITE for delaying by a prescribed number of clocks (for example, 2 clocks) and outputting predecode signals from prodecoders 556, 557 and 558; and a drive circuit 562 activated in response to a signal Miss indicating that an address from a redundancy decoder (not shown) does not match substitution address, receiving an output from shift circuit 560 for driving the level of a column predecode line in accordance with the output signal from shift circuit 560.

A shift circuit 200 which will be described later with reference to FIG. 28 may be used as shift circuit 560.

Figure 10:
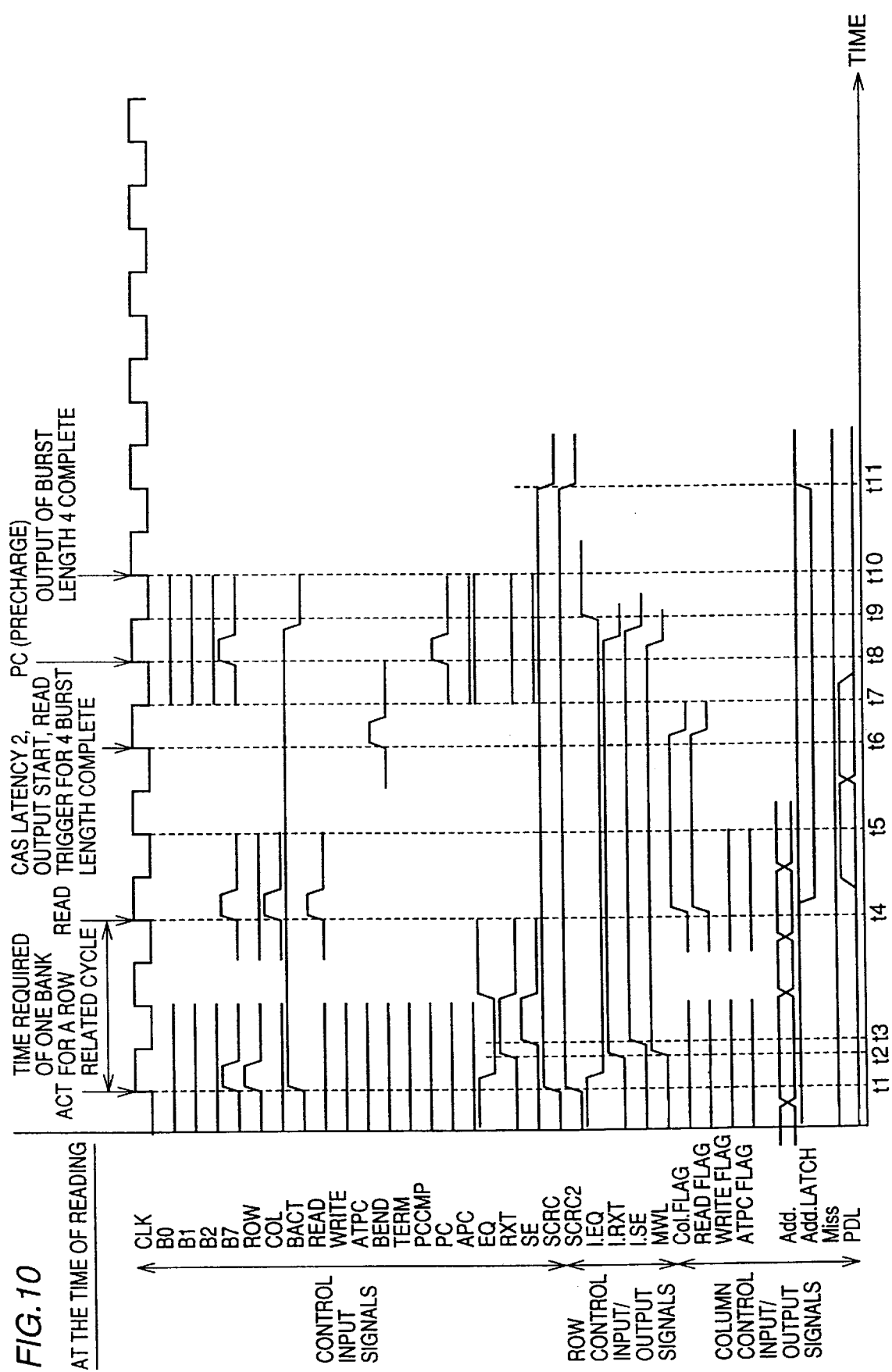
FIG. 10 is a timing chart related to a reading operation of column predecoder circuit 34 shown in FIG. 9.

FIG. 10 is a timing chart illustrating a reading operation of column predecoder circuit 34 shown in FIG. 9.

Referring to FIG. 10, at time t1, a selected bank is activated and, in response to inactivation of equalize signal EQ, a local equalize signal l.EQ is inactivated, and equalized state of bit line pairs or the like in the selected bank is canceled. Signals SCRC2 are set to the active state.

At time t2, word line activating signal RXT is activated, a word line is selected in accordance with a row address signal, and at time t3, in response to activation of sense amplifier activating signal SE, a local sense amplifier activating signal l.SE is also activated, and data from selected plurality of memory cells are amplified as corresponding bit line potentials.

At time t4, the signal READ is activated, designating a reading operation and flag signals Col.FLAG and READ.FLAG are activated. The column address signal is taken in a selected bank, and the data from the selected memory cell is read from the bank and held at time points t5 and t6. At time t6, in response to completion of reading of data having the burst length of 4, the signal BEND is activated.

In response to the rise and fall of external dock signal Ext.CLK at time points t6 and t7, the data read from the bank at time t5 and being held is subjected to parallel serial conversion and externally output.

In response to the rise and fall of external clock signal Ext.CLK at time points t8 and t9, the data read from the bank at time t6 and being held is subjected to parallel serial conversion and externally output.

At time point t8, in response to activation of the signal PC, the selected bank is precharged.

At time t10, data output when the burst length is 4 is completed.

At time t11, the signal SCRC is inactivated, and portions where the operation is complete are powered down or turned off by hierarchical power supply architecture, and enters an operation mode where leakage current is small.

Figure 11:
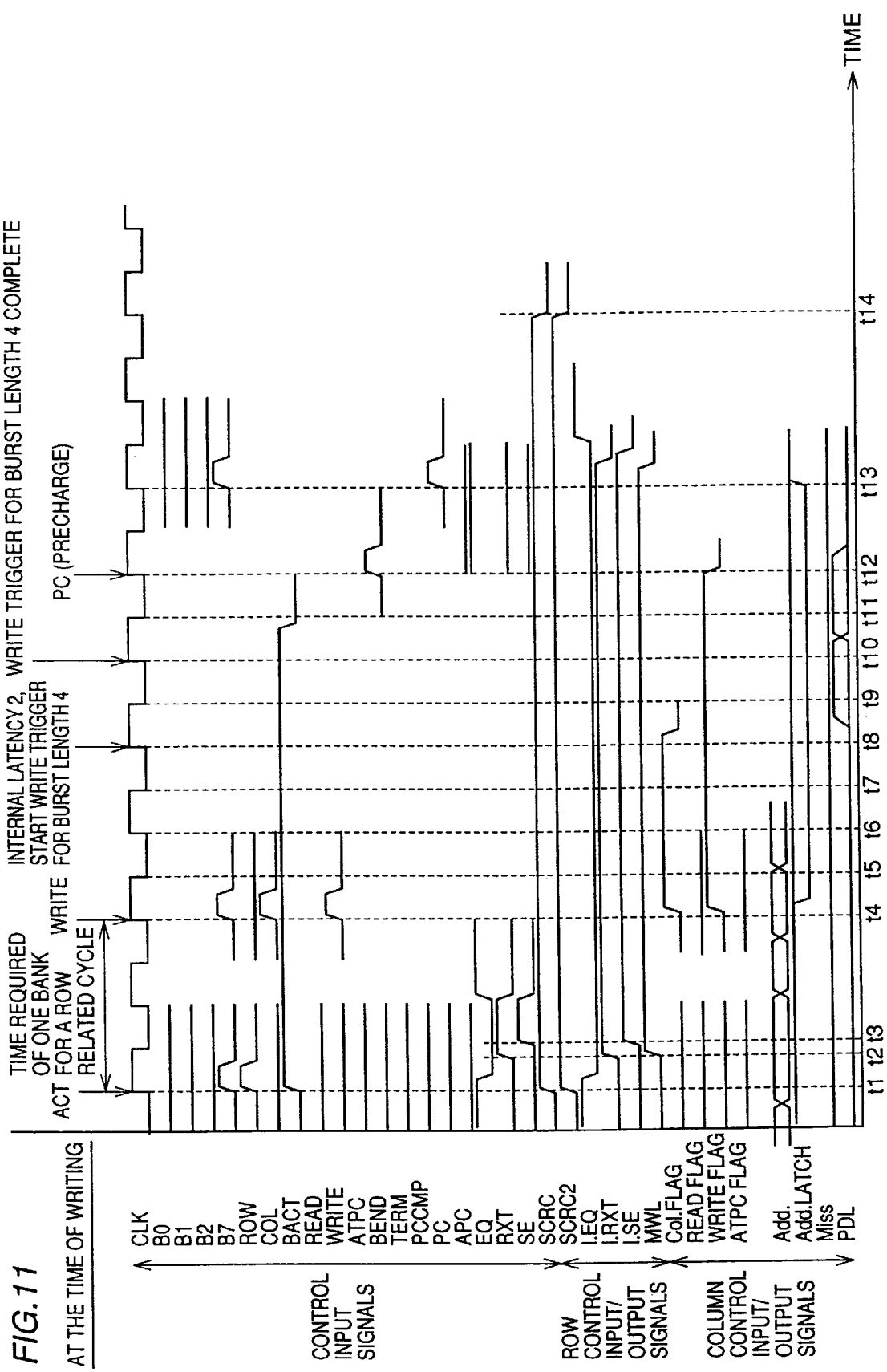
FIG. 11 is a timing chart related to a writing operation of column predecoder circuit 34 shown in FIG. 9.

FIG. 11 is a timing chart related to a writing operation of column predecoder 34 shown in FIG. 9.

Referring to FIG. 11, at time t1, the selected bank is activated, and in response to inactivation of equalize signal EQ, the local equalize signal l.EQ is inactivated and equalized state of the bit line pairs and the like of the selected bank is canceled.

At time t2, word line activating signal RXT is activated, word line selecting operation is performed in accordance with a row address signal and, at time t3, in response to activation of sense amplifier activating signal SE, local sense amplifier activating signal l.SE is also activated and data from the plurality of selected memory cells are amplified as corresponding bit line potentials.

At time t4, when the signal WRITE is activated and a write operation is designated, flag signals Col.FLAG and WRITE.FLAG are activated. The column address signal is taken in a selected bank, and write data is taken in from the outside and held at times t5 and t6.

Thereafter, at time points t7 and t8, write data is taken from the outside and held.

At time t8, a data writing operation to the memory cell starts after the lapse of a time period corresponding to an internal latency 2 (corresponding to 2 periods of the docks) defined by shift circuit 560 from taking of the column address.

In response to the rise and fall of external clock signal Ext.CLK at time points t9 and t10, the data written from the outside at time points t5 and t6 and being held are written to the selected memory cell.

In response to the rise and fall of external clock signal Ext.CKL at time points t11 and t12, the data taken from the outside at time points t7 and t8 and being held are written to the selected memory cell.

At time t12, writing of data when the burst length is 4 is completed.

Meanwhile, at time t13, the selected bank is precharged in response to activation of the signal PC.

At time t14, the signal SCRC is inactivated and portions where operation has been completed are powered down or turned off by the hierarchical power supply architecture and enter an operation mode where leakage current is small.

Figure 12:
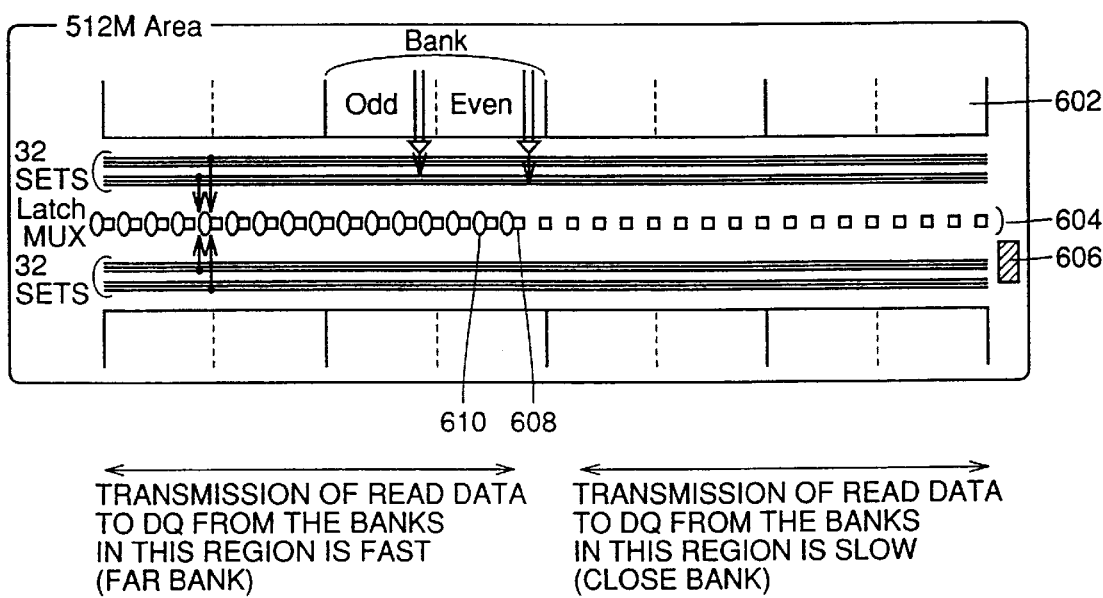
FIG. 12 represents data flow at a time of reading of the 1G bit semiconductor memory device.

FIG. 12 shows data flow at the time of reading in a 1 G bit semiconductor memory device.

FIG. 12 shows a central portion of a left half of the chip where pads are arranged, with a central circuit arranged at a region 606. Pads are arranged in a region between memory arrays 602. Among the pads, near a DQ pad 608 for data input/output positioned at an outer side of the chip, a DQ processing circuit 610 is provided.

Figure 13:
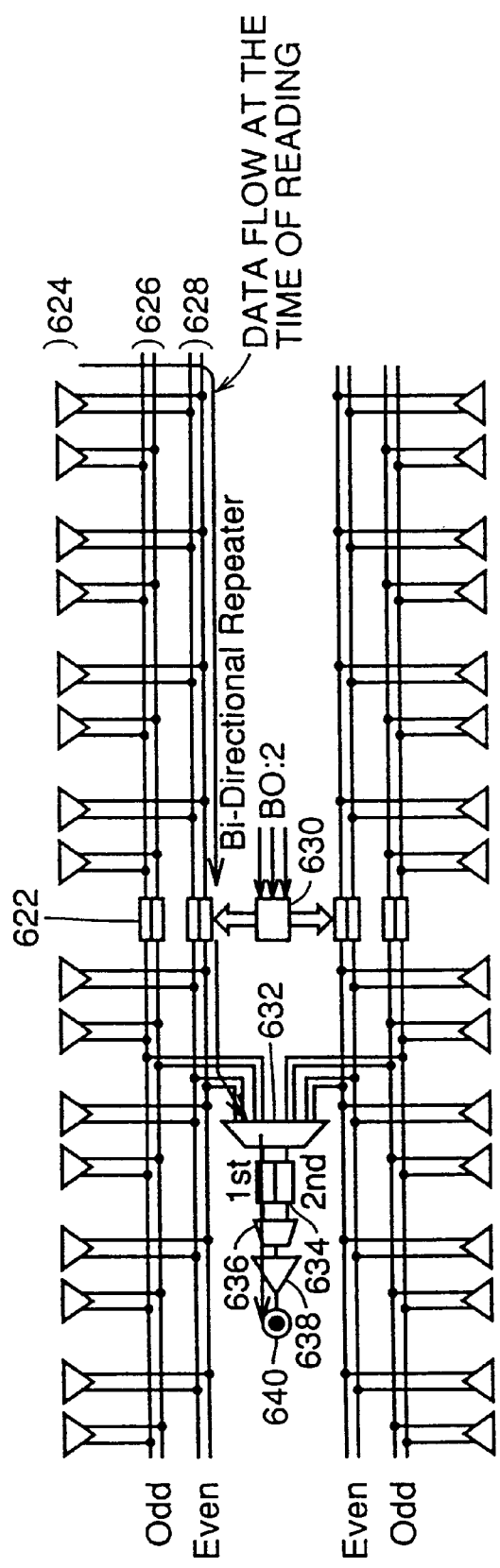
FIG. 13 represents a repeater used in data related portion at the time of reading of 1G bit semiconductor memory device.

FIG. 13 shows a repeater used in a data system at the time of reading of the 1 G bit semiconductor memory device.

Referring to FIG. 13, the data from an odd-numbered address of data amplifier 624 from the array is transmitted through data bus 626 to a repeater 622, while the data from an even-numbered address is transmitted through data bus 628 to the repeater 622. Repeater 622 is controlled by a control circuit 630. The data transmitted by the repeater is applied to a multiplexer 632, and the data selected by multiplexer 632 is temporarily held by a latch 634 (two are shown here). The two latched data are selected by multiplexer 636 and output through an output buffer 638 and a data terminal 640.

Figure 14:
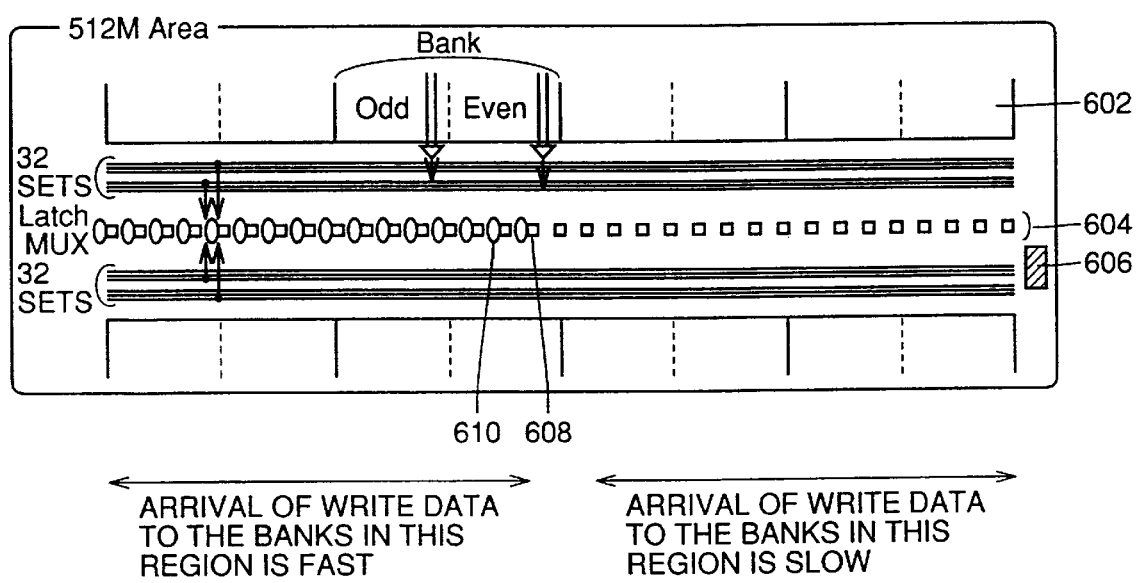
FIG. 14 represents data flow at the time of writing of the 1G bit semiconductor memory device.

FIG. 14 shows a data flow at the time of writing of the 1 G bit semiconductor memory device.

Similar to FIG. 12, FIG. 14 shows a central portion of a left half of the chip where pads are arranged, with a central circuit arranged at region 606. Pads are arranged in a region between memory arrays 602, and among the pads near the DQ pad 608 for data input/output positioned on an outer side of the chip, a DQ processing circuit 610 is provided.

Figure 15:
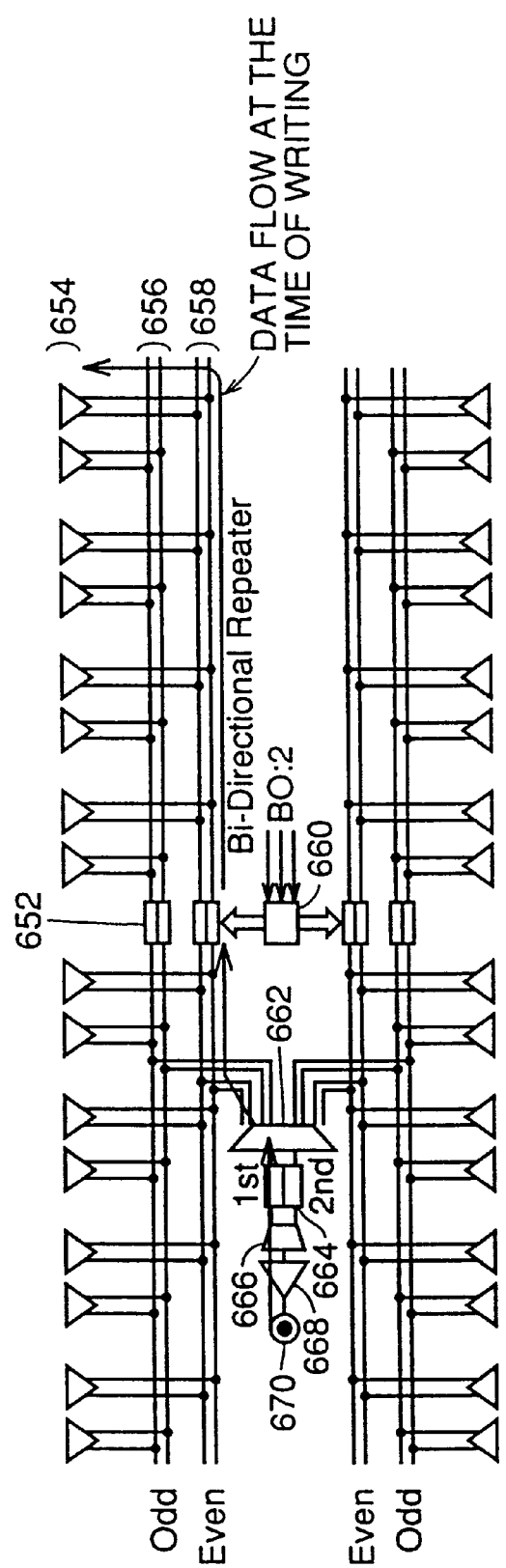
FIG. 15 represents a repeater used in the data related portion at the time of writing of the 1G bit semiconductor memory device.

FIG. 15. shows a repeater used in a data system at the time of writing of the 1 G bit semiconductor memory device.

Referring to FIG. 15, at the time of waiting, the data input through a data terminal 670 is written to the memory array in the reverse course to reading.

Here, the repeater is used as means for controlling phase difference (though the repeater is shown only on the drawings of data buses, the repeater is also arranged for a bus transmitting a command or the like. It should be noted, however, that a direction of command or the like is one way, and therefore the repeater is one-directional, while the repeater for the data is bi-directional.)

Figure 16:
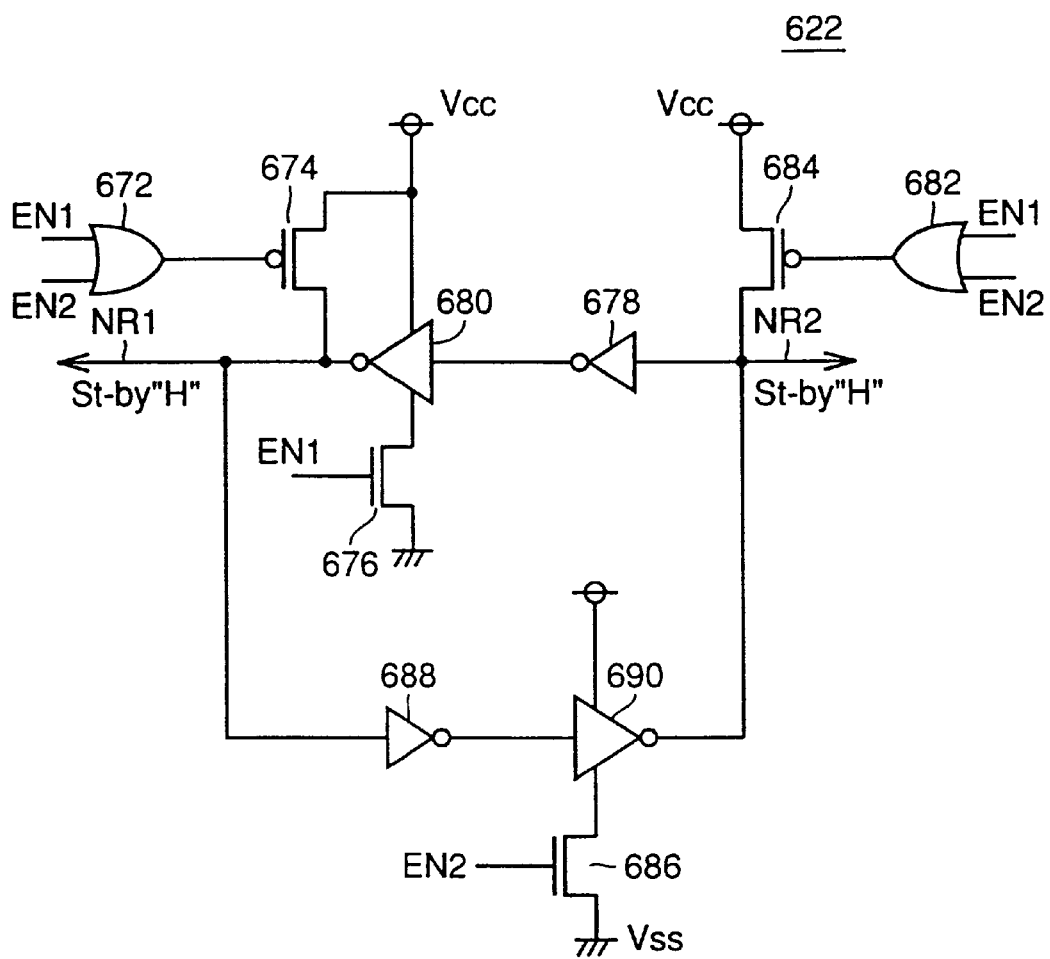
FIG. 16 shows a first example of the configuration of repeater 622 shown in FIG. 13.

FIG. 16 is a circuit diagram showing a first exemplary configuration of repeater 622 shown in FIG. 13.

A similar circuit is also used for repeater 652 shown in FIG. 15.

Referring to FIG. 16, repeater 622 includes: an OR circuit 672 receiving control signals EN1, EN2; a P channel MOS transistor 674 receiving an output of OR circuit 672 at its gate and applying a power supply potential to a node NR1 when activated; an inverter 678 having an input connected to a node NR2; an inverter 680 receiving an output from 678 and providing an inverted output to node NR1; and an N channel MOS transistor 676 receiving the control signal EN1 at its gate and having its source connected to the ground potential. Inverter 680 may receive operational current when N channel MOS transistor 676 is activated by control signal EN1.

Repeater 622 further includes an OR circuit 682 receiving control signals EN1 and EN2; a P channel MOS transistor 684 receiving an output of OR circuit 682 at its gate and applying a power supply potential Vcc to node NR2 when activated; an inverter 688 having an input connected to node NR1; an inverter 690 receiving an output of inverter 688 and providing an inverted output to node NR2; and an N channel MOS transistor 686 receiving the control signal EN2 at its gate and having its source coupled to ground potential Vss and its drain connected to an internal node of inverter 690. Inverter 690 may receive an operation current when N channel MOS transistor 686 is activated by control signal EN2.

The operation will be briefly described. When control signals EN1 and En2 are both at the L level, P channel MOS transistors 674 and 684 are rendered conductive, respectively, nodes NR1 and NR2 attain to the H level and the repeater circuit is set in a standby state.

When the control signal EN1 is at the H level and the control signal EN2 is at the L level, P channel MOS transistors 674 and 684 are rendered non-conductive, and inverter 680 is activated by N channel MOS transistor 676, and therefore the repeater transmits a signal from node NR2 to node NR1.

When control signal EN1 is at the L level and the control signal EN2 is at the H level, inverter 680 is inactive, and by the function of N channel MOS transistor 686, inverter 690 is activated. Therefore, repeater 622 transmits a signal from node NR1 to node NR2.

Figure 17:
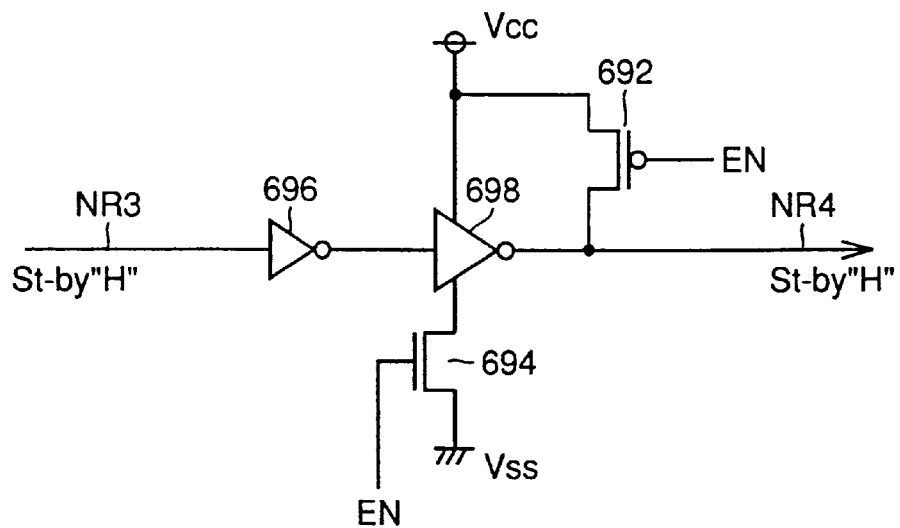
FIG. 17 is a circuit diagram showing a second example of the repeater.

FIG. 17 is a circuit diagram showing a second example of the repeater.

In FIG. 16, a bidirectional repeater is depicted, whereas a one directional repeater is depicted in FIG. 17.

Referring to FIG. 17, the repeater includes: a P channel MOS transistor 692 receiving a control signal EN at its gate and applying the power supply potential Vcc to a node NR4 when activated; an inverter 696 having an input connected to a node NR3, an inverter 698 receiving an output of inverter 696 and providing an inverted output to node NR4; and an N channel MOS transistor 694 receiving at its gate the control signal EN and having its source coupled to ground potential Vss and its drain connected to an internal node of inverter 698.

The operation will be briefly stated. When the control signal EN is at the L level, P channel MOS transistor 692 is rendered conductive, node NR4 is fixed at the H level, and the repeater is set to a standby state.

The N channel MOS transistor 694 is rendered no-conductive, and no operation current flows to inverter 698, and therefore inverter 698 is inactivated. When control signal EN is at the H level, P channel MOS transistor 692 is rendered non-conductive and N channel MOS transistor 694 is rendered conductive, and in response, inverter 698 is activated. Therefore, the signal applied to the node NR3 is transmitted by inverters 696 and 698 to node NR4.

Figure 18:
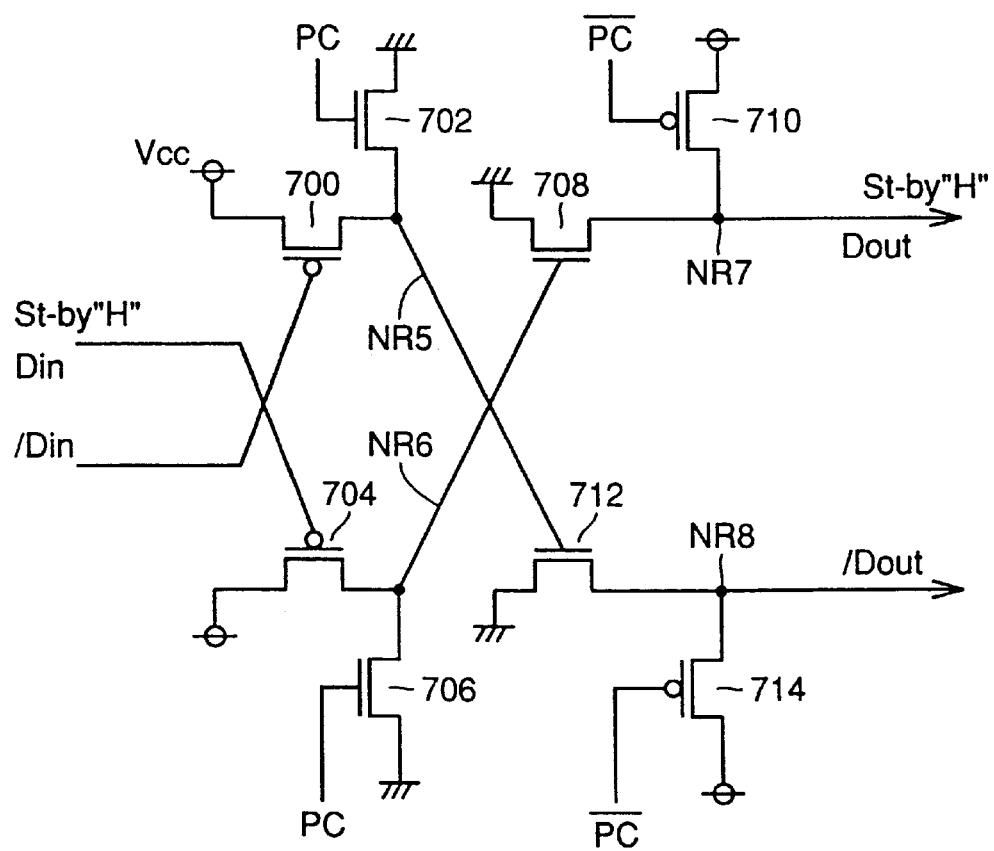
FIG. 18 shows a third example of the repeater.

FIG. 18 shows a third example of the repeater.

Referring to FIG. 18, the repeater includes: a P channel MOS transistor 700 receiving at its gate a signal /Din and applying the power supply potential Vcc to a node NR5 when activated; an N channel MOS transistor 702 receiving at its gate the precharge signal PC and applying the ground potential Vss to node NR5 when activated; an N channel MOS transistor 712 having its gate connected to node NR5 and applying the ground potential Vss to a node NR8 when activated; and a P channel MOS transistor 714 receiving at its gate a complementary precharge signal /PC and applying the power supply potential Vcc to node NR8 when activated. An output signal /Dout is output from node NR8.

The repeater further includes: a P channel MOS transistor 704 receiving at its gate the signal Din and applying the power supply potential Vcc to node NR6 when activated; an N channel MOS transistor 706 receiving at its gate the precharge signal PC and applying the ground potential Vss at node NR6 when activated; an N channel MOS transistor 708 having its gate connected to node NR6 and applying the ground potential Vss to node NR7 when activated; and a P channel MOS transistor 710 receiving at its gate the complementary precharge signal /PC and applying the power supply potential Vcc to node NR7 when activated. The output signal /Dout is output from node NR7.

The operation will be briefly stated. In the standby state where precharge signal PC is at the H level and the complimentary precharge signal /PC is at the L level, N channel MOS transistors 702 and 706 are rendered conductive and, in response, N channel MOS transistors 708 and 712 are rendered non-conductive. P channel MOS transistors 710 and 714 are rendered conductive, and therefore nodes NR7 and NR8 both attain to the H level.

Thereafter, when the standby state is canceled, precharge signal PC attains to the L level and complimentary precharge signal /PC attains to the H level, the signal Din attains to the H level and the signal /Din attains to the L level, then P channel MOS transistor 700 and N channel MOS transistor 712 are rendered conductive. Accordingly, the output level of node NR8 attains to the L level, and the signal /Dout attains to the L level.

When the signal Din attains to the L level and the signal /Din attains to the H level, P channel MOS transistor 704 and N channel MOS transistor 708 are rendered conductive, and the signal Dout attains to the L level. In this manner, the repeater circuit transmits a signal.

The above described configuration allows increase in speed of operation both in reading and writing.

Second Embodiment

Figure 19:
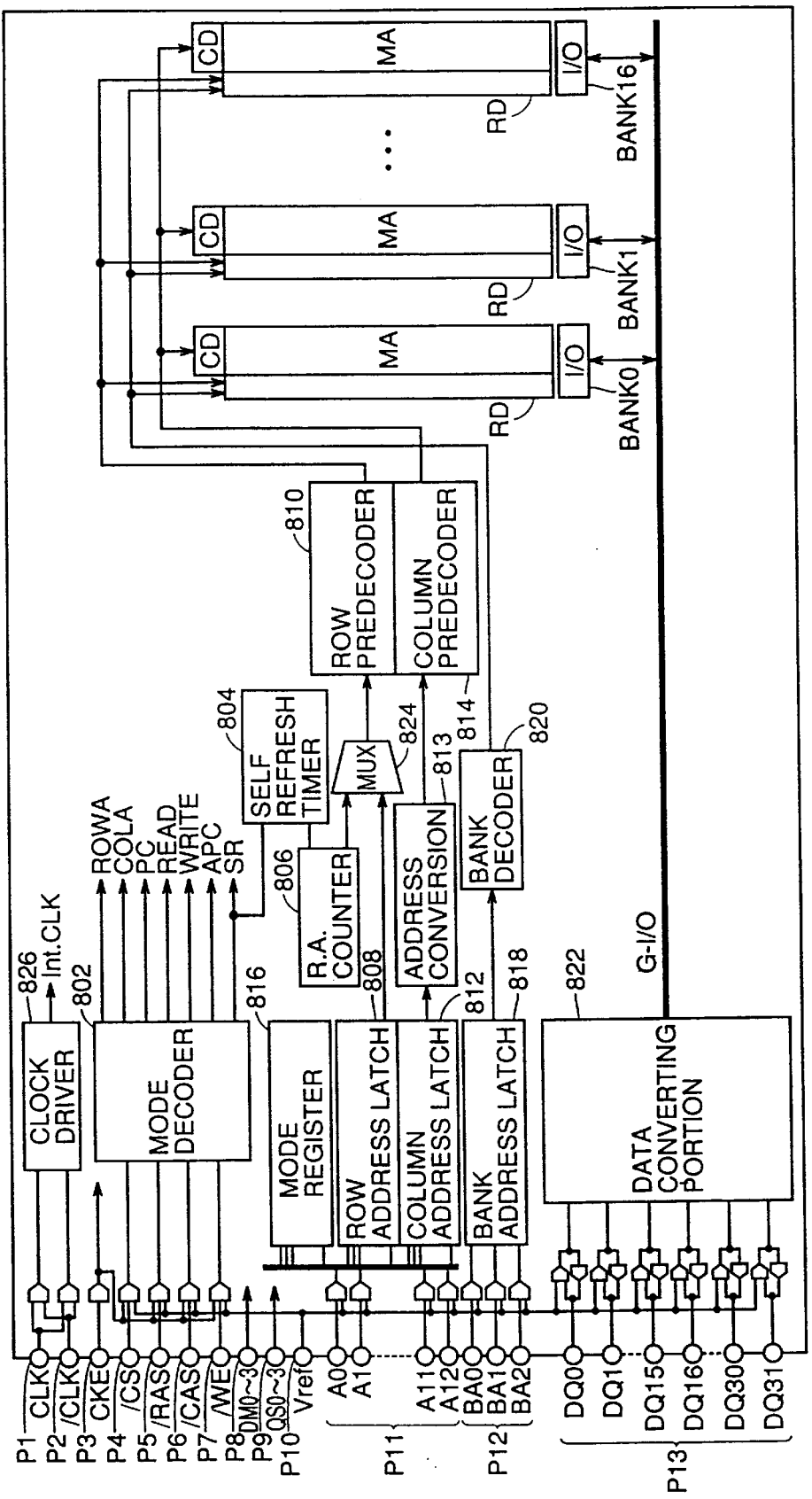
FIG. 19 is a schematic block diagram showing overall configuration of the semiconductor memory device in accordance with the present invention.

FIG. 19. is a schematic block diagram showing an overall configuration of the semiconductor memory device in accordance with the present invention.

Referring to FIG. 19, the semiconductor memory device is a double data rate synchronous dynamic random access memory (hereinafter referred to as DDR SDRAM) having the capacity of 1 G bits. The semiconductor memory device includes: terminals P1 and P2 receiving complimentary clock signals CLK and /CLK regulating the overall operation; a terminal P3 receiving an enable signal CKE allowing input to the chip; a terminal P4 receiving a signal /CS identifying a command input; a terminal P5 receiving the signal /RAS indicating that a row related command is input; a terminal P6 receiving the signal /CAS indicating that a column related command is input; a terminal P7 receiving the signal /WE which is a signal for identifying read and write; a terminal P8 inputting/outputting data mask signals DM0 to DM3 identifying invalidity of data at the time of reading or writing; terminals P9 inputting/outputting data strobe signals QS0 to QS3 identifying data timing at the time of reading or writing; a terminal P10 receiving as an input a reference potential Vref determining the H (high) level/L (low) level of the input signal; terminals P11 receiving as inputs address signals A0 to A12; terminals P12 receiving 3 bits of bank addresses BA0 to BA2 of the internally provided 8 memory banks; and terminals P13 inputting/outputting 32 bits of data input/output signals DQ0 to DQ31.

The clock signal forms a rising edge and a falling edge at a gate portion where complimentary docks are compared. Then, the clock signal is input to a clock driver 826. The clock driver 826 supplies internal clock signal int.CLK to internal circuit of the semiconductor memory device. While the enable signal CKE is not active, the semiconductor memory device is inoperative. In this inactive state, the semiconductor memory device is in the standby state or a self refresh state.

While the signal /CS is active, a command is recognized at a rising edge of the clock. Data mask signals DM0 to DM2 are transmitted from the side of the semiconductor memory device to a controller IC when invalidity of data at the time of reading is to be indicated, while the signals are transmitted from the side of controller IC to the semiconductor memory device when data invalidity at the time of writing is to be indicated. One data mask signal DM is allocated to every 8 data input/output signals DQ. Similarly, data strobe signal QS transmits data timing from the side of the semiconductor memory device to the controller IC at the time of reading, and transmits the data timing from the side of the controller IC to the semiconductor memory device at the time of writing. One data strobe signal QS is allocated to every 8 data input/output signals DQ8. All 13 bits of address signals A0 to A12 are used as a row address input, and 10 bits are used as a column address input. Further, part of the address signals bits are used for writing to the mode register.

The semiconductor memory device further includes a mode decoder 802 recognizing an input command. There are a plurality of different types of commands recognized by the mode decoder and transmitted to the internal circuitry. For example, signals such as ROWA indicating a row related access, COLA indicating a column related access, a word line activating signal ACT, the signal PC indicating precharging (end of row related operation), the signal READ indicating column related reading, the signal WRITE indicating column related writing, the signal APC indicating auto precharge and the signal SR indicating self refresh are transmitted as a results of command decoding from the mode decoder to respective internal circuits. The operation of the semiconductor memory device will be briefly described in the following.

When the power supply voltage is applied and the operation of the semiconductor memory device starts, a self refresh timer 804 starts operation when the self refresh mode is set. As a result, at a prescribed time point, the word line is activated and refreshing operation starts. At this time, the address is changed every time by a refresh address counter 806. For a row related access, the address input is taken in a row related address latch 808. The taken address is normally transmitted to a row related predecoder 810.

At the time of refresh, an address from refresh address counter 806 is transmitted through a multiplexer to row related predecoder 810.

For a column related access, the address is taken in a column related address latch 812.

For a burst, addresses are handled in accordance with the interleave method or the sequential method, and dependent on the method employed, the burst address counter counts in different manner.

In the DDR SDRAM, data must be output twice in 1 clock cycle of the external clock. Therefore, as an internal operation, two data are output in one dock cycle. Therefore, it is necessary to generate two of the burst addresses. At this time, there is a problem that simple implementation from an input address is not sufficient, as the start of the burst addresses may be an even-numbered address or the odd-numbered address.

For example, even when one same "1" is input as an original address, the pair or addresses to be generated would be "2" in accordance with the sequential method, while it would be "0" in accordance with the interleave method. Therefore, the position designated by the selecting signal YS for column selection at an even-numbered address differs from a position designated by the selecting signal YS for column selection at an odd-numbered address to be paired. For this reason, the even-numbered region and the odd-numbered region are divided, a decoder portion generating the selecting signal YS corresponding to the even-numbered address and a decoder portion generating the selecting signal YS corresponding the odd-numbered address are divided and operated independent from each other. Two bits of the address in the first access cycle are transmitted intact to the column related predecoder. In the next burst cycle, counting in the address counter for the even-numbered address and counting in the address counter for the odd-numbered address are performed, and thereafter, the resulting address bits are transmitted to the column related predecoder 814.

The address is also used for writing to mode register 816. The burst length, the CAS latency and the like are set in mode register 816.

Bank addresses BA0 to BA2 indicate a bank to be accessed at the time of row related access and column access.

The bank address is temporarily held by a bank address latch 818, decoded by a bank decoder 820, identified, and transmitted to respective banks BANK0 to BANK16.

Data input to the semiconductor memory device is performed in synchronization with the clock input as an externally input data strobe QS. The data output is provided in accordance with a synchronous clock generated in the delay locked loop (DLL), phase locked loop (PLL) or synchronous mirror delay (SMD).

Figure 20:
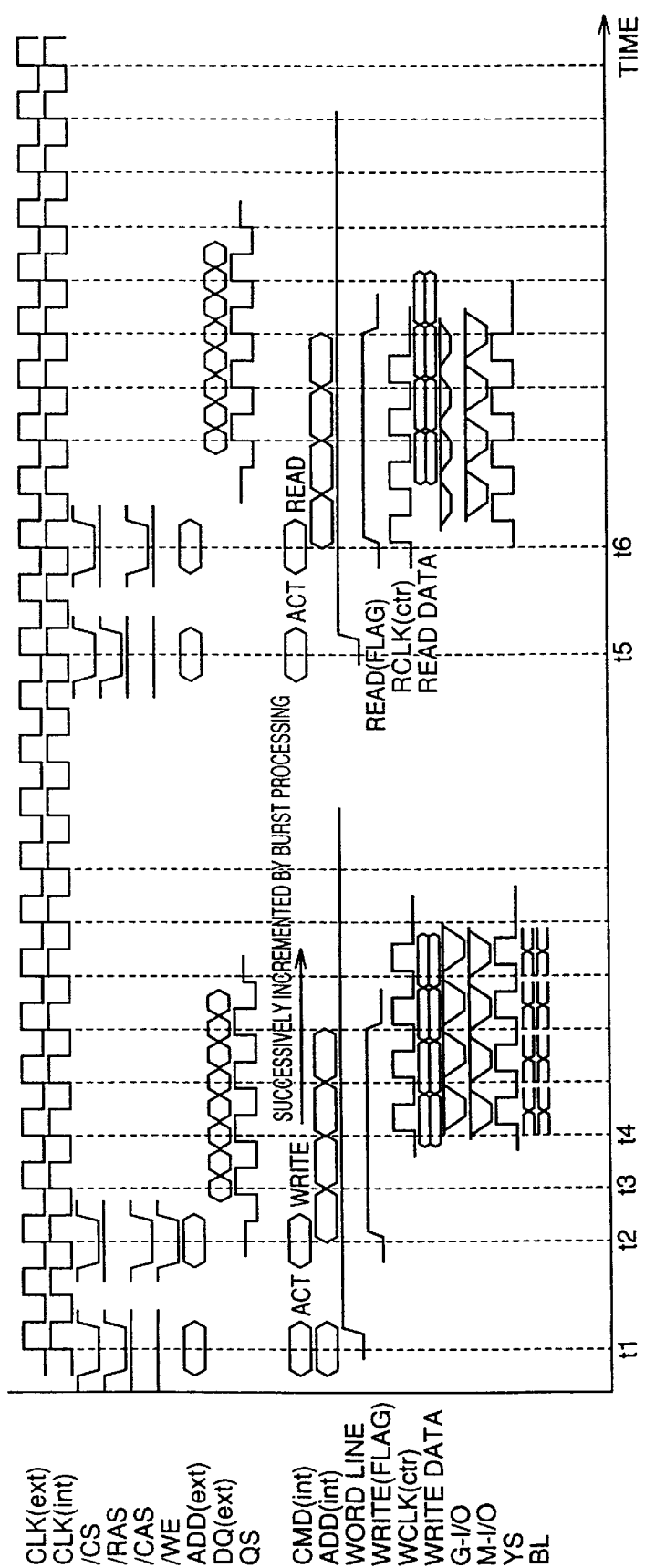
FIG. 20 is a diagram of waveforms related to an operation of a DDR-SDRAM.

FIG. 20 is a diagram of a waveforms related to the operation of the DDR-SDRAM.

Referring to FIG. 20, at time t1, the word line is activated by the ACT command, and there is a column related input (here, an example is shown in which the burst is 8 and CAS latency at the time of reading is 2. That the CAS latency is 2 means that data is output in the second clock after command input).

At time t2, in writing operation, a command and a first address are input. At time t3, the data is input delayed a little, at a frequency twice that of the external clock. Though delayed from the external clock, the data strobe signal QS is input externally, and hence there is no problem when the data is taken in using as a timing dock, the clock of signal QS. Again, at time t2, when input of a write command is recognized, a write flag WRITE (FLAG) is activated and a write clock WCLK is generated. Here, as the data input is delayed, the write clock should also be delayed. Here, taking some margin into consideration, the write clock is activated at a phase delayed by 2 clocks based on the external clock.

In this manner, it becomes possible to control clocks in writing and reading operations independently, and to cause activation of the selecting signal YS at the time of writing advanced in phase as compared at the time of reading, to be ready for a reading operation following a writing operation.

More specifically, it becomes possible to complete writing operation earlier, and therefore the time for equalizing global I/O lines G-I/O and main I/O lines M-I/O can be made longer. The write data taken inside in accordance with the clock is transmitted 2 bits at a time (corresponding to an even-numbered address and odd-numbered address) through global I/O ((Q-I/O) and the main I/O (M-I/O) on the array, and written to the memory cell through the bit line (BL) upon activation of the column selecting gate (YS). In the second and the following accesses of a burst cycle, the addresses are changed in accordance with the manner of burst proceeding, and write data input in accordance with the clock are successively written.

In a reading operation, at time t6, a command and a first address are input, and when a read command input is recognized, read flag is activated and a read clock RCLK is generated. Based on the read clock RCLK, the selecting signal YS is activated, and data is read 2 bits at a time (for the even-numbered address and the odd-numbered address) from the sense amplifier.

The read data is latched as read data through M-I/O, G-I/O, and 2 bits of parallel data are converted to serial data, and output timed with a clock a little earlier than the clock of CAS latency, by a synchronous clock generating circuit. In the second and the following accesses in the burst cycle, the addresses are changed internally in accordance with the manner of data output in the burst cycle, and read data output in accordance with the clocks are successively read.

Figure 21:
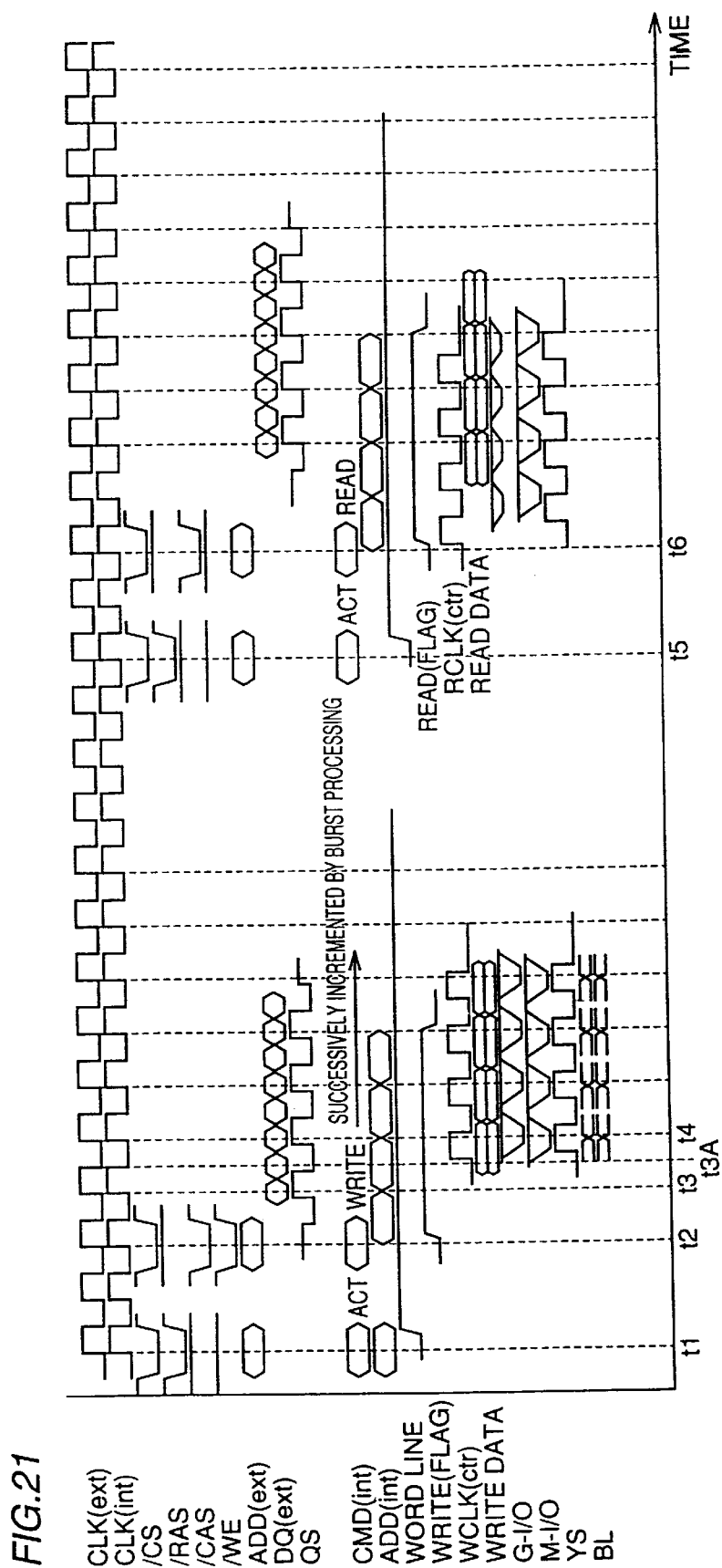
FIG. 21 is a diagram of waveforms related to control at the time of writing in another situation.

FIG. 21 is a diagram of waveforms related to another example of control in writing.

Referring to FIG. 21, the operation is different from that of FIG. 20 in that the internal write operation starts at a time point t3A delayed by 1.5 clocks after the reception of command at time t2. Other signal flow is the same as that of FIG. 20. Therefore, description thereof is not repeated.

In the reading operation after the time point t5, activation of the selecting signal YS for column selection refers to a rising edge of the clock, whereas in the writing operation after the time point t2, the falling edge of the clock is referenced. Here, control is possible simply by switching the reference clock input to a write control circuit 250, which will be described with reference to FIG. 29 later, to an inverted clock.

Figure 22:
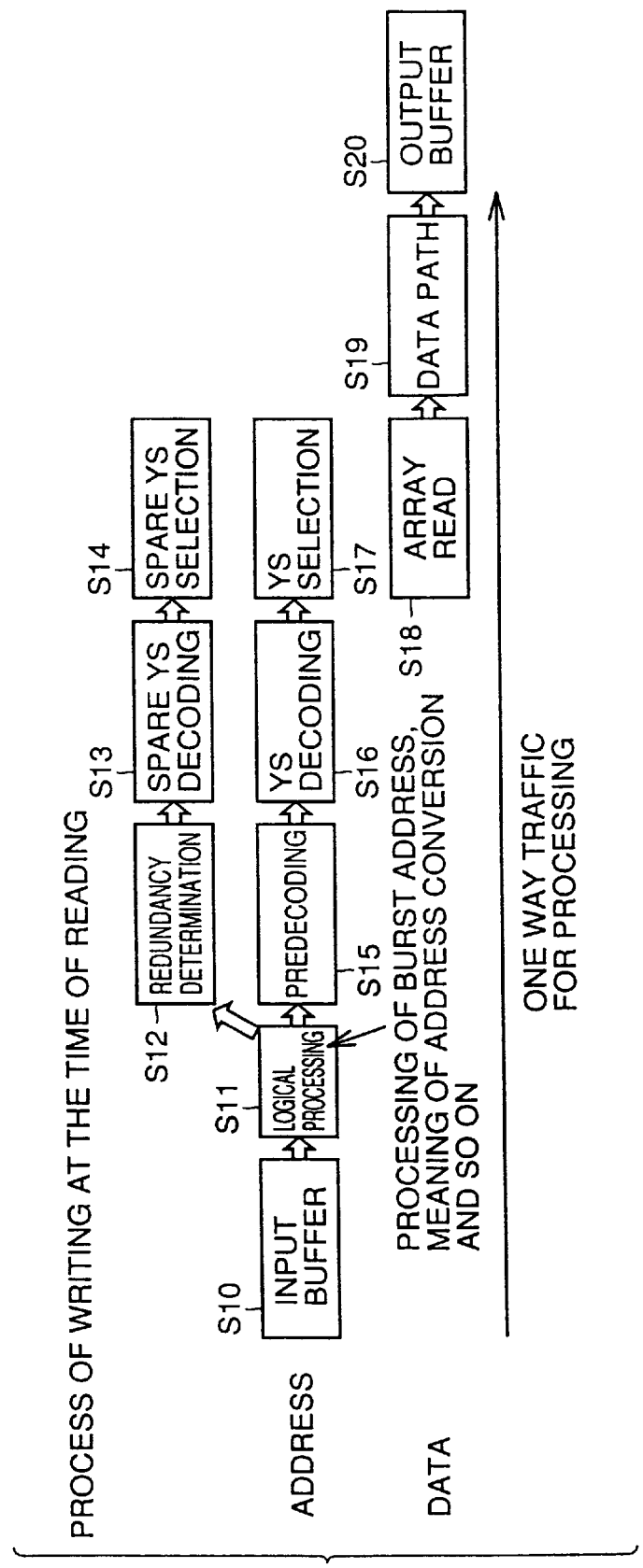
FIG. 22 shows a flow of control at the time of reading adopted in the present invention.

FIG. 22 is an illustration showing a flow of control in reading, adopted in the present invention.

Referring to FIG. 22, an address is input to the input buffer in step S10. The input address is subjected to logical processing such as burst address processing and address conversion in step S11. Thereafter, in step S15, the address is predecoded and, at the same time, address redundancy determination is performed in step S12. When the redundant memory cell is to be used as a result of redundancy determination, the selecting signal YS corresponding to the redundant memory cell is decoded in step S13, and the selecting signal YS corresponding to the redundant memory cell is selected and activated in step S14.

Meanwhile, the selecting signal YS corresponding to the normal memory cell is decoded in step S16, and the selecting signal YS corresponding to the normal memory cell is selected and activated in step S17.

When the selecting signal YS is activated, the data of the memory array is read in step S18, output to the data path in step S19, and the data is externally read out from the output buffer in step S20.

In a very large chip having the capacity as large as 1 G bits, internal signal propagation time is increased, limiting operation frequency of the chip. Therefore, in the present method of control, one way traffic of signal flow is provided, enabling optimal signal cycles bank by bank as will be described with reference to FIGS. 24 and 25 later, and as a result, waste time is eliminated.

Figure 23:
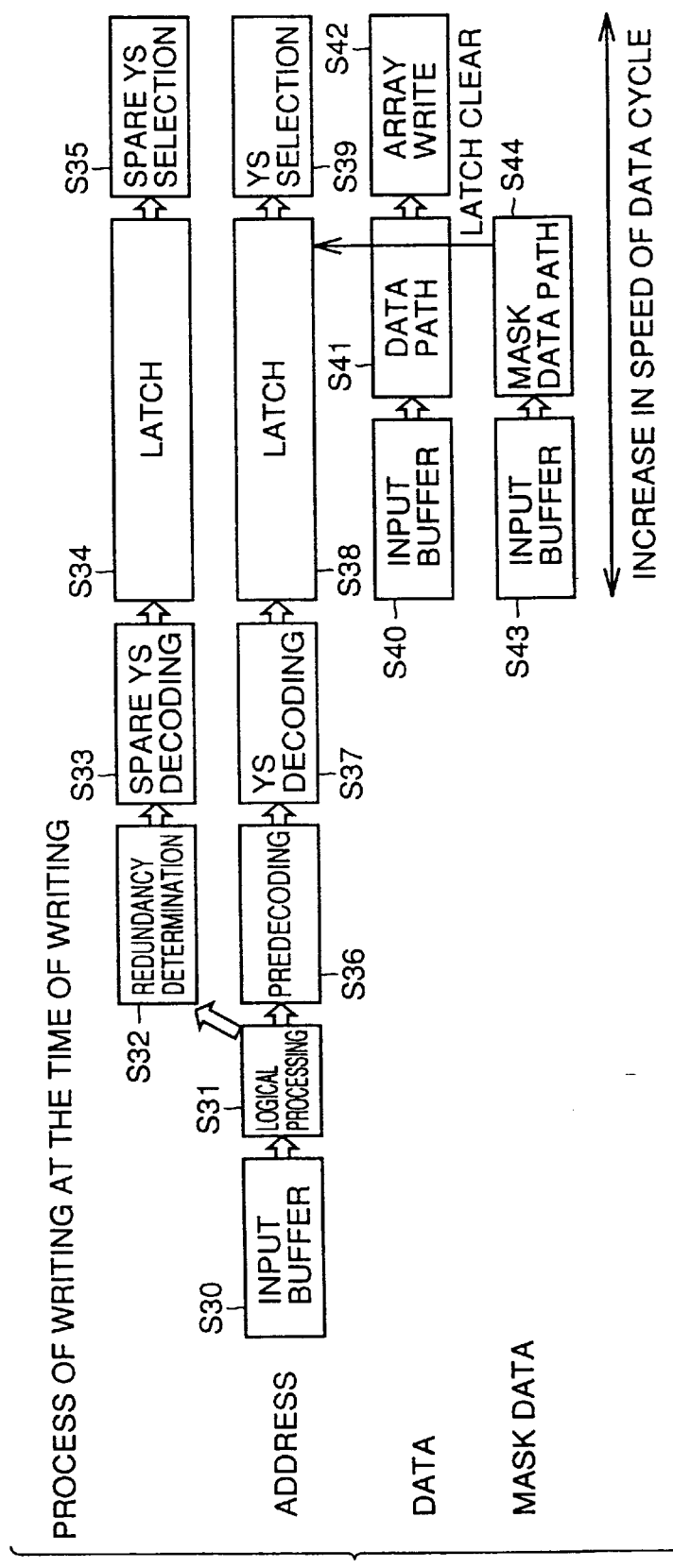
FIG. 23 shows a flow of control at the time of writing adopted in the present invention.

FIG. 23 is an illustration showing the flow of control in writing adopted in the present invention.

Referring to FIG. 23, an address is input to the input buffer in step S30. The input address is subjected to logical processing such as burst address processing and address conversion in step S31. Thereafter, the address is predecoded in step S36 and, at the same time, address redundancy determination is performed in step S32. When the redundant memory cell is to be used as a result of redundancy determination, the selecting signal YS corresponding to the redundant memory cell is decoded in step S33, temporarily latched and held in the memory block in step S34, and the control waits for data arrival. Meanwhile, the selecting signal YS corresponding to the normal memory cell is decoded in step S37, latched and held temporarily in the memory block in step S38, and the flow waits for data arrival.

The data and the mask data determining whether the data is valid/invalid are input to the chip delayed from the address in steps S40 and S43, respectively, by a process executed by a system outside the chip. The delay may be caused intentionally, or it may be caused unavoidably because of the specification of the chip external bus.

Thereafter, the data and the mask data are transmitted through the data path to the memory block in steps S41 and S44, respectively. Upon data arrival, the selecting signal YS is activated in step S35 or S39, and data is written to the memory array in step S42.

When the mask data invalidating the data is input, decoding information of the selecting signal YS held in the latch is cleared, the selecting signal YS is not activated, and data writing is not performed.

Therefore, the chip operation frequency is not limited by the wasteful data wait time experienced in the conventional process of writing described with reference to FIG. 50, and efficient data exchange is possible.

As compared with the first embodiment, redundancy determination is performed separately and in parallel, and therefore speed of operation can further be improved.

Control in a very large chip will be described.

Here, a bank near the central portion of the chip will be referred to as a central bank, and a bank far from the central portion of the chip will be referred to as a far bank. The central bank is determined not merely by the physical arrangement of the memory bank in the chip, and the central bank refers to that bank which is positioned at a highest position among flow of addresses and command signals.

In the configuration shown in FIG. 1, the central bank for the address input may be memory cell blocks 100d and 100e, while far bank may correspond to memory cell blocks 100a and 100h. For data input/output, the far bank may be memory cell blocks 100d and 100e, while the central bank may be memory cell blocks 100a and 100h, in contrast to those for the address input.

In the following, the central bank and the far bank refer to the central bank and the far bank relative to the address.

Figure 24:
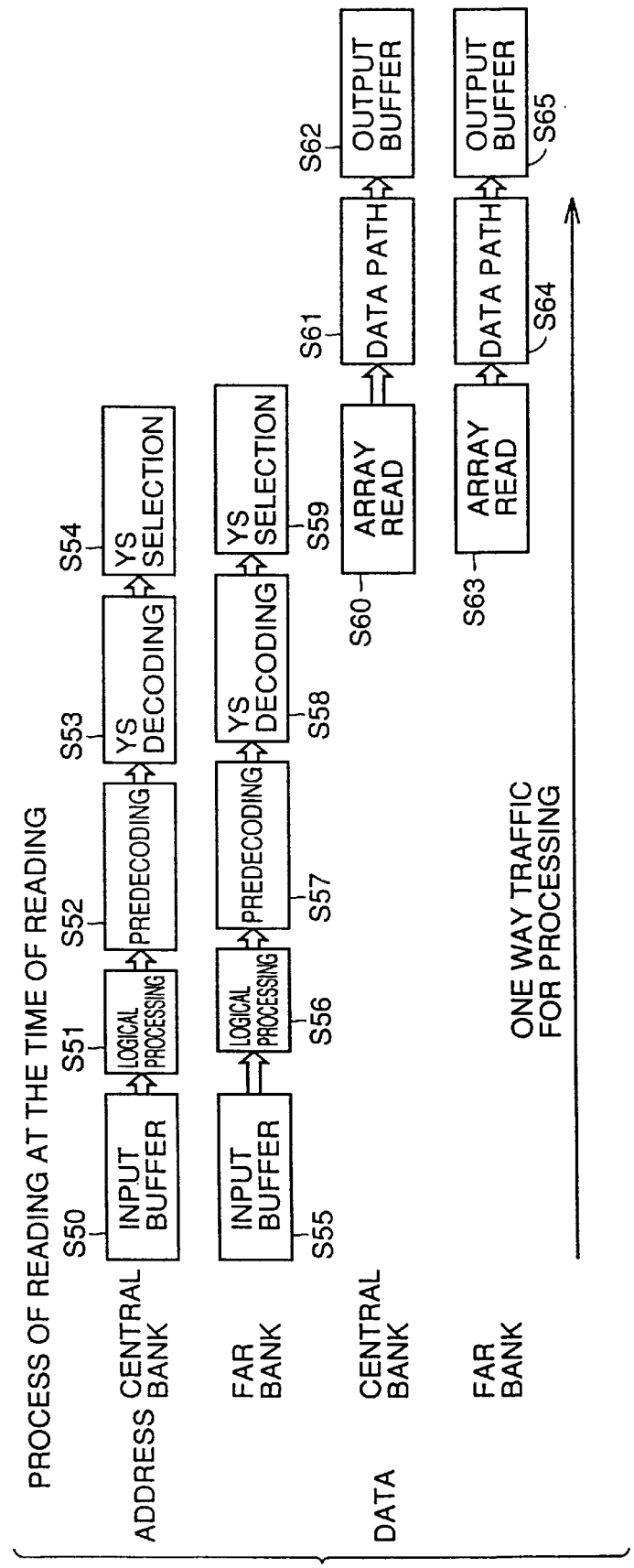
FIG. 24 is an illustration related to control at the time of reading in controlling a very large chip.

FIG. 24 an illustration related to control at the time of reading in a very large chip.

Referring to FIG. 24, at the time of reading, an address is input to the input buffer in step S50 for the central bank. The input address is subjected to logical processing such as burst address processing or address conversion in step S51. Thereafter, the corresponding selecting signal YS is decoded in step S52, the selecting signal YS for the normal-memory cell is decoded in step S53, and the selecting signal YS is selected activated in step S54.

In the far bank, by contrast, the address is input at the same timing as to the central bank (step S55) while the subsequent processing is performed with a delay as extra time is necessary until reaching the bank (steps S56 to S59).

Therefore, the timing at which the data is read from a memory array of the bank is earlier in the central bank (step S60) than the timing in the far bank (step S63). The central bank, however, is further away from data terminal DQ than the far bank, and therefore the time of propagation of the data is longer for the central bank (steps S161, S162) than the far bank (steps S164, S165). Therefore, the time from the input of the address to the input buffer to the output of data from the output buffer is almost the same between the central bank and the far bank.

More specifically, by the ODIC configuration, the sum of the time necessary for address and command signal transmission and the time necessary for data transmission is made smaller than the prior art example in any bank, and the absolute value of the sum of the time for data transmission is also made smaller.

Figure 25:
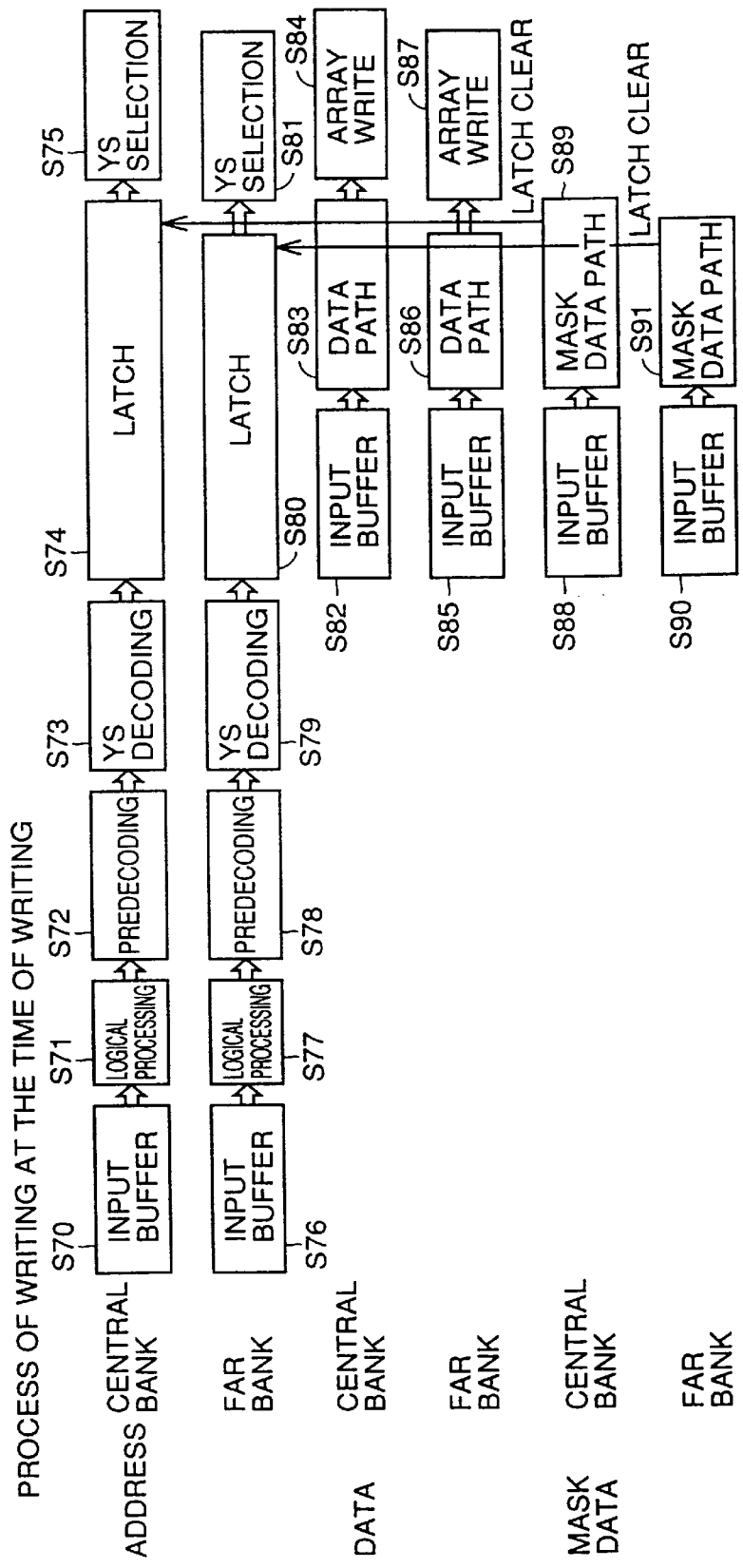
FIG. 25 is an illustration representing control at the time of writing in controlling a very large chip.

FIG. 25 is an illustration of control at the time of wilting in a very large chip.

Referring to FIG. 25, in the central bank, an address is input to the input buffer, subjected to logical processing and predecoding, the selecting signal YS is decoded and activating information of the selecting signal YS is held by a latch (steps S70 to S74). In a far bank, similarly, an address is input to the input buffer and subjected to logical processing and predecoding, the selecting signal YS is decoded and activating information of the selecting YS is held in a latch (steps S76 to S80).

The data and the mask data are input to the input buffer delayed from the address, and arrive at the bank portions at different timings between the central bank and the far bank (steps S82 to S83, S85 to S86, S88 to S89, S90 to S91). Upon data arrival, the selecting signal YS is activated. When the mask data is input, the selecting signal-YS is not activated. When the selecting signal YS is activated, (step S75, S81), writing to the memory array takes place, (steps S84, S87).

Figure 26:
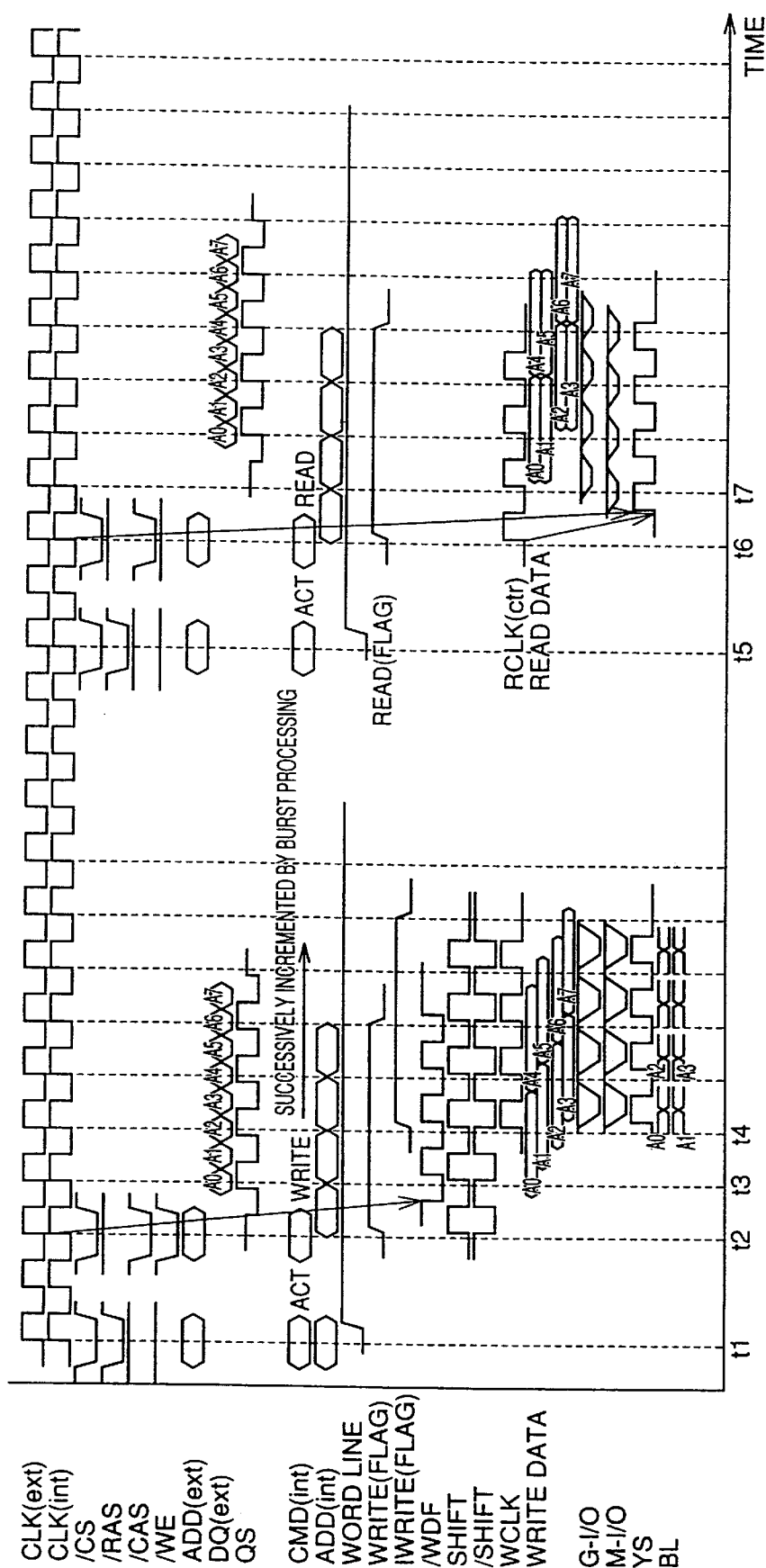
FIG. 26 is a diagram of waveforms illustrating difference in control between writing and reading.

FIG. 26 is a diagram of waveforms representing difference of control in writing and reading operations.

Referring to FIG. 26, the process related to the address is basically effect immediately after input, both in the writing and reading operations. The address converting process and the burst address generating process are performed in the input cycle. The following processes differ between the reading and writing operations.

At the time of reading, the actual internal read operation starts immediately after command input, at time t6. The address information processed in the input cycle is transmitted as it is in reading, and used as an information source for activating the selecting signal YS. A delayed signal from the clock RCLK for reading is used as a trigger for activating the selecting signal YS, a one shot pulse is generated at that timing and transmitted to the memory array.

After the time point t7, 2 bits of parallel data internally read are converted to serial data and output. At this time, the strobe signal QS is output from the side of the chip for recognizing the output data.

At the time of writing, the address information and the result of redundancy determination processed in the input cycle are passed through a path activated by a write flag, as will be described later. These pieces of information are taken in the shift register related circuitry based on the address process end signal /WDF (an inversion of delay from the clock), and shifted by complementary shift clock signals SHIFT and /SHIFT, and output after 2 clocks.

More specifically, actual internal write operation starts at time point t4 delayed by 2 clocks from the command input at time t2. Two bits of serial data externally input are converted to parallel data and written simultaneously.

Figure 27:
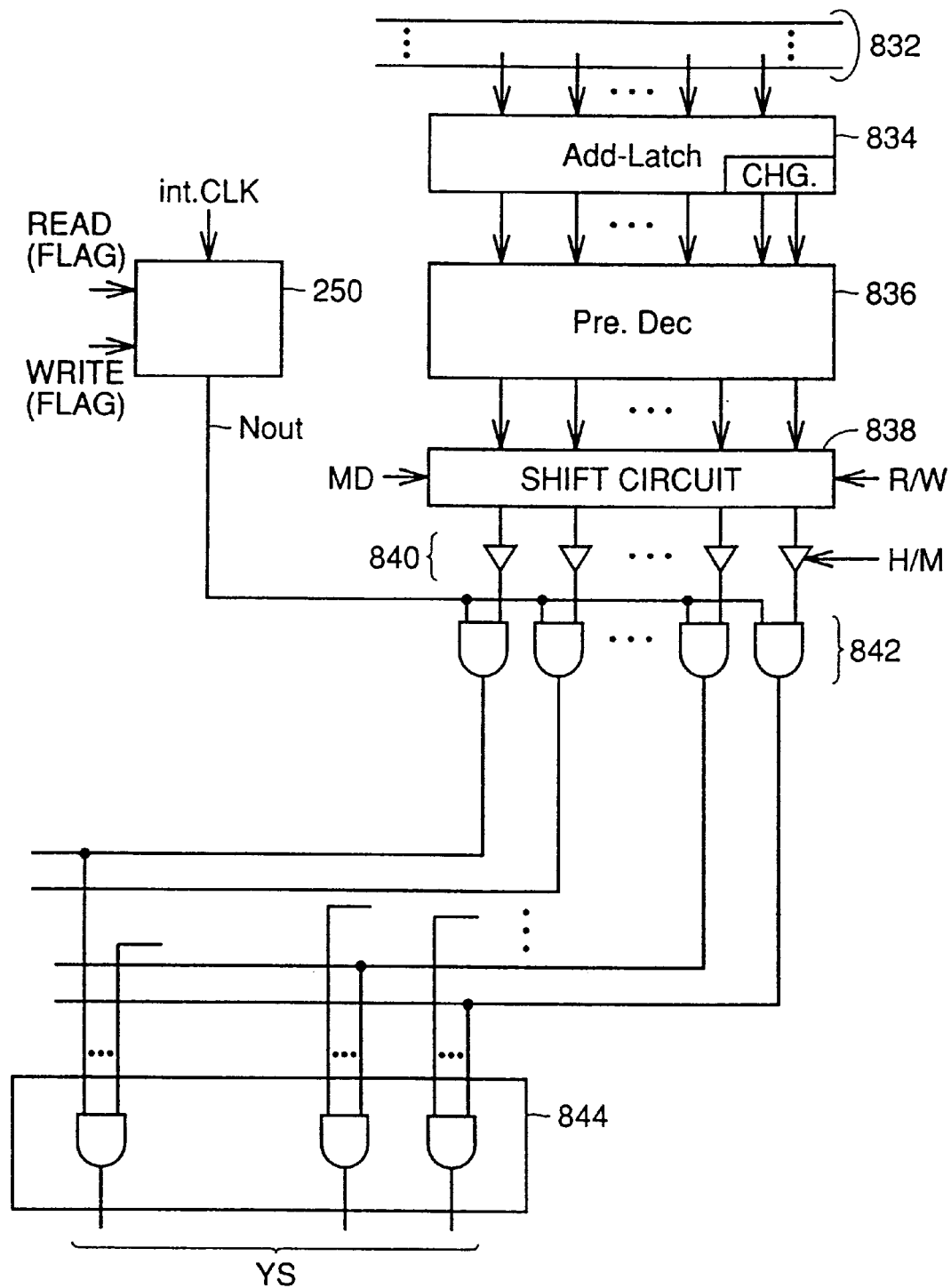
FIG. 27 is an illustration related to the flow from transmission of an address signal to activation of the selecting signal YS in each bank.

FIG. 27 is an illustration of the flow from address signal transmission to activation of the selecting signal YS in each bank.

Referring to FIG. 27, there are provided: an address latch 834 for latching a column address when the column address is transmitted over an address bus 832 provided common to respective banks; a column predecoder 836 receiving and predecoding an address from address latch 834; a shift circuit 838 receiving the result of predecoding output from column predecoder 836 when not masked by the signal MD, and outputting the result with a delay time (clock unit) made different between data reading from the bank and data writing to the bank; drive circuits 840 receiving an output from shift circuit 838; a write control circuit 250 changing delay amount of internal clock signal int.CLK in accordance with the read flag and the write flag and outputting the resulting signal to node Nout; NAND circuits 842 each connected at one input to node Nout and at the other input connected to output node of drive circuits 840; and a column decoder 844 receiving and decoding outputs of NAND circuits 842 and outputting the selecting signal YS. These components are provided for each bank.

The drive circuits 840 receive a signal HIM (Hit/Miss) representing whether the address of interest is to be substituted with a redundant array. When it is to be substituted for by the redundant array, outputs of drive circuits 840 are inactivated.

Figure 28:
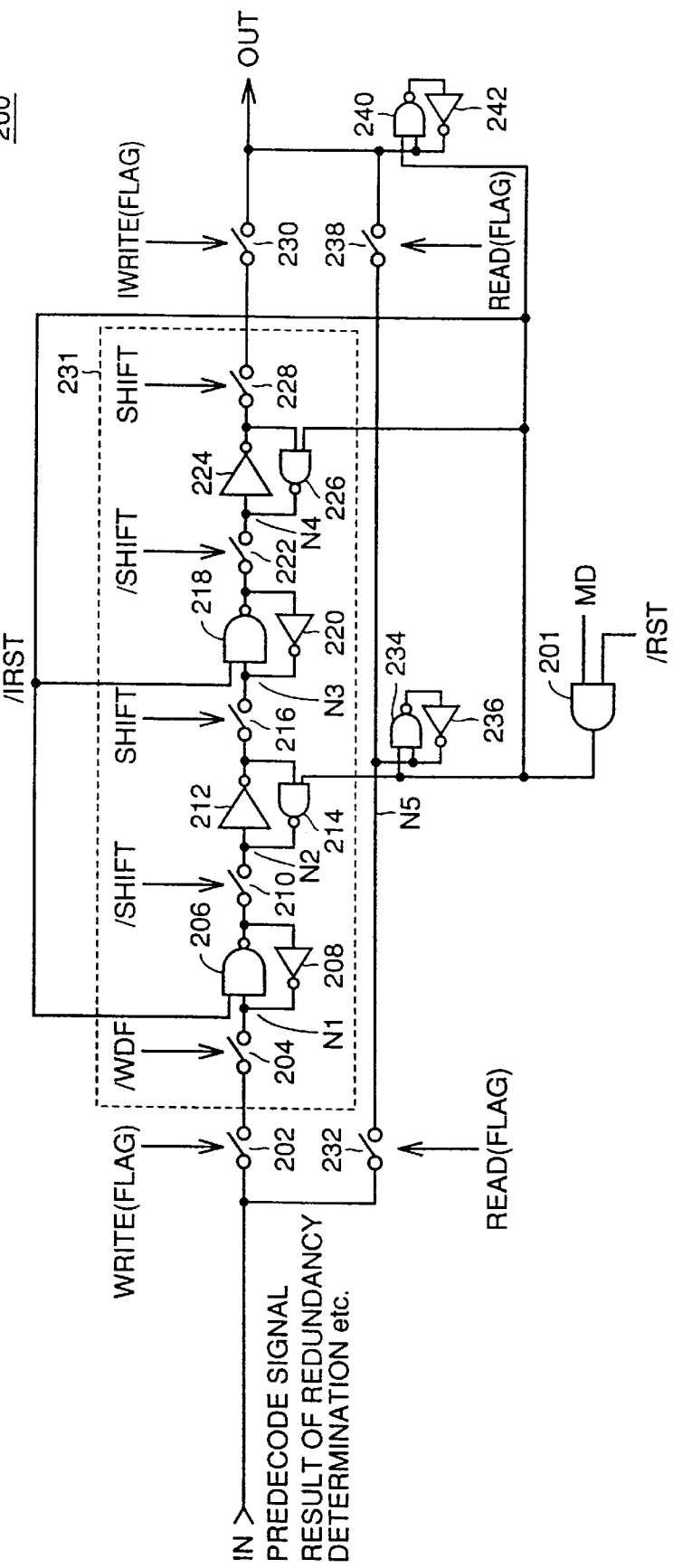
FIG. 28 is a circuit diagram showing a configuration of a shift circuit 200.

FIG. 28 is a circuit diagram showing a configuration of a shift circuit 200 included for each input data, in shift circuit 838 shown in FIG. 27.

Referring to FIG. 28, shift circuit 200 includes: an AND circuit 201 receiving signals /RST and MID and outputting the signal /IRST; switches 202 and 204 connected in series between an input node IN and a node N1 and rendered conductive in response to the signals WRITE (FLAG) and /WDF, respectively; an NAND circuit 206 receiving as inputs the potential at node N1 and the signal /IRST; an inverter 208 receiving an output of NAND circuit 206 and outputting an inverted signal to node N1; a switch 210 receiving an output from NAND circuit 206 and applying it to node N2 in response to the signal /SHIFT; an inverter 212 receiving and inverting the potential at a node N2 an NAND circuit 214 receiving an output from inverter 212 and the signal /IRST and providing an output to node N2; a switch 216 receiving the output from inverter 212 and applying it to a node N3 in response to the signal SHIFT; an NAND circuit 218 receiving at inputs the potential of node N3 and the signal /IRST; an inverter 220 receiving and inverting an output of NAND circuit 218 and providing the result to node N3; a switch 222 applying an output of NAND circuit 218 to a node N4 in response to the signal /SHIFT; an inverter 224 receiving and inverting the potential of node N4; an NAND circuit 226 receiving an output of inverter 224 and the signal /IRST and providing a result to node N4; and switches 228 and 230 connected in series between an output of inverter 224 and an output node OUT and rendered conductive in response to the signals SHIFT, IWRITE (FLAG), respectively.

Shift circuit 200 further includes: a switch 232 for connecting an input node IN and a node N5 in response to the signal READ (FLAG); an NAND circuit 234 receiving at inputs the potential of node N5 and the signal /IRST; an inverter 236 receiving and inverting an output of NAND circuit 234 and providing the resulting output to node N5; a switch 238 connecting the node N5 to the output node OUT in response to the signal READ (FLAG); an NAND circuit 240 receiving at inputs the potential of output node OUT and the signal /IRST; and an inverter 242 receiving and inverting the output from NAND circuit 240 and providing the resulting signal to output node OUT.

At the time of reading, the signal READ (FLAG) is activated, switches 232 and 238 are rendered conductive and the signal WRITE (FLAG) is inactivated, and therefore switches 202 and 230 are rendered nonconductive. Therefore, the address information processed in the input cycle is transmitted directly through node N5 to the memory array, and used as the information for activating the selecting signal YS.

At the time of writing, the result of redundancy determination and the address information processed in the input cycle are passed through nodes N1, N2, N3 and N4, as the signal WRITE (FLAG) is activated. These pieces of information are taken into shift register 231 in response to the signal /WDF (inversion of delay from the clock) indicating end of an address processing, and shifted by the signals SHIFT and /SHIFT. After 2 clocks, the information is output from output node OUT. In a reset period, the signal /RST attains to the "L" level, nodes N1 and N3 of the shift register are fixed at the "L" level and nodes N2 and N4 are fixed at the "H" level.

More specifically, by the shift circuit, it becomes possible to change timing of column activating signals generated corresponding to the column address at the time of data reading and data writing different from each other using an internal clock period as a unit, and therefore the timing from reception of the command until array activation can be made different in reading and writing operations.

Figure 29:
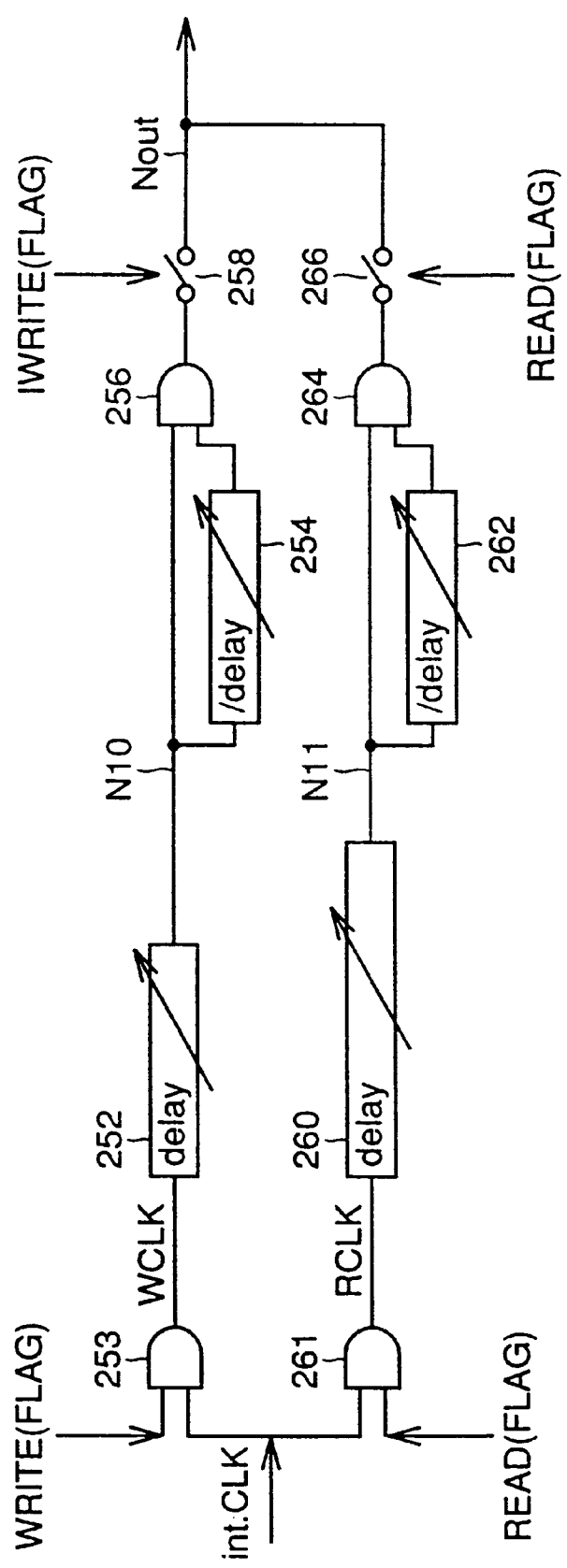
FIG. 29 is circuit diagram representing a configuration of an adjusting circuit 250.

FIG. 29 is a circuit diagram showing the configuration of write control circuit 250.

Referring to FIG. 29, write control circuit 250 includes: an AND circuit 253 receiving the internal clock signal int.CLK and the signal WRITE (FLAG) and outputting the signal WCLK; a delay circuit 252 receiving and variably delaying the signal WCLK and outputting the delayed signal to node N10; an inverting and delaying circuit 254 receiving, inverting and delaying an output of delay circuit 252; an AND circuit 256 receiving outputs of delay circuit 252 and inverting and delaying circuit 254; and a switch 258 rendered conductive in response to the signal IWRITE (FLAG) and applying an output from AND circuit 256 to output node Nout.

The write control circuit 250 further includes: an AND circuit 261 receiving the internal clock signal int.CLK and the signal READ (FLAG) and outputting the signal RCLK; a delay circuit 260 receiving and variably delaying the signal RCLK and outputting the delayed signal to a node N11; an inverting and delaying circuit 262 receiving, inverting and delaying an output of delay circuit 260; an AND circuit 264 receiving outputs of delay circuit 260 and inverting and delaying circuit 262; and a switch 266 rendered conductive in response to the signal READ (FLAG) and applying an output of AND circuit 264 to output node Nout.

A signal is output from output node Nout to a decoder portion decoding the selecting signal YS. The output signal serves as a trigger for activation of the selecting signal YS and determines active period of the selecting signal YS.

The write control circuit is capable of changing the amount of delay from the clock of the output signal determining the timing of activation of the selecting signal YS independently in reading and writing operations, and also capable of changing output pulse width of the output signal which determines the active period of the selecting signal YS.

Figure 30:
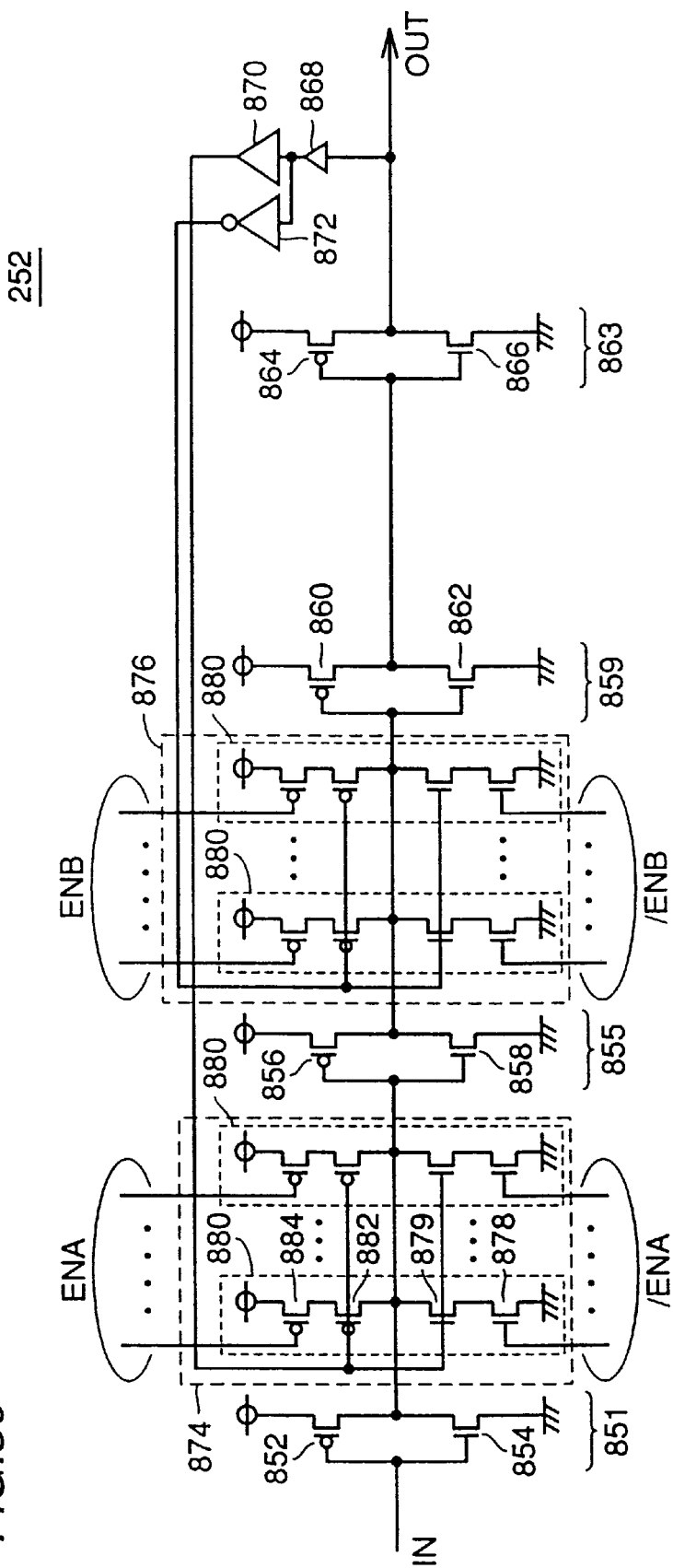
FIG. 30 is a circuit diagram showing configuration of a delay circuit 252 shown in FIG. 29.

FIG. 30 is a circuit diagram showing the configuration of delay circuit 252 shown in FIG. 29.

Referring to FIG. 30, the delay circuit includes: inverters 851, 855, 859 and 863 connected in series between an input node IN and an output node OUT; a buffer circuit 868 having an input connected to output node OUT; a buffer circuit 870 receiving an output of buffer circuit 868; an inverter 872 receiving an output of buffer circuit 868; a delay control circuit 874 responsive to an output of buffer circuit 870 and control signals ENA and /ENA for applying an output to an output node of inverter 851; and a delay control circuit 876 providing an output in accordance with an output of inverter 872 and control signals ENB and /ENB to an output node of inverter 855.

Inverters 851, 855, 859 and 863, further include P channel MOS transistors 852, 856, 860 and 864 having sources connected to a power supply node and gates connected to input nodes of inverters 851, 855, 859 and 863, respectively.

Inverters 851, 855, 859 and 863 further include N channel MOS transistors 854, 858, 862 and 866 having gates connected to input nodes of inverters 851, 855, 859 and 863, sources connected to the ground node and drains connected to the drains of P channel MOS transistors 852, 856, 860 and 864, respectively.

Delay control circuit 874 includes a plurality of delay control stages 880. The delay control stage 880 includes: a P channel MOS transistor 884 having its source connected to a power supply node and receiving at its gate the control signal ENA; a P channel MOS transistor 882 having its gate connected to an output node of delay control stage 880 and connected between the drain of P channel MOS transistor 884 and the output node of delay control stage 880; an N channel MOS transistor 878 receiving at its gate the control signal /ENA and having its source connected a ground node; and an N channel MOS transistor 879 having its gate connected to an input node of delay control stage 880 and connected between the drain of N channel MOS transistor 878 and the output node of delay control stage 880. An output of buffer circuit 870 is applied to the input nodes of respective delay control stages 880 included in the delay control circuit 874. Control signals ENA and /ENA include control signals corresponding to respective delay control stages 880, and the number of delay control stages to be activated is determined based on the control signals.

Delay control circuit 876 includes a plurality of delay control stages 880 and to the input nodes of the delay control stages 880, an output of inverter 872 is applied. Control signals ENB and /ENB include control signal lines corresponding to respective delay control stages 880, and the number of delay control stages 880 to be activated is determined in accordance with the number of control signal lines which are activated.

Here, the larger the number of delay control stages 880 which are activated, in the delay control circuit 874, the more the output of inverter 851 is prevented, and therefore the amount of delay of delay circuit 252 increases. Similarly, the larger the number of delay control stages 880 which are activated in delay control circuit 876, the more the output of inverter 855 is prevented, and therefore the amount of delay of delay circuit 252 increases.

The delay circuit 260 shown in FIG. 29 has similar configuration as the delay circuit 252 and therefore description thereof is not repeated. Inverting and delaying circuits 254 and 262 shown in FIG. 29 each have an inverter added to the output of delay circuit 252, thus providing an inverted signal as an output. Except this point, the configuration is similar to that of delay circuit 252, and therefore description thereof is not repeated.

The necessity of independently determining the timing of activation and active period of selecting signal YS between the reading operation and the writing operation by the write control circuit 250 will be described.

Figure 31:
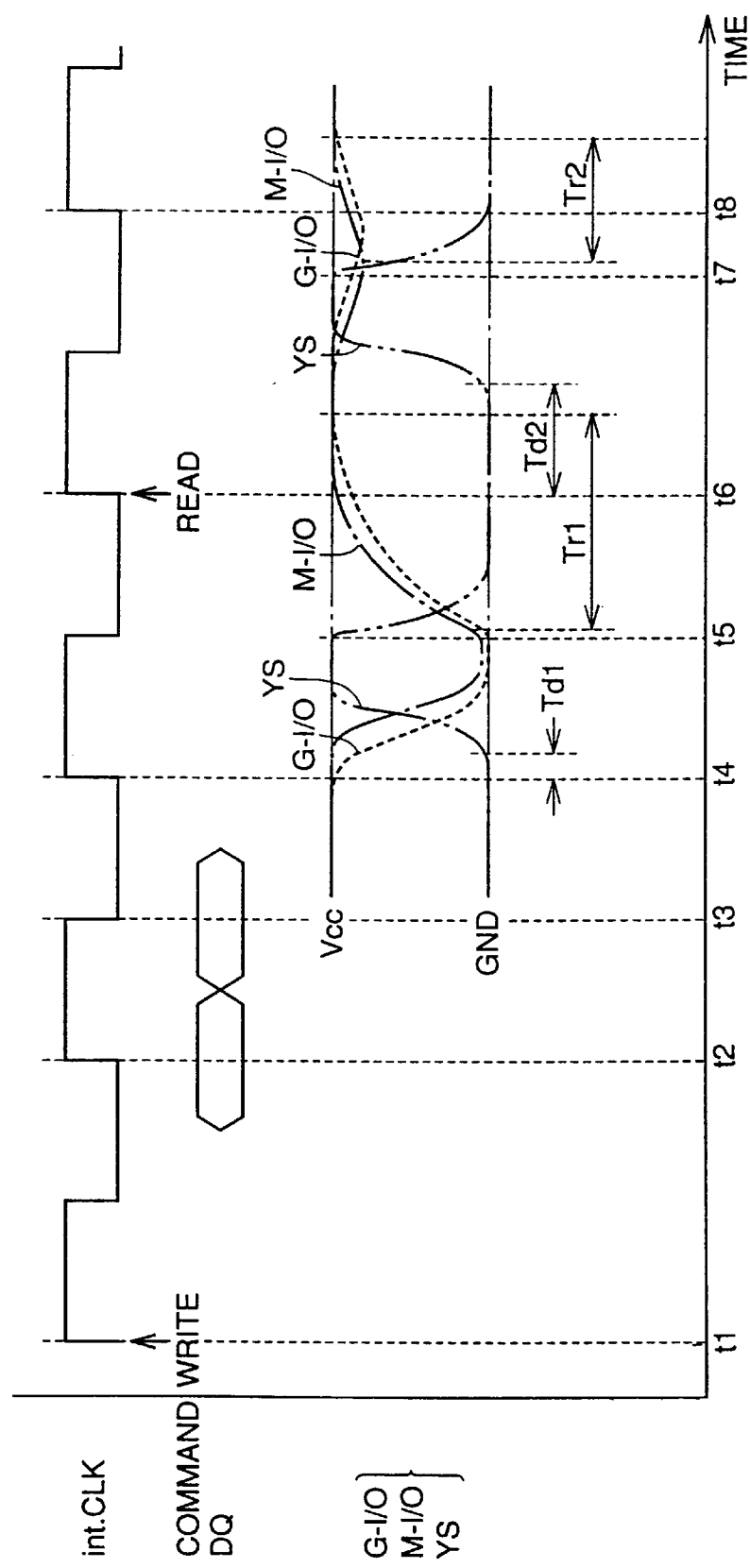
FIG. 31 is a diagram of waveforms related to internal signals when a read operation takes place immediately after a write operation.

FIG. 31 is a diagram of waveforms representing internal signals when a read operation occurs immediately after a write operation.

Referring to FIG. 31, at time t1, an externally applied write command is taken in at a rising edge of the dock. At time points t2 and t3, data for writing is applied externally. The applied data is subjected to serial-parallel conversion in the midway, transmitted to the memory array through input/output lines G-I/O and M-I/O between t4 to t6, and written to the memory cells upon activation of the selecting signal YS. At this time, the delay time Td1 from the clock edge to the start of activation of the selecting signal YS is set short. This setting is done by the delay circuit 252 shown in FIG. 29. The pulse width of the selecting signal YS here is determined by the inverting and delaying circuit 254.

Thereafter, an externally applied read command is taken in at a rise of the clock edge at time t6. In response, activation of selecting signal YS starts after the delay time Td2, and data is externally read from the memory cell through input/output lines M-I/O and G-I/O. The delay time Td2 is set longer than the delay time Td1.

The reason will be described in the following. The data transmitted to the input/output lines G-I/O and M-I/O at the time of writing is generally adapted to have large signal amplitude, in order to rewrite data in the memory cell. In this case, it takes time after the data is written to the memory cell, for precharging to be ready for the next data transmission. The precharge time is represented in FIG. 31 as a rise time Tr1. By comparison, the input/output lines G-I/O and M-I/O do not require much time for precharging at the time of reading. In FIG. 31, this time period is represented by the rise time Tr2. This is because the amplitude of the input/output lines may be smaller in reading, as compared with writing.

Assuming that a reading operation immediately follows a writing operation, if the time period from the clock edge until start of activation of the selecting signal YS is set the same as in the writing operation, much time is consumed by driving and precharging the input/output lines in the writing operation, and precharging of the input/output lines may possibly be incomplete in the next reading operation.

In such a case, by setting the delay time Td1 short and delay time Td2 long, there can be a margin in the time period until completion of precharging of the input/output lines G-I/O and M-I/O in the write cycle until the start of reading in the read cycle. More specifically, the timing of activation of the selecting signal YS in the writing operation is set earlier to terminate the writing operation earlier, to be ready for the next read cycle after the end of writing.

As a result, the time necessary for equalizing the input/output lines and the like can be ensured, operation margin of the semiconductor memory device can be enlarged and therefore, operation at higher frequency clock becomes possible.

Again referring to FIG. 26, at the time point where the selecting signal YS is activated, the data has already been latched, and therefore the data is transmitted in minimum time to the memory array.

The data input serially from the outside are successively taken in at the latch of the input portion, and as a set of 2 bits, transmitted to the memory array. Data A0 and A1 are taken in two latches provided parallel to each other.

Then, while data A0 and A1 as a set are transmitted to the memory array, data A2 and A3 are taken in the latches. Data A2 and A3 are taken in different latches from those holding data A0 and A1, so as to prevent collision with data A0 and A1.

Figure 32:
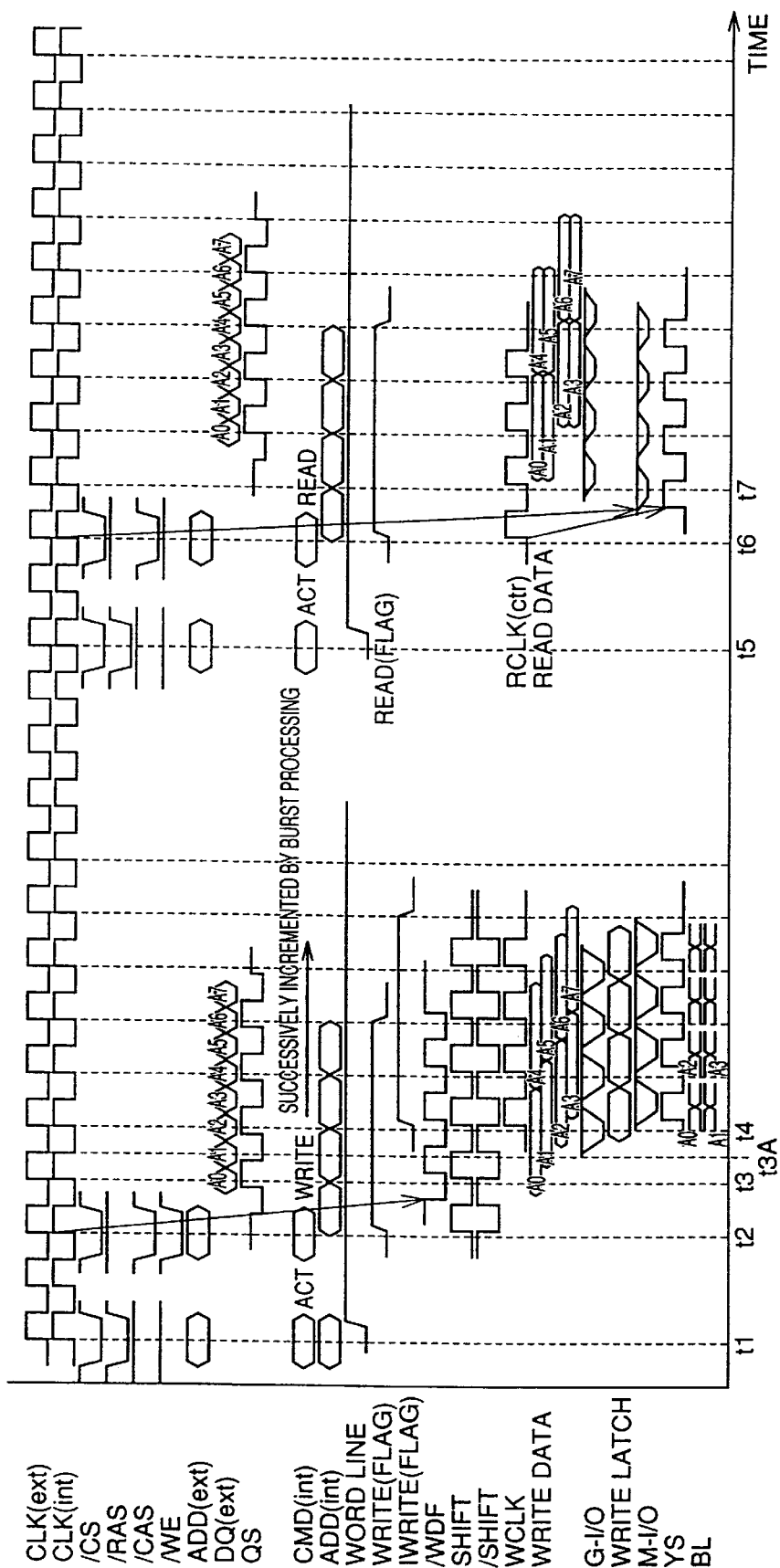
FIG. 32 is a diagram of waveforms representing an operation with further increased margin.

FIG. 32 is a diagram of waveforms representing an operation with further enlarged margin.

Referring to FIG. 32, assume that data DQ (ext) are input continuously at a time point t3 after 1 clock from a write command input and at time t3A after 1.5 clocks from the write command input. If the data is transferred at time t3A from the data latch at the input portion to the array latch in the array portion through the global input/output line G-I/O to be ready for the write operation to the memory cell starting from time point t4, the delay time necessary for the data to be transmitted over global input/output line G-I/O can be saved, and the margin can be enlarged further. Other waveforms are similar to those of FIG. 26, and therefore description thereof is not repeated.

Figure 33:
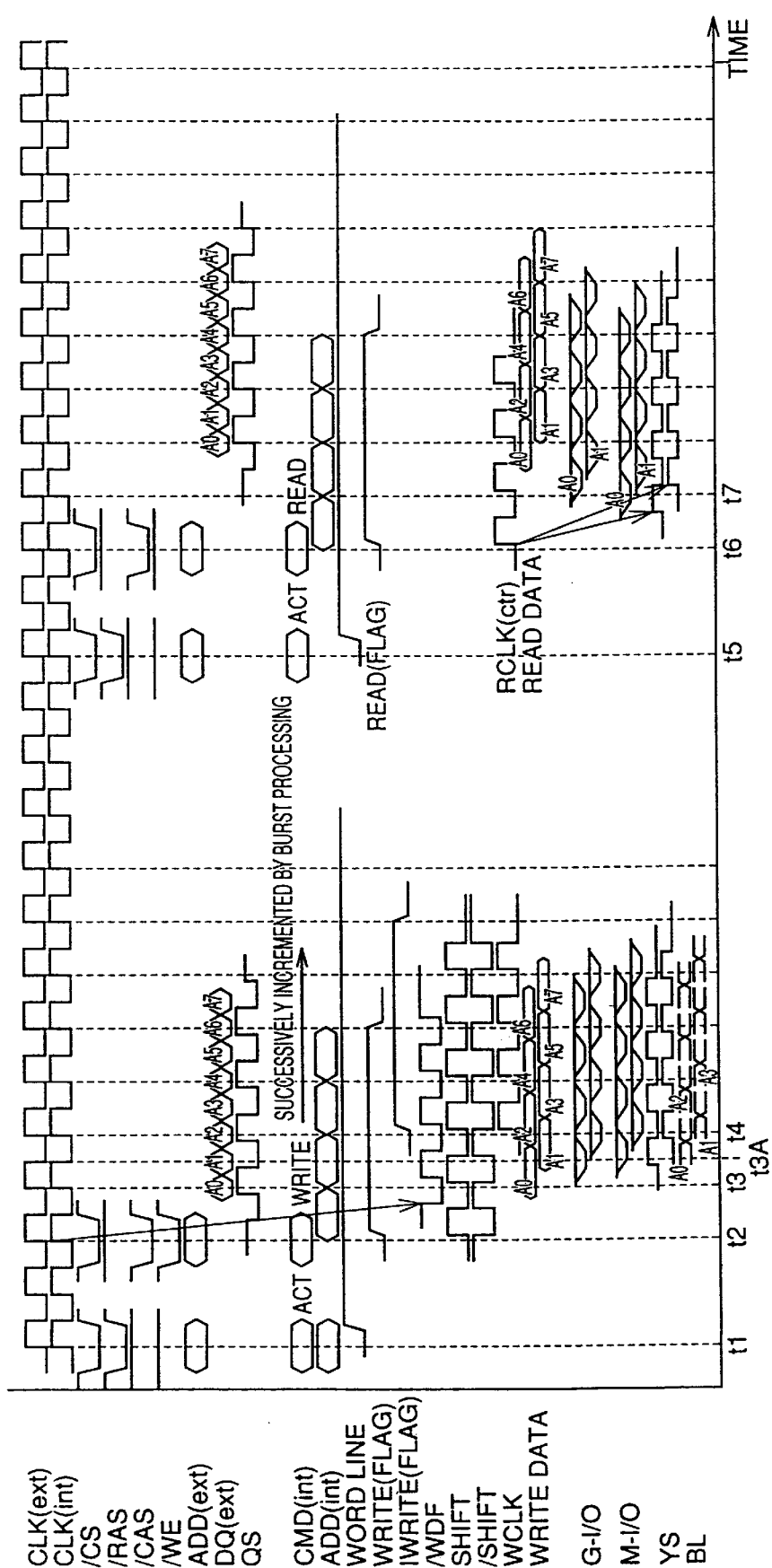
FIG. 33 is a diagram of waveforms where operations are highly independent from each other.

FIG. 33 is a diagram of waveforms where operations are performed with higher degree of independency.

Referring to FIG. 33, here, an example is shown in which timings of transmission of the input data to the array after the time point t3 are different. The data A0 input at time t3 is written through the global input/output line G-I/O without waiting for the arrival of data A1. In order to prevent collision of data A0 and A1 within the chip, buses and the like may be separated. Provided that the writing operation of data A0 is completed before arrival of data A2 through the bus to the memory array, data A0 and data A2 do not collide.

In reading after time point t6, similarly, the data corresponding to data A0 is read from the memory, and thereafter the data corresponding to data A2 is read from the memory array. Provided that the output of data A0 is completed before rewriting of data A0 at the output portion, data A0 and A2 do not collide. Here, in the array within the chip, timing of activation of selecting signal YS is made different.

As described above, in the synchronous semiconductor device in accordance with the second embodiment, timings of reference signals are changed between reading and writing of data to and from the memory bank, so as to improve speed of operation. In addition, since the process for redundancy determination is performed in parallel, the speed of operation can further be improved.

Third Embodiment

The third embodiment addresses improvement in efficiency of address transmission.

A normally possible configuration for the synchronous semiconductor memory device of the first and second embodiments will be described.

Figure 34:
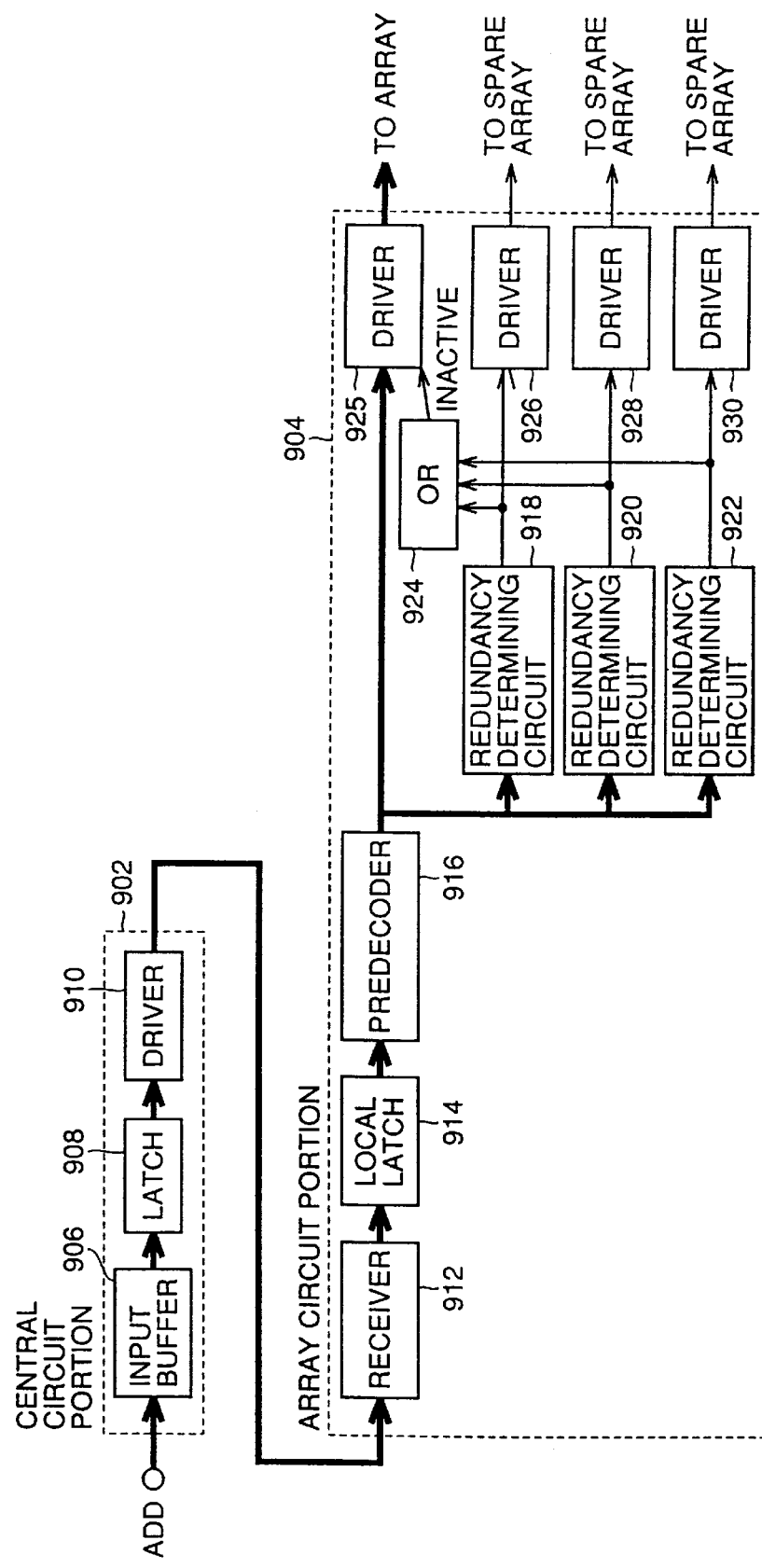
FIG. 34 is an illustration representing common address transmission configuration.

FIG. 34 is an illustration of a normal address transmission configuration.

Referring to FIG. 34, an externally input address signal is transmitted to a central circuit portion 902 provided at the center of the chip, thereafter transmitted to an array circuit portion 904 provided corresponding to each array through an address bus, and an activating signal corresponding to an address is applied to each array. The central circuit portion 902 includes an input buffer 906 receiving an address signal ADD, a latch circuit 908 latching an output of input buffer 906, and a driver 910 driving an output of latch circuit 908.

Array circuit portion 904 includes: a receiver 912 receiving an output of driver 910; a local latch 914 latching an output of receiver 912; a predecoder 916 receiving and predecoding an output of the local latch 914; redundancy determining circuits 918, 920 and 922 receiving the result from predecoder 916 and performing redundancy determination; an OR circuit 924 outputting an inactivating signal when any of the outputs of redundancy determining circuits 918, 920 and 922 is activated; a driver 925 receiving an output of predecoder 916 and in accordance with the inactivating signal output from OR circuit 924, for outputting the result of predecoding to the array; and drivers 926, 928 and 930 receiving outputs from redundancy determining circuits 918, 920 and 922 and providing outputs to corresponding spare arrays, respectively.

A configuration as described above is normally conceivable for address transmission. In the configuration, however, operations of redundancy determining circuits 918, 920 and 922 as well as OR circuit 924 must be completed before application of the output of predecoder 916 to the array. Therefore, it takes time for the address to be transmitted to the array, hindering higher speed of operation of the semiconductor memory device.

Figure 35:
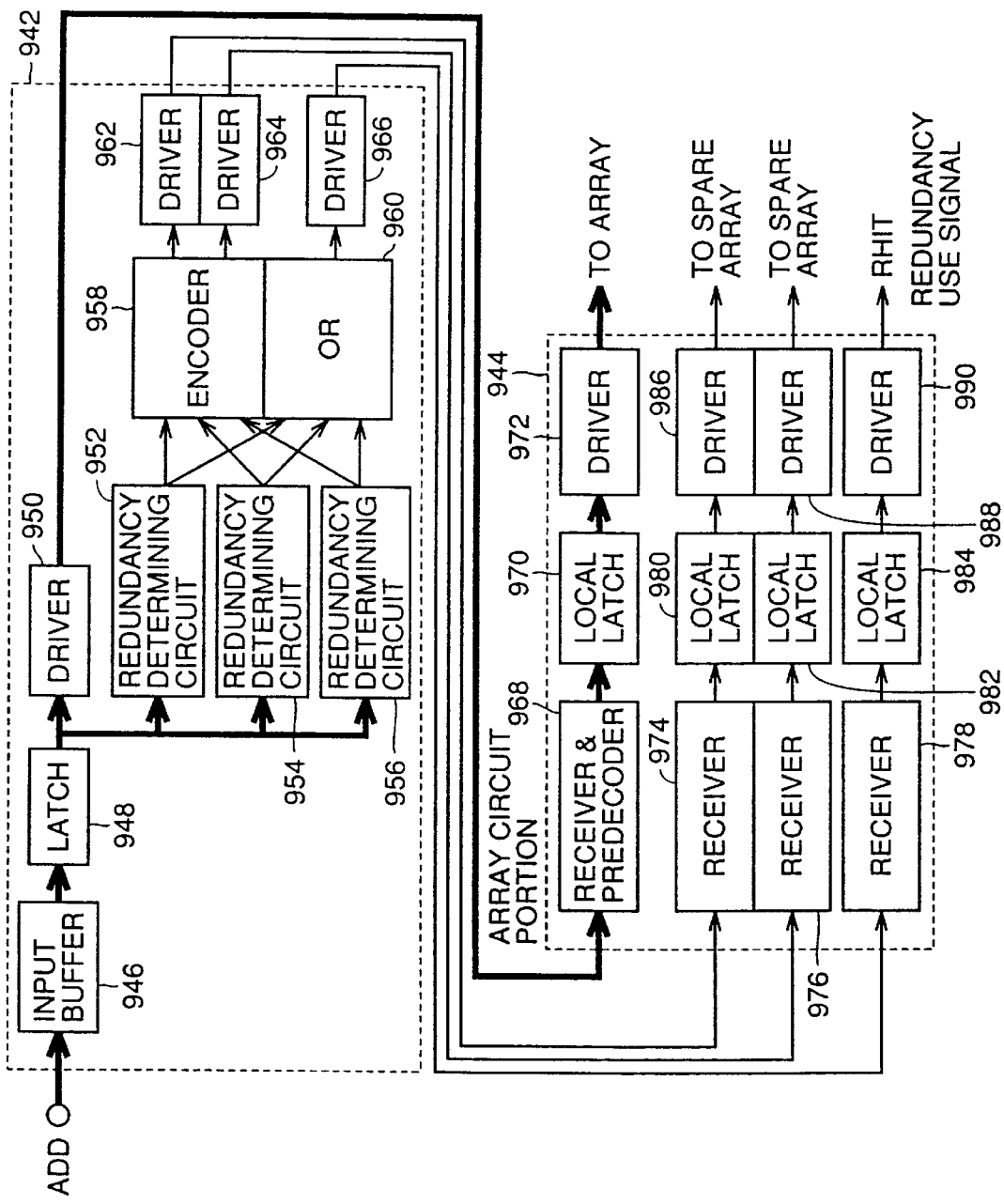
FIG. 35 is a block diagram showing a configuration of a portion related to address transmission in a semiconductor device in accordance with a third embodiment.

FIG. 35 is a block diagram showing a configuration of a portion related to address transmission in the semiconductor device in accordance with the third embodiment.

Referring to FIG. 35, an externally input address signal ADD is subjected to a prescribed processing at central circuit portion 942, transmitted to array circuit portion 944 provided corresponding to each array and output to the array. The array refers to a memory block having a plurality of memory cells, a memory bank or the like.

Central circuit portion 942 includes an input buffer 946 receiving the address signal ADD, a latch circuit 948 receiving an output of input buffer 946, and a driver 950 for transmitting the address signal latched by latch circuit 948 directly to the array circuit portion.

The central circuit portion 942 further includes: redundancy determining circuits 942, 954 and 956 for determining whether the address signal latched by latch circuit 948 corresponds to the set redundant address; an encoder 958 receiving and encoding outputs of determining circuits 952, 954 and 956; drivers 962 and 964 transmitting the encoded results of encoder 958 to the array circuit portion; an OR circuit 960 receiving outputs from redundancy determining circuits 952, 954 and 956; and a driver 966 receiving an output from OR circuit 960 and providing an output to the array circuit portion.

The array circuit portion 944 includes a receiver & predecoder 968 receiving the address signal from driver 950, a local latch 970 receiving and latching an output from receiver & predecoder 968, and a driver 972 for outputting the output of local latch 970 to the array.

The array circuit portion 944 further includes: receivers 974, 976 and 978 receiving outputs from drivers 962, 964 and 966, respectively; local latches 980, 982 and 984 receiving and latching outputs of receivers 974, 976 and 978, respectively; and drivers 986, 988 and 990 receiving and transmitting to the array the output of local latches 980, 982 and 984.

Outputs of drivers 986 and 988 are decoded in the array portion and activate the spare array. The output of driver 990 provides a redundancy use signal RHIT indicating that as a result of redundancy determination, a spare array in the bank is used in place of the normal memory array.

When the redundancy use signal RHIT is activated, the signal for activating the normal memory array provided by driver 972 is invalidated.

Though three redundancy determining circuits are shown in FIG. 35, actually, a larger number of redundancy determining circuits are provided.

One address is never programmed for two redundancy determining circuits. Therefore, it is the case that outputs of the redundancy determining circuits are either not activated at all or only one of the outputs is activated, no matter what input address is applied.

More specifically, when substitution is not performed, all the output signals from the plurality of redundancy determining circuits are inactivated, and when substitution is performed, any one of the output signals is activated.

Therefore, by encoding the outputs of the plurality of redundancy determining circuits, it is possible to compress the result of redundancy determination (reduce the number of lines for transmission) and output the compressed result to the memory array circuit portion.

More specifically, when there are N redundancy determining circuits, the number of signal lines after encoding is $Log_2 N$.

By this configuration, it becomes possible to set earlier the timing of output of the signal for activating the memory array from array circuit portion 944, and also it is possible to reduce the number of signal lines for transmitting the result of redundancy determination from the central circuit portion 642. Therefore, the speed of address transmission within the chip can be improved, while increase in chip area can be suppressed.

Fourth Embodiment

Figure 36:
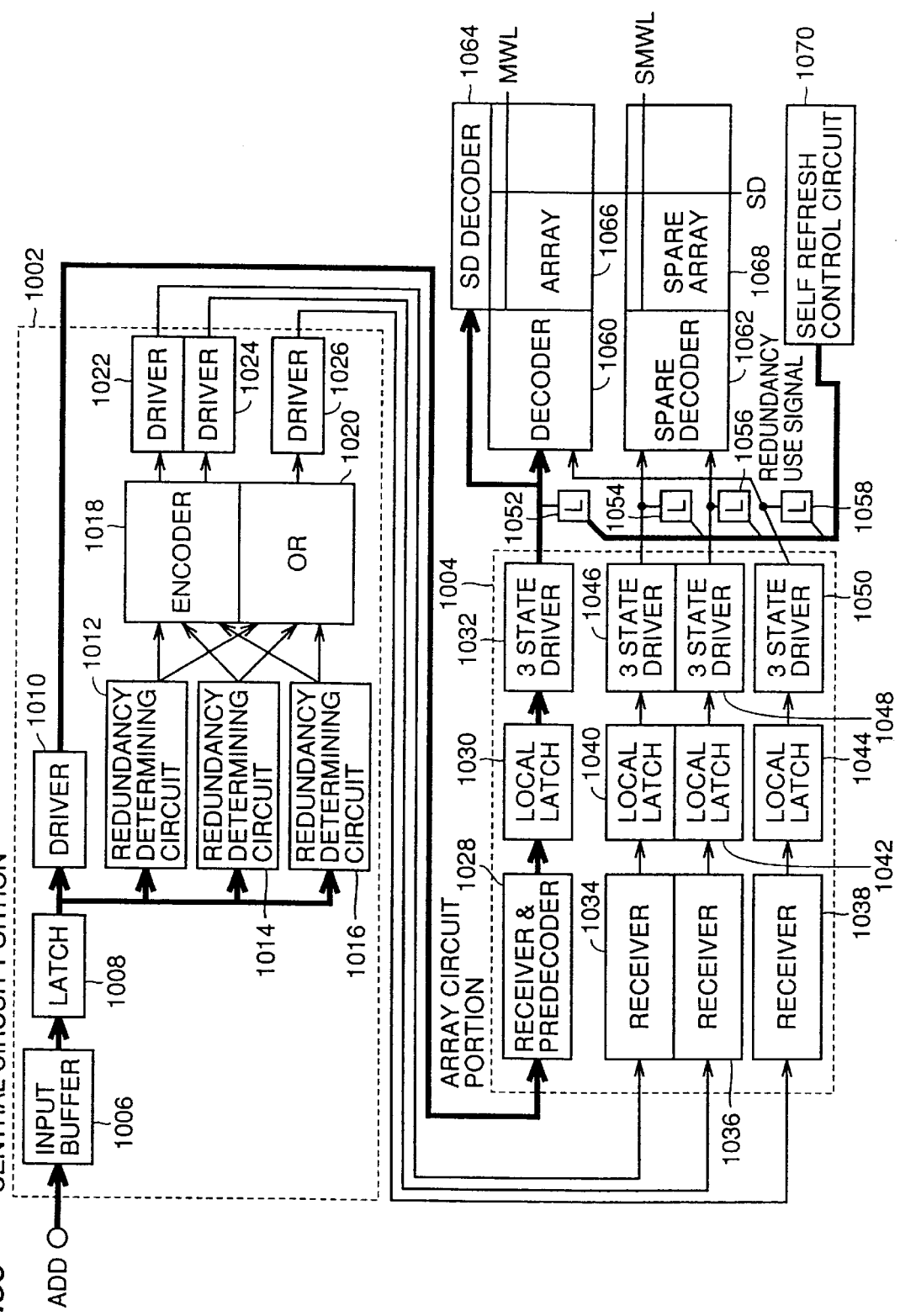
FIG. 36 is a block diagram illustrating row related address transmission in a synchronous semiconductor memory device in accordance with a fourth embodiment.

FIG. 36 is a block diagram showing row related address transmission in the synchronous semiconductor memory device in accordance with the fourth embodiment.

Referring to FIG. 36, the address signal ADD is input to a central circuit portion 1002 and subjected to prescribed processings.

Thereafter, the result of processing is transmitted to an array circuit portion 1004 provided corresponding to each memory array and output to each memory array. Central circuit portion 1002 includes an input buffer 1006 receiving the address signal ADD, a latch 1008 receiving and latching an output of input buffer 1006, and a driver 1010 receiving an output of latch 1008 and providing an output to array circuit portion 1004.

Central circuit portion 1002 further includes: redundancy determining:circuits 1012, 1014 and 1016 receiving an output from latch circuit 1008; an encoder 1018 receiving and encoding outputs of redundancy determining circuits 1012, 1014 and 1016; an OR circuit 1020 receiving outputs of redundancy determining circuits 1012, 1014 and 1016; drivers 1022 and 1024 respectively receiving two output signals of encoder 1018;and a driver 1026 receiving an output of OR circuit 1020 and providing an output to the array circuit portion.

Though three redundancy determining circuits are shown for simplicity of description, actually, larger number of redundancy determining circuits are provided.

Array circuit portion 1004 includes a receiver & predecoder 1028 receiving and predecoding an output of driver 1010, a local latch 1030 receiving and latching an output of receiver & predecoder 1028, and a 3 state driver 1032 receiving an output of local latch 1030 and providing an output to decoder 1060 of the memory array.

A array circuit portion 1004 further includes receivers 1034, 1036 and 1038 receiving outputs of drivers 1022, 1024 and 1026, respectively, local latches 1040, 1042 and 1044 receiving and latching output of receivers 1034, 1036 and 1038, respectively, and 3 state drivers 1046, 1048 and 1050 receiving and providing to the memory array outputs of local latches 1040, 1042 and 1044, respectively. The output of 3 state driver 1032 is latched by latch 1052, and in accordance with the latched result, decoder 1060 activates main word line MWL. In accordance with the latched result of latch 1052, an SD decoder 1064 activates a segment decode line SD.

Output signals of 3 state drivers 1046 and 1048 are latched by latches 1054 and 1056, respectively, and in accordance with the latched results of latches 1054 an 1056, spare decoder 1062 activates a spare main word line SMWL.

The driver for transmitting the row address and signals related to redundancy substitution to the decoder portion is a 3 state driver. This is to enable disconnection of the output node after signal transmission to the array, so as to inactivate the power supply to the circuits preceding the 3 state driver.

The output signal of 3 state driver 1050 is latched by latch 1058. When the latched result of latch 1058 indicates that redundancy substitution is to be executed, decoder 1060 is inactivated and the main word line MWL on the normal array 1066 is not activated. At the time of self refresh, an address selecting signal is output from refresh control circuit 1070 and input to latches 1052, 1054, 1056 and 1058 to be input to the decoder and the spare decoder. At this time, as the circuits preceding the 3 state driver included in the normal operation system, that is, array circuit portion 1004 are turned off, and therefore power consumption can be reduced.

Figure 37:
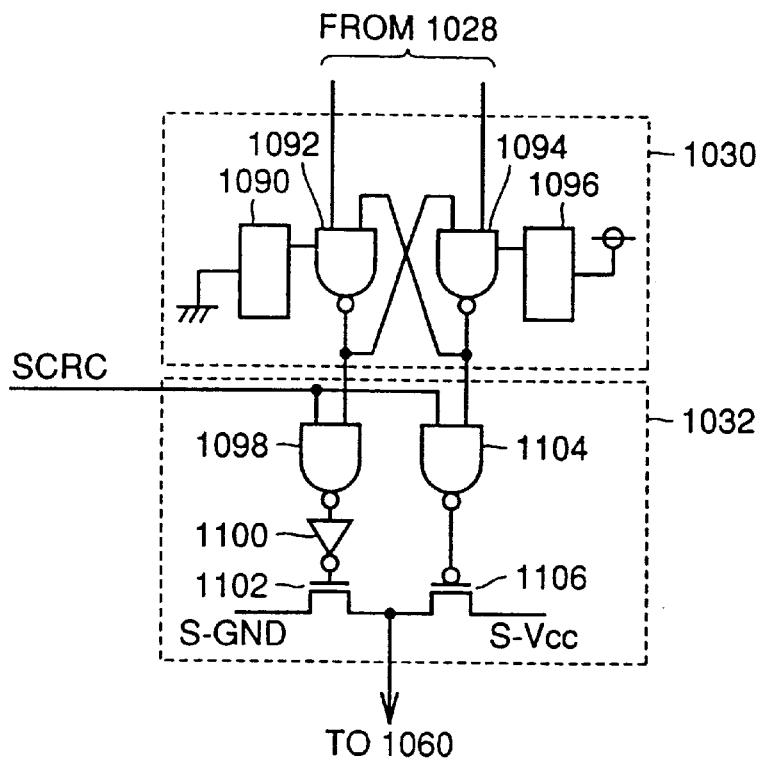
FIG. 37 is a circuit diagram illustrating configurations of a local latch 1030 and a 3-state driver 1032 shown in FIG. 36.

FIG. 37 is a circuit diagram related to the configuration of local latch 1030 and 3 state driver 1032 shown in FIG. 36.

Referring to FIG. 37, local latch 1030 includes NAND circuits 1092 and 1094 cross coupled to each other, a switching circuit 1090 for switching state of supply of the ground potential to the cross coupled NAND circuits 1092 and 1094, and a switching circuit 1096 for switching the state of supply of the power supply potential Vcc to NAND circuit 1092 and 1094.

More specifically, switching circuits 1090 and 1096 provide a hierarchical power supply.

Three state driver 1032 includes: an NAND circuit 1098 receiving at one input node the signal SCRC and at the other input node, one output signal from latch 1030; an NAND circuit 1104 receiving at one input node the signal SCRC and at the other input, the other output of latch 1030; an inverter 1100 receiving an output of NAND circuit 1098; an N channel MOS transistor 1102 having its gate potential controlled by an output of inverter 1100 and receiving at its source a hierarchical power supply potential S-GND; and a P channel MOS transistor 1106 receiving at its gate an output of NAND circuit 1104 and at its source a hierarchical power supply potential S-Vcc.

N channel MOS transistor 1102 has its drain connected to the drain of P channel MOS transistor 1106, and potential level of the connection node is the output potential of 3 state driver 1032. Though local latch 1030 and 3 state driver 1032 shown in FIG. 36 have the configuration of transmitting a plurality of data in parallel, FIG. 37 shows a configuration, as a representative, for transmitting 1 data.

Local latches 1040, 1042 and 1044 and 3 state drivers 1046, 1048 and 1050 shown in FIG. 36 have similar configurations as local latch 1030 and 3 state driver 1032 respectively. Therefore, description thereof is not repeated.

Figure 38:
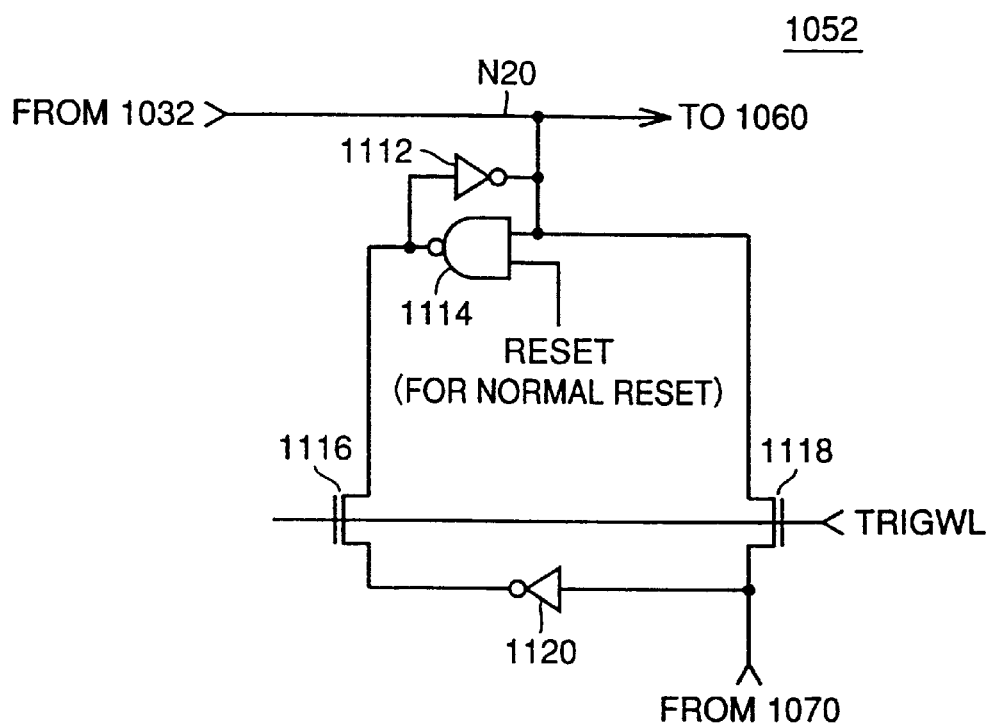
FIG. 38 is a circuit diagram showing a configuration of a latch 1052 shown in FIG. 36.

FIG. 38 is a circuit diagram showing a configuration of latch 1052 shown in FIG. 36.

Referring to FIG. 38, latch 1052 includes an NAND circuit 1114 having a first input node connected to a node N20 and a second input node connected to receive the reset signal RESET, and an inverter 1112 receiving an output of NAND circuit 1114 and providing an inverted output to node N20.

Node N20 is the node transmitting a signal from 3 state driver 1032 to decoder 1060 shown in FIG. 36. Therefore, at the time of normal reset, the reset signal RESET attains to the L level, initializes the data held in the latch, and the logic level of node N20 attains to the L level. When 3 state driver 1032 activates the output, the activated output is held by NAND circuit 1114 and inverter 1112.

Latch 1052 further includes: an N channel MOS transistor 1118 receiving at its gate a signal TRIGWL which is a trigger signal for activating a word line in self refreshing operation and transmitting an address output from a refresh control circuit 1070 to node N20; an inverter 1120 inverting an address output from refresh control circuit 1070; and an N channel MOS transistor 1116 receiving at its gate the signal TRIGWL for connecting an output of inverter 1120 to an input node of inverter 1112.

Therefore, when the signal TRIGWL attains to the H level and the output of 3 state buffer 1032 is inactive, the address output from refresh control circuit 1070 is held in a latch. Latches 1054, 1056 and 1058 shown in FIG. 36 have the similar structure as latch 1052, and therefore description thereof is not repeated.

Though not shown in FIG. 36, sense amplifier activating signal and the like related to the refreshing operation are also transmitted by the self refresh circuit 1070 and latched by the latch, similar to the address signal, and used in the array portion and the spare array portion, at the time of self refresh.

By this configuration in which an address is applied from a different system to the latch at the time of self refresh, it becomes possible to keep the power supply of array circuit portion 1004 off in the self refresh mode. Therefore, power consumption in the self refresh mode can be reduced.

Again referring to FIG. 36, in this configuration, the output of array circuit portion is latched by latches 1052, 1054 and 1056 provided at the input portion of decoder 1060 and spare decoder 1062. It is possible to position the latches closer to the decoder, and to provide a latch circuit at the output portion of the decoder. By such a configuration, it becomes possible to turn off the power supply of decoder 1060 in each array as well. In that case, word line selection can be controlled by connecting latches of the decoders as a master slave latch and by transmitting a control clock of the master slave latch from the control system at the time of self refresh.

Further, as a latch at a portion closer to the word line, a configuration may be possible in which the active state is maintained by the capacitance of the word line itself.

Figure 39:
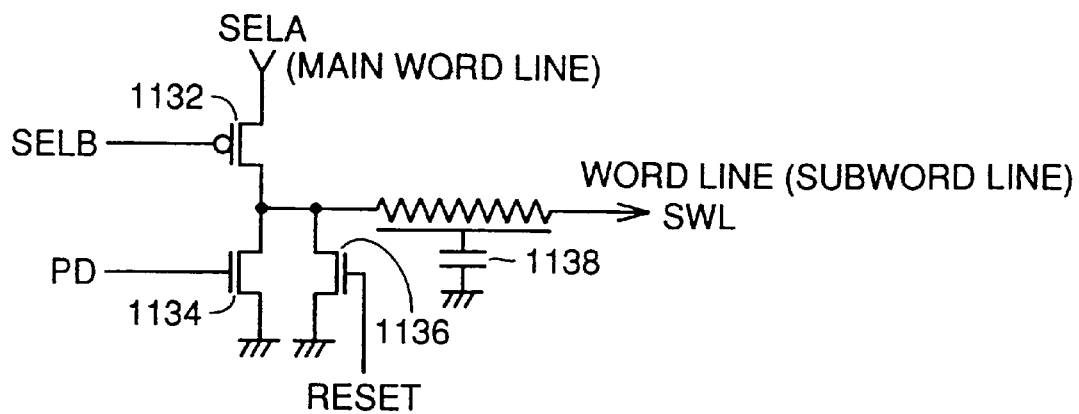
FIG. 39 is a circuit diagram showing a configuration in which capacitance of a word line itself is used to hold active state.

FIG. 39 is a circuit diagram showing a configuration in which the active state is maintained by the capacitance of the word line itself.

Referring to FIG. 39, the holding portion includes an N channel MOS transistor 1134 receiving at its gate a pull down signal PD, having its source coupled to the ground potential and its drain connected to a subword line (word line) SWL, a P channel MOS transistor 1132 receiving at its gate a selecting signal SELB and applying a selecting signal SELA applied from the main word line to the subword line SWL, and an N channel MOS transistor 1136 for applying the ground potential to the subword line SWL when the signal RESET is activated. Here, the subword line SWL has a large parasitic capacitance, as a large number of memory cells are normally connected thereto. Capacitance 1138 represents the parasitic capacitance.

Figure 40:
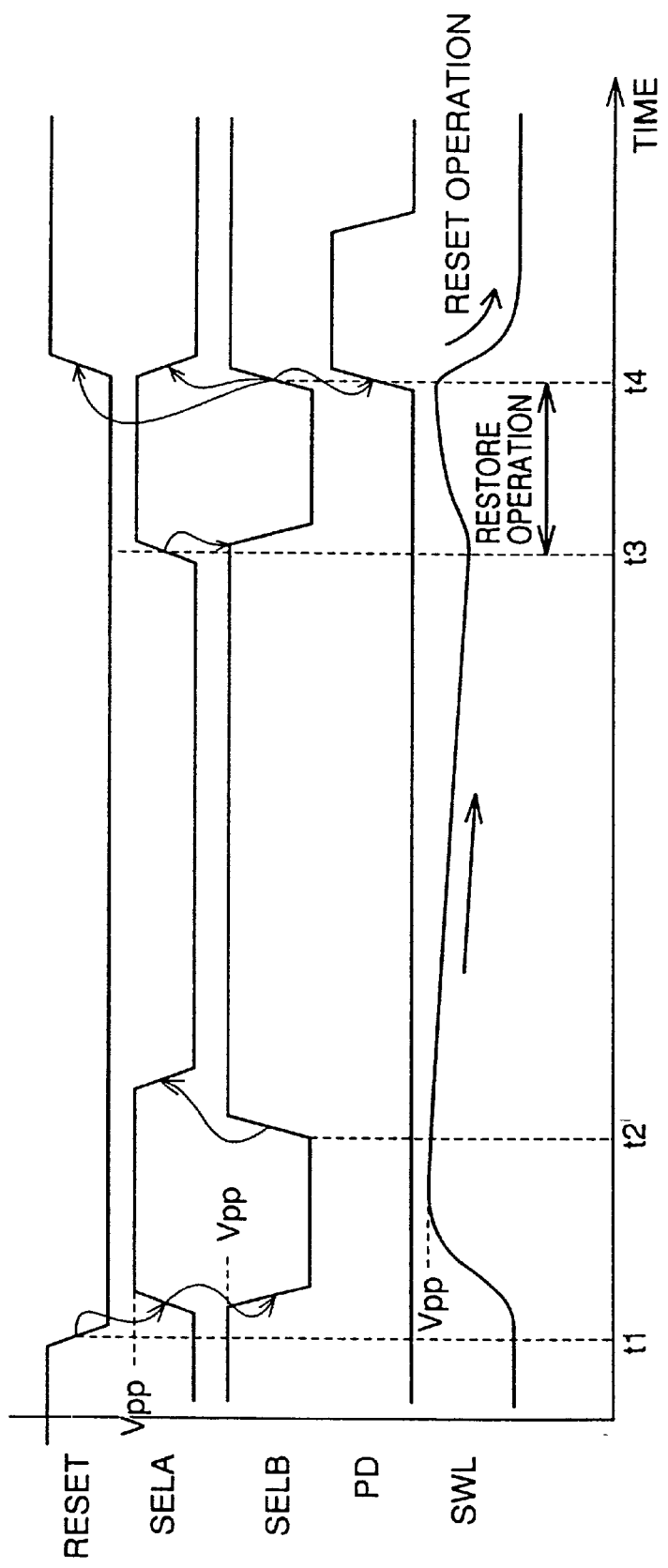
FIG. 40 is a diagram of waveforms illustrating an operation when the holding portion shown in FIG. 39 is utilized.

FIG. 40 is a diagram of waveforms representing the operation when the holding portion of FIG. 39 is used.

Referring to FIGS. 39 and 40, the reset signal which keeps the potential of the subword line SWL at the ground potential attains to the L level, and the reset state is canceled. Thereafter, in response to activation of the main word line, the selecting signal SELA rises from the L level to the H level. The H level is a boosted potential Vpp. When a selecting signal for selecting the subword line SWL is activated here, the potential of the selecting signal falls from the boosted potential Vpp to the L level. In response, the subword line SWL is supplied with the boosted potential from P channel MOS transistor 1132, so as to have the potential at boosted potential Vpp. After a prescribed time period, the selecting signal SELB rises, the selecting signal SELA falls and both are inactivated, so that P channel MOS transistor 1132 is rendered non-conductive.

By the parasitic capacitance 1138 mentioned above, the potential of subword line SWL is kept at the boosted potential Vpp The data of the memory cell is read from t1 to t2. When there is a leakage at subword line SWL, however, the H level potential thereof gradually lowers between time t2 to t3. Therefore, in the re-writing period after reading between t3 to t4, a sense amplifier operates, so that the potential of the word line is again raised to the boosted potential Vpp. When re-writing to the memory cell ends, the reset signal rises from the L level to the H level at time t4, and the subword line again falls to the reset state of L level.

Figure 41:
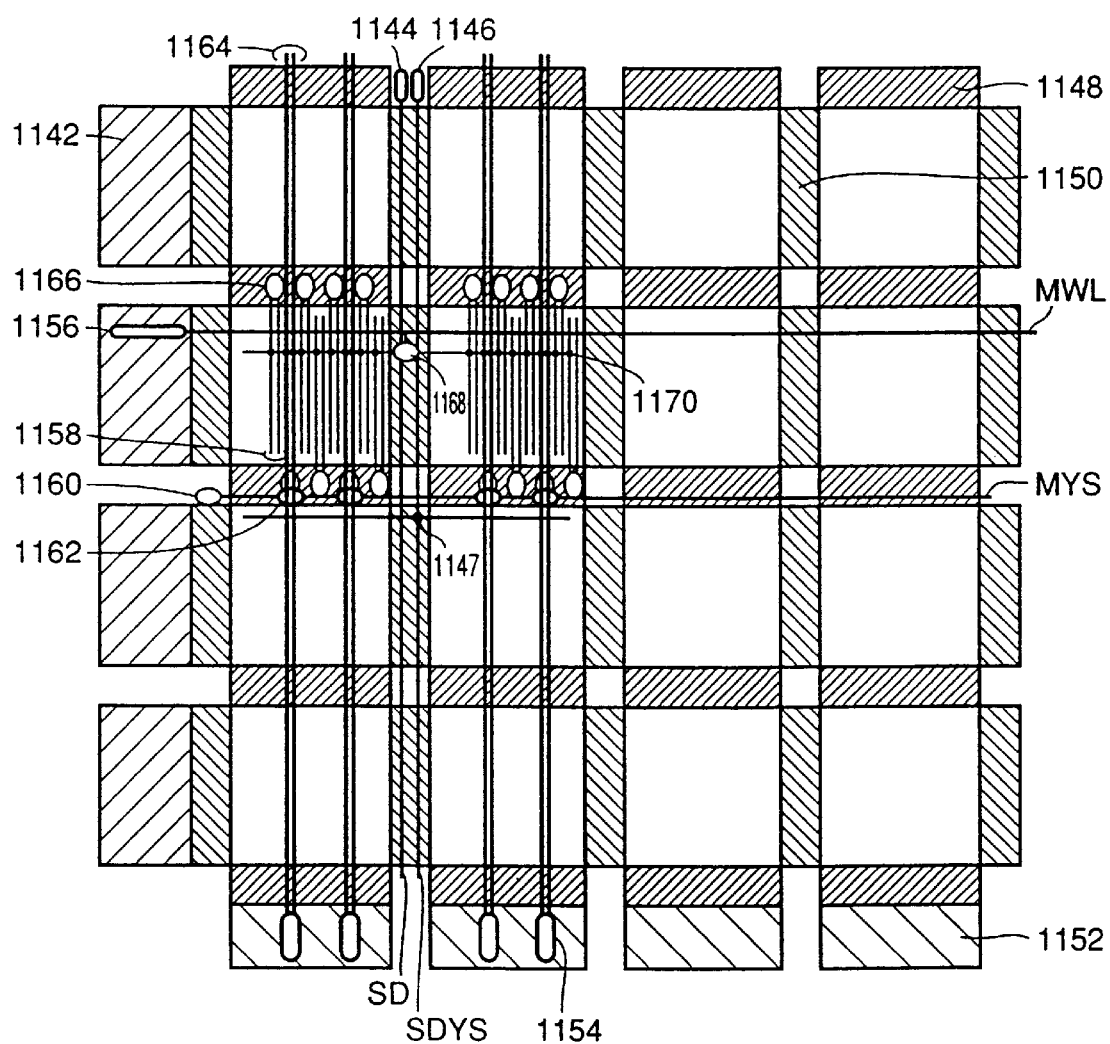
FIG. 41 is a schematic diagram related to the configuration of an array 1066 shown in FIG. 36.

FIG. 41 is a schematic diagram illustrating the configuration of array 1066 of FIG. 36.

Referring to FIG. 41, array 1066 includes memory mat arranged in 4 rows by 4 columns, main word drivers 1142 are provided corresponding to respective rows, and I/O selectors 1152 are provided corresponding respective columns. A sense amplifier 1148 and a subword driver 1150 are provided corresponding to each memory mat.

First, selecting operation in the column direction will be described. A main YS selecting signal MYS is activated by a driver 1160 and a segment decode YS selecting signal SDYS is activated by ah SDYS driver 1146. By these signals, sub YS signal SYS is activated, and an I/O line 1164 is activated by the corresponding I/O gate 1162.

The row related selecting operation will be described next. First, a main word line MWL is activated by a main word driver 1156. A segment decode line SD is activated by ah SD driver 1144. By the main word line MWL and the segment decode line SD, a corresponding subword driver 1168 is activated and, in response, a subword line 1170 is activated and an access transistor connected to the memory cell is rendered conductive. In response, data is output to the bit line pair 1158, and data amplified by a sense amplifier 1166 is externally read through I/O line 1164.

Figure 42:
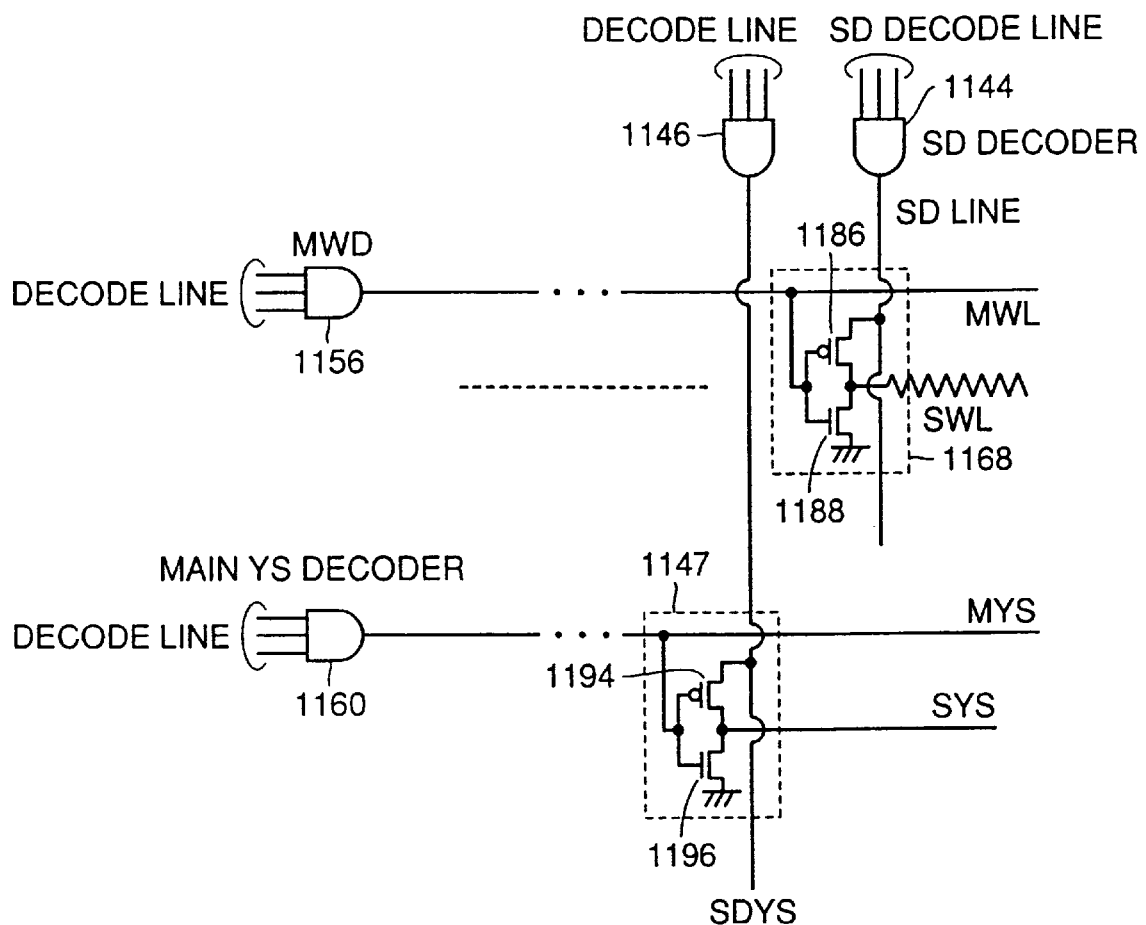
FIG. 42 is an illustration for further description of the selecting operation at an array portion shown in FIG. 41.

FIG. 42 is an illustration further related to the selecting operation at the array portion shown in FIG. 41.

Referring to FIG. 42, first, row selecting operation will be described. In array 1066, main word driver 1156 is provided for decoding a row address and driving the main word line MWL in accordance with the decoded result, and further SD decoder 1144 is provided connected to segment decode lines at its inputs for activating the segment decode line SD. At an intersection between the main word line MWL and the segment decode line SD, subword driver 1168 is provided.

Subword driver 1168 includes a P channel MOS transistor 1186 having its gate connected to main word line MWL, its source connected to the segment decode line SD and its drain connected to the subword line SWL, and an N channel MOS transistor 1188 having its gate connected to the main word line MWML, its source connected to the ground node and its drain connected to the subword line SWL.

Column selection will be described next.

There are main YS decoder 1160 for activating main YS signal MYS in accordance with the result of decoding of a column address, and SDYS driver 1146 provided for activating segment decode YS signal SDYS in accordance with the result of decoding of the segment decode line. At an intersection between the main YS signal MYS and the segment decode YS signal SDYS, sub YS driver 1147 is provided.

Sub YS driver 1147 includes a P channel MOS transistor 1194 having its source connected to segment decode YS signal SDYS and its gate connected to main YS signal MYS, and an N channel MOS transistor 1196 receiving at its gate the main YS signal MYS, having its source connected to the ground node and its drain connected to the drain of P channel MOS transistor 1194. The sub YS signal SYS is output from the drain of N channel MOS transistor 1196.

As described above, the word line and the selecting signal YS have configurations which are activated in two stages, respectively.

Figure 43:
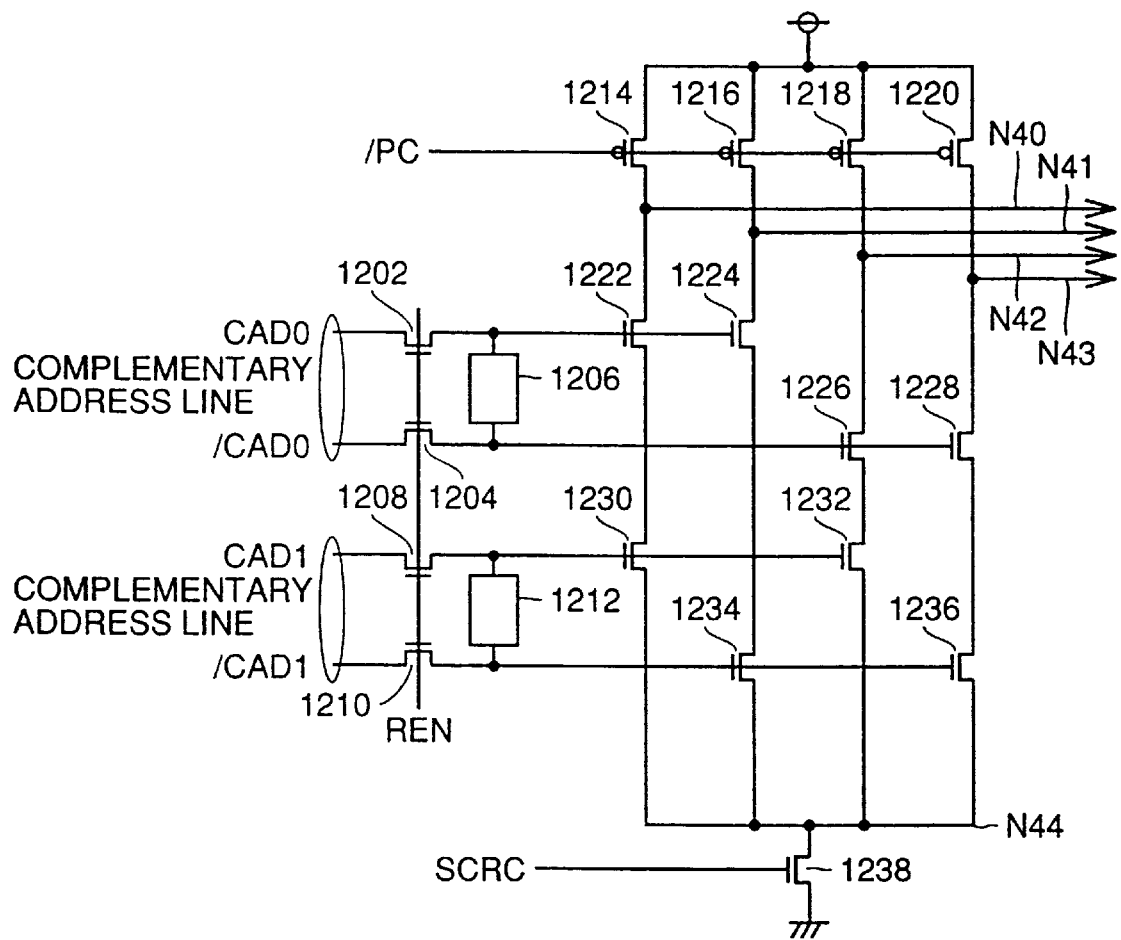
FIG. 43 is a circuit diagram showing a configuration of a receiver & predecoder 1028A, which is a first example of a receiver & predecoder 1028 shown in FIG. 36.

FIG. 43 is a circuit diagram showing a configuration of a receiver & predecoder 1028A as a first example of receiver & predecoder 1028 shown in FIG. 36.

Receiver & predecoder 1028A includes: gate circuits 1202 and 1204 taking in complementary address signals CAD0 and /CAD0 respectively when a latch enable signal REN is activated; a latch circuit 1206 for latching the complementary address signals taken by gate circuits 1202 and 1204; gate circuits 1208 and 1210 taking in complementary address signals CAD1 and /CAD1 when latch enable signal REN is active; and a latch circuit 1212 for latching the complementary address signals taken by gate circuits 1208 and 1210.

Receiver & predecoder 1028A further includes: P channel MOS transistors 1214, 1216, 1218 and 1220 receiving at their gates precharge signals /PC for precharging potentials of nodes N40, N41, N42 and N43 to the power supply potential respectively, when activated; N channel MOS transistors 1222 and 1230 connected in series between nodes N40 and N44; N channel MOS transistors 1224 and 1234 connected in series between nodes N41 and N44; N channel MOS transistors 1226 and 1232 connected in series between nodes N42 and N44; N channel MOS transistors 1228 and 1236 connected in series between nodes N43 and N44; and an N channel MOS transistor 1238 receiving at its gate the signal SCRC and connected between node N44 and the ground node. In order to reduce leakage current in the standby state, the threshold voltage value of the N channel MOS transistor 1238 should preferably be set higher than other transistors.

To the gates of N channel MOS transistors 1222 and 1224, address signal CAD0 taken by gate 1202 is applied. To the gates of both N channel MOS transistors 1226 and 1228, address signals /CAD0 taken by gate circuit 1204 is applied. To the gates of N channel MOS transistors 1230 and 1232, address signal CAD1 taken by gate circuit 1208 is applied. To the gates of N channel MOS transistors 1234 and 1236, address signals /CAD1 taken by gate circuit 1210 is applied.

Figure 44:
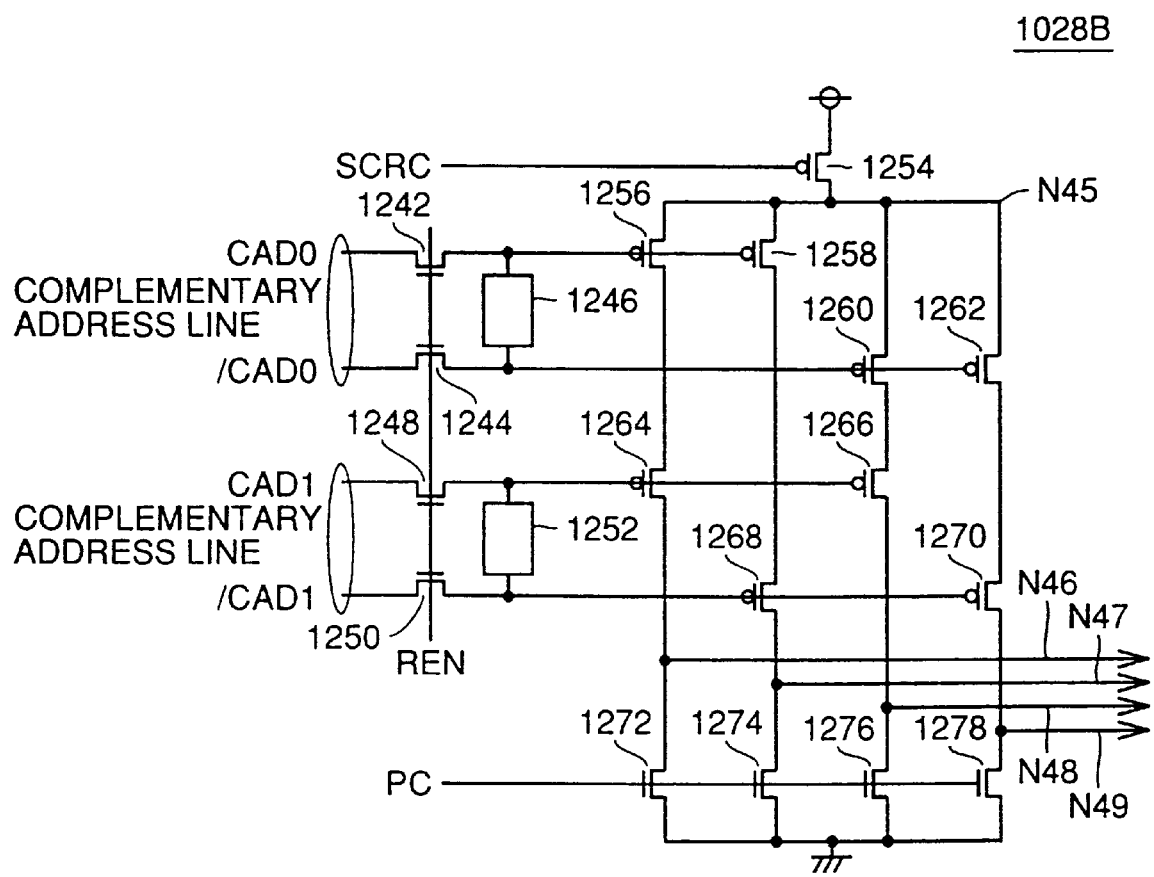
FIG. 44 is a circuit diagram showing a configuration of a receiver & predecoder 1028B, which is a second example of a receiver & predecoder 1028 shown in FIG. 36

FIG. 44 is a circuit diagram showing a configuration of a receiver & predecoder 1028B as a second example of receiver & predecoder 1028 shown in FIG. 36.

Referring to FIG. 44, receiver & predecoder 1028B includes: gate circuits 1242 and 1244 taking in complementary address signals CAD0 and /CAD0 when latch enable signal REN is active; a latch circuit 1246 for latching the complementary address signals taken by gate circuits 1242 and 1244; gate circuits 1248 and 1250 taking complementary address signals CAD1 and /CAD1 when latch enable signal REN is active; and a latch circuit 1252 for latching complementary address signals taken by gate circuits 1248 and 1250.

Receiver & predecoder 1028B further includes: N channel MOS transistors 1272, 1274, 1276 and 1278 receiving at their gates the precharge signal PC and precharging potentials of nodes N46, N47, N48 and N49 to the ground potential, respectively; P channel MOS transistors 1256 and 1264 connected in series between nodes N45 and N46; P channel MOS transistors 1258 and 1268 connected in series between nodes N45 and N47; P channel MOS transistors 1260 and 1266 connected in series between nodes N45 and N48; P channel MOS transistors 1262 and 1270 connected in series between nodes N45 and N49; and a P channel MOS transistor 1254 receiving at its gate the signal SCRC and connected between node N45 and a power supply node. In order to reduce leakage current in the standby state, the threshold voltage of P channel MOS transistor 1254 should preferably be set higher than other transistors.

To the gates of P channel MOS transistors 1256 and 1258, the address signal CAD0 taken by gate 1242 is applied. To the gates of P channel MOS transistors 1260 and 1262, address signals /CAD0 taken by gate circuit 1244 is applied. To the gates of P channel MOS transistors 1264 and 1266, address signal CAD1 taken by gate circuit 1248 is applied. To the gates of P channel MOS transistors 1268 and 1270, address signal /CAD1 taken by taken by gate circuit 1250 is applied.

Operations of receiver & predecoders 1028A and 1028B shown in FIGS. 43 and 44 will be described briefly. First, referring to FIG. 43, in the standby state, precharge signal /PC is at the L level, and complementary address signals CAD0, /CAD0, CAD1 and ICAD1 are all at the L level. Therefore, nodes N40 to N43 are precharged to the H level. At this time, N channel MOS transistors 1222 to 1236 are all non-conductive. In order to prevent leakage current derived from these transistors, however, the signal SCRC is also set to the L level, and N channel MOS transistor 1238 is rendered non-conductive to prevent leakage current.

Thereafter, at the end of precharge period, the precharge signal /PC is set to the H level. An address signal is actually input to the complementary address signals which have been all at the L level, and any of the complementary address signals attains to the L level. At this time, the signal SCRC is set to the H level, predecoding in accordance with the complementary address is executed, and that one of the nodes N40 to N43 of which two N channel MOS transistors provided between itself and node N44 are conductive attains to the L level. Decoding operation is performed in this manner.

The operation of the circuitry shown in FIG. 44 is similar to that of FIG. 43 except that the precharge is at the L level. In the receiver & predecoder 1028B shown in FIG. 44, the output node is set to the L level when precharged, and of the output nodes, corresponding one node is set to the H level by the decoding operation.

In the conventional semiconductor memory device, it has been convenient to provide a predecoder utilizing an CMOS circuit, as the address signal is input to the predecoder with full swing.

Along with the improved speed of operation of the semiconductor memory device, however, the address signal comes to have smaller amplitude and it becomes necessary to attain higher speed of operation with lower voltage. In such situation, a precharge type predecoder such as shown in FIG. 43 or 44 is advantageous. The address signal with small amplitude input from the complementary address line is latched by the latch and its amplitude amplified. In the precharge type predecoder, the decoder operates even when the amplitude of the address signal is still small. More specifically, it is possible for the decoder to complete signal processing after completion of latch operation and to provide the result.

Figure 45:
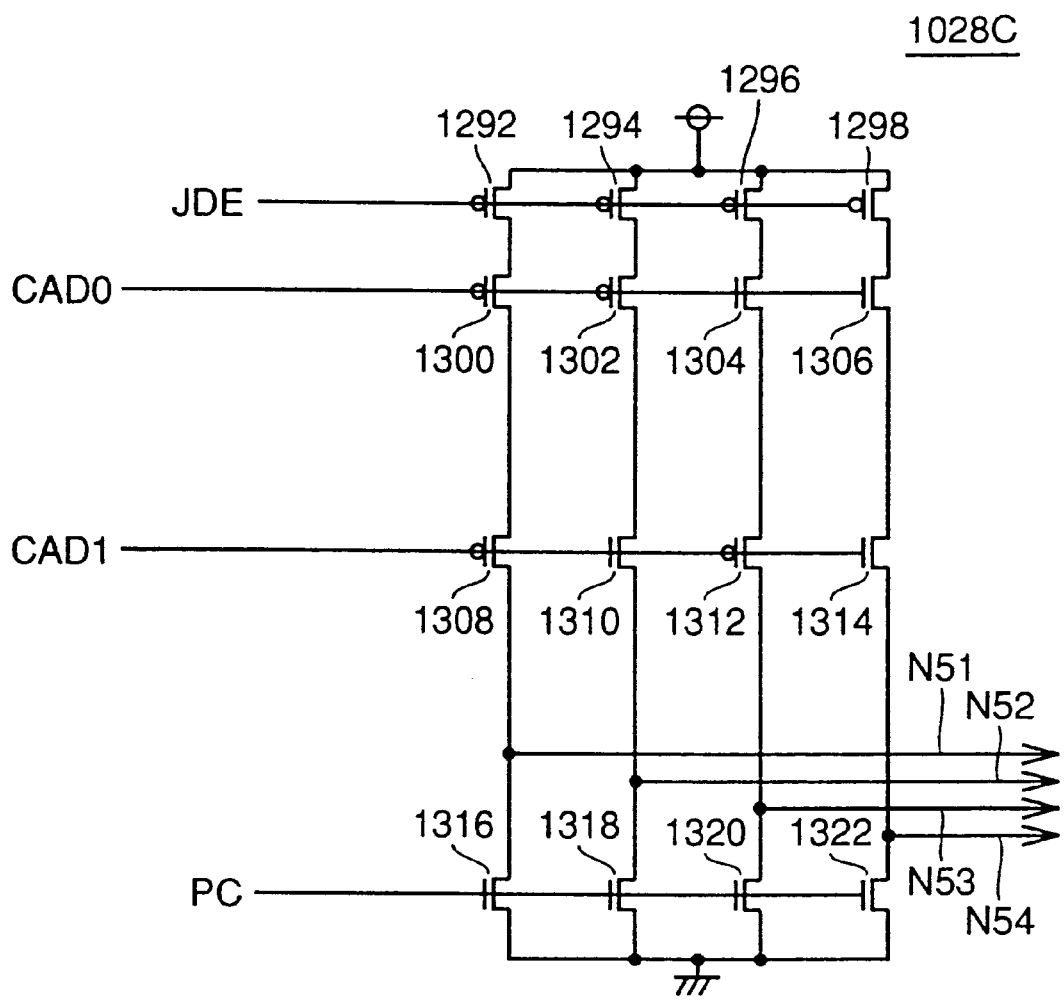
FIG. 45 is a circuit diagram showing a configuration of a receiver & predecoder 1028C, which is a third example of receiver & predecoder 1028 shown in FIG. 36.

FIG. 45 is a circuit diagram showing a configuration of a receiver & predecoder 1028C as a third example of receiver & predecoder 1028 shown in FIG. 36.

Referring to FIG. 45, receiver & predecoder 1028C is an example of a predecoder using a single address, not complementary addresses.

Receiver & predecoder 1028C includes: P channel MOS transistors 1092 to 1098 having their gates connected to a determination line JDE and sources connected to a power supply node; P channel MOS transistors 1300 and 1308 connected in series between the drain of P channel MOS transistor 1292 and a node N51 and receiving at their gates address signals CAD0 and CAD 1 respectively; a P channel MOS transistor 1302 receiving at its gate the address signal CAD0 and having its source connected to the drain of P channel MOS transistor 1294; and an N channel MOS transistor 1310 connected between the drain of P channel MOS transistor 1302 and a node N52 and receiving at its gate the address signal CAD1.

Receiver & predecoder 1028C further includes: an N channel MOS transistor 1304 having its drain connected to the drain of P channel MOS transistor 1296 and receiving at its gate the address signal CAD0; a P channel MOS transistor 1312 connected between the drain of N channel MOS transistor 1304 and a node N53 and receiving at its gate the address signal CAD1; and N channel MOS transistors 1306 and 1314 connected in series between the drain of P channel MOS transistor 1298 and a node N54 and receiving at their gates the address signals CAD0 and CAD1, respectively.

Receiver & predecoder 1028C further includes N channel MOS transistors 1316, 1318, 1320 and 1322 receiving at their gates the precharge signal PC and applying the ground potential to nodes N51, N52, N53 and N54, respectively, when activated.

Results of predecoding corresponding to the address signal are output from nodes N51 to N54.

By using P channel MOS transistors and N channel MOS transistors mixed at the decoder portion, it becomes unnecessary that the input address includes complementary address signals.

It should be noted here that when the input address is applied as complementary signals, it is possible to set the predecoder in the standby state by rendering non-conductive the transistors connected to the complementary signals. In case of single address input, however, the standby state cannot be attained by the setting of the address. Therefore, P channel MOS transistors 1292 to 1298 having their gates connected to the determination line JDE are provided as switches for determination.

By setting the switch to the non-conductive state, leakage current in the standby state can also be reduced. In order to reduce leakage current in the standby state, threshold values of P channel MOS transistors 1292 to 1298 should desirably be set higher than other transistors.

Figure 46:
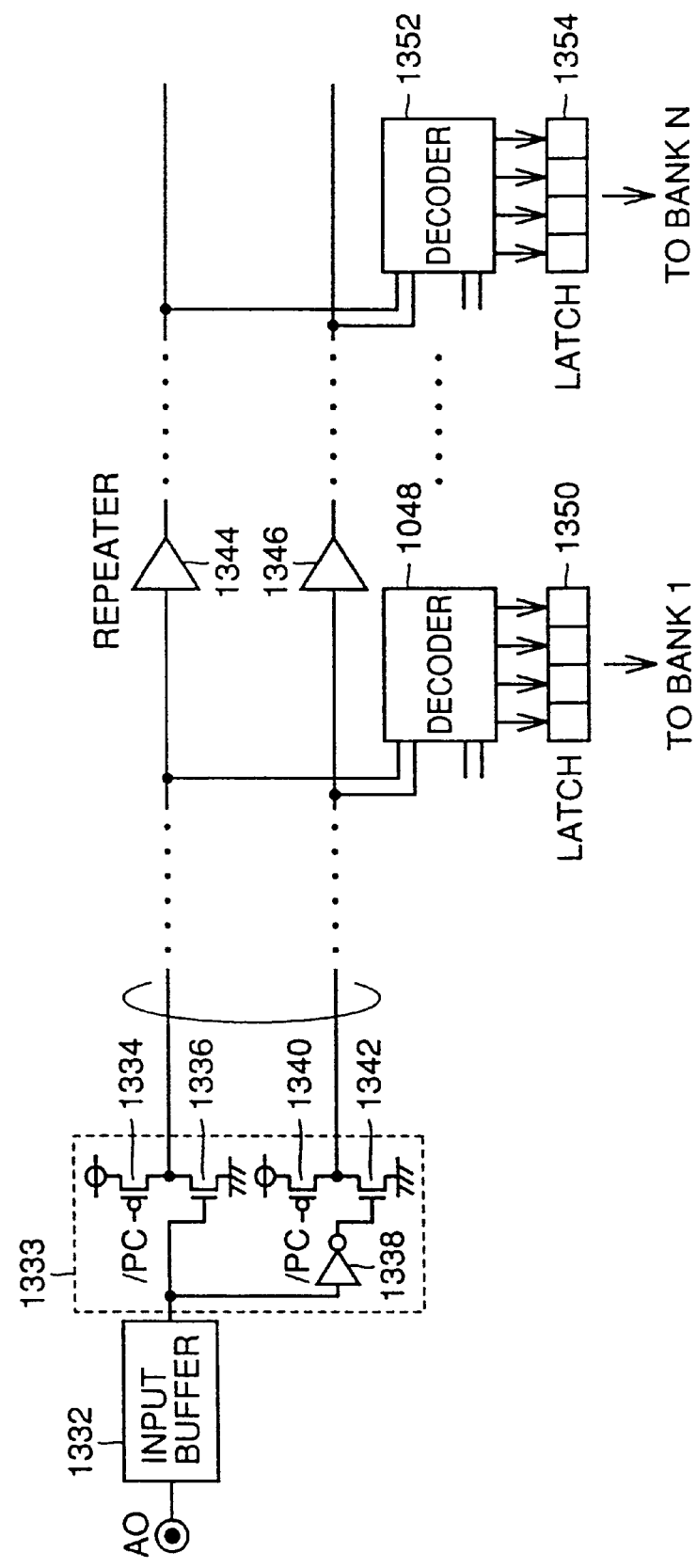
FIG. 46 is a schematic block diagram illustrating an operation where an address is applied from a terminal through a predecoder to each bank.

FIG. 46 is a schematic block diagram representing an operation where an address is applied from a terminal through the predecoder to each bank.

Referring to FIG. 46, an address signal AO input from a terminal is applied to an input buffer 1332, an output of input buffer 1332 is passed to a drive circuit 1333 and provided as complementary address signals to decoder 1048. Decoder 1048 is a precharge type decoder, and therefore it is operable even when the address has small amplitude, and the result of operation can be latched by latch 1350.

The complementary addresses are transmitted to further bank N through repeaters 1344 and 1346, and to the bank N, the result of decoding by decoder 1352 latched by latch 1354 is applied.

Drive circuit 1333 includes: an inverter 1338 receiving and inverting an output of input buffer 1332; an N channel MOS transistor 1342 receiving at its gate an output of inverter 1338 and having its source connected to the ground node; and a P channel MOS transistor 1340 receiving at its gate the precharge signal /PC and having its source connected to the power supply node and its drain connected to the drain of N channel MOS transistor 1342.

Drive circuit 1333 further includes: an N channel MOS transistor 1336 receiving at its gate an output of input buffer 1332 and having its source connected to the ground node; and a P channel MOS transistor 1334 receiving at its gate the precharge signal /PC and having its source connected to the power supply node and its drain connected to the drain of N channel MOS transistor 1336. Complementary address signals are output from the drains of N channel MOS transistors 1336 and 1342.

Figure 47:
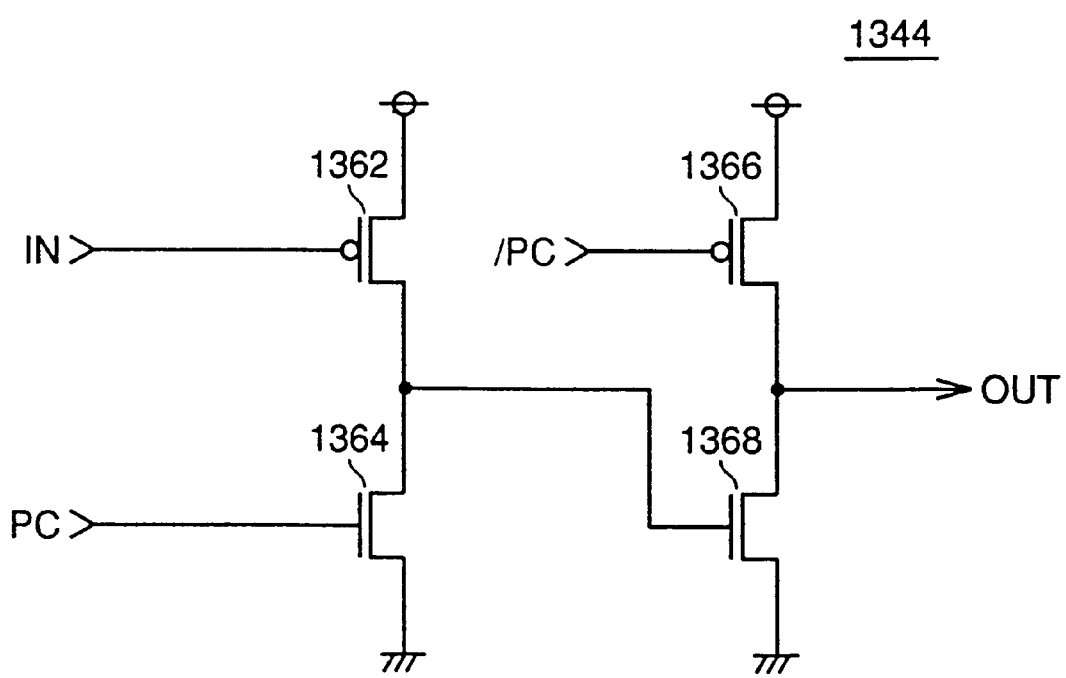
FIG. 47 is a circuit diagram showing a configuration of a repeater 1344.

FIG. 47 is a circuit diagram showing a configuration of repeater 1344.

Referring to FIG. 47, repeater 1344 includes: a P channel MOS transistor 1362 receiving at its gate an input signal IN and having its source connected to the power supply node; an N channel MOS transistor 1364 connected between the drain of P channel MOS transistor 1362 and the ground node and receiving at its gate the precharge signal PC; an N channel MOS transistor 1368 receiving at its gate the potential of the drain of P channel MOS transistor 1362 and having its source connected to the ground node; and a P channel MOS transistor 1366 connected between the drain of N channel MOS transistor 1368 and the power supply node and receiving at its gate the precharge signal /PC. An output signal OUT is provided from the drain of N channel MOS transistor 1368. By such a precharge type repeater, it becomes possible to transmit the complementary address signals to a far bank.

By the above described configuration, in the synchronous semiconductor memory device of the fourth embodiment, by the time the address is transmitted through the address bus, necessary address conversion and redundancy determination processings are completed. Therefore, the timing at which the data corresponding to the array is passed from the array circuit portion to the array can be made earlier.

Further, as the precharge type decoder is employed, the processing at the array circuit portion itself can be done at a higher speed.

Accordingly, the speed of operation of the synchronous semiconductor memory device can be improved.

Fifth Embodiment

Figure 48:
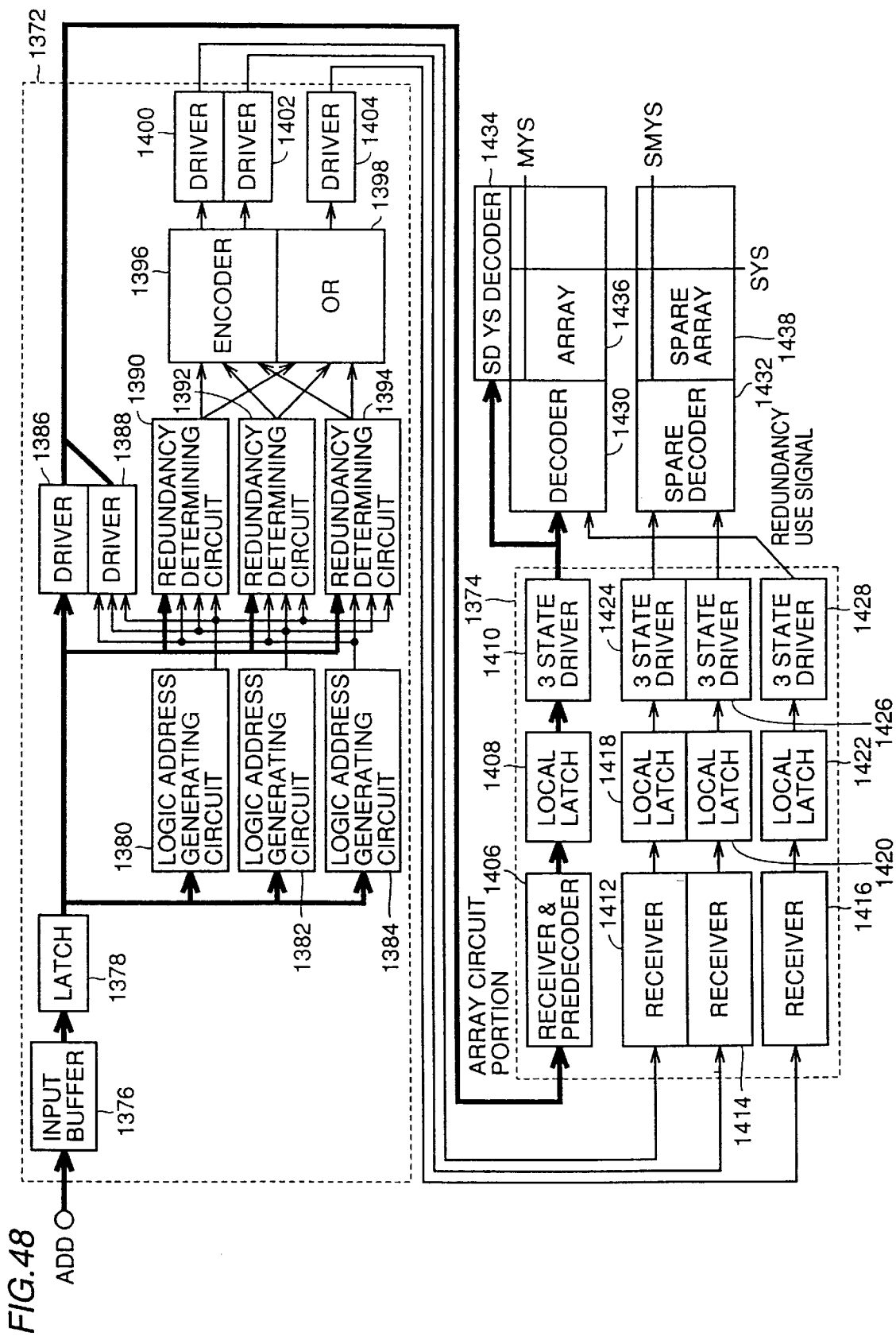
FIG. 48 is a block diagram related to address transmission in a synchronous semiconductor device in accordance with a fifth embodiment.

FIG. 48 is a block diagram related to address transmission in the synchronous semiconductor device in accordance with the fifth embodiment.

Similar concept is applied to column related address transmission in the fifth embodiment.

Referring to FIG. 48, an address signal is input to a central circuit portion 1372 and subjected to prescribe processings. The output from the central circuit portion 1372 is transmitted to and latched by an array circuit portion 1374 provided corresponding to each array. Array circuit portion 1374 provides the latched data to the array.

Central circuit portion 1372 includes: an input buffer 1376 receiving the address signal; a latch 1378 receiving an output from input buffer 1376; logic address generating circuits 1380, 1382 and 1384 receiving lower bits of the output of latch 1378 related to burst address generation; a driver 1386 receiving higher bits of the address not subjected to burst address conversion of the output of latch 1378; and a driver 1388 receiving address converted address data from address generating circuits 1380, 1382 and 1384.

The burst address generation will be described. A leading address is applied externally. Thereafter, addresses to be accessed continuously following the leading address are generated internally. At this time, if the burst length is 4, 3 addresses following the leading address are generated. The generated addresses will be referred to as the first, second and third addresses in the order of accessing.

Logic address generating circuits 1380, 1382 and 1384 receive an address output from latch 1378 and generate the first, second and third addresses, respectively. These addresses and the leading address are common in higher bits and different in some lower bits. The number of common bits differ dependent on the burst length. The higher bits which are common are input to driver 1386.

Central circuit portion 1372 further includes: redundancy determining circuits 1390 to 1394 receiving from latch 1378 the portions of the address not subjected to address conversion and receiving from address generating circuits 1380 to 1384 the address converted lower bits of the address; an encoder 1396 encoding results of outputs from redundancy determining circuits 1390 to 1394; drivers 1400 and 1402 for transmitting an output of encoder 1396 to the array circuit portion; an OR circuit 1398 receiving outputs from redundancy determining circuits 1390 to 1394; and a driver 1404 for transmitting an output of OR circuit 1398 to the array circuit portion.

Array circuit portion 1374 includes a receiver & predecoder 1406 receiving and decoding a column address when redundancy substitution is not performed, from the central circuit portion, a local latch 1408 receiving an output of receiver & predecoder 1406, and a 3 state driver 1410 receiving an output of local latch 1408 and transmitting the received output to the array.

Array circuit portion 1374 further includes receivers 1412, 1414 and 1416 receiving outputs of drivers 1400, 1402 and 1404, respectively, local latches 1418, 1420 and 1422 latching data received by receivers 1412, 1414 and 1416, respectively, and 3 state drivers 1424, 1426 and 1428 for outputting the data latched by local latches 1418, 1420 and 1422 to the array portion.

Three state driver 1410 outputs the received data to a decoder 1430 and an SDYS decoder 1434 of the array portion. In response, decoder 1430 activates the main selecting signal MYS, and SDYS decoder 1434, in response, activates the subselecting signal SYS. Three state drivers 1424 and 1426 provide an activating signal to a spare decoder 1432. In response, spare decoder 1432 decodes the activating signal and activates the spare selecting signal SMYS. Three state driver 1428 outputs a redundancy use signal indicating that the spare array is to be used, to decoder 1430. By this redundancy use signal, decoder 1430 is inactivated.

Figure 49:
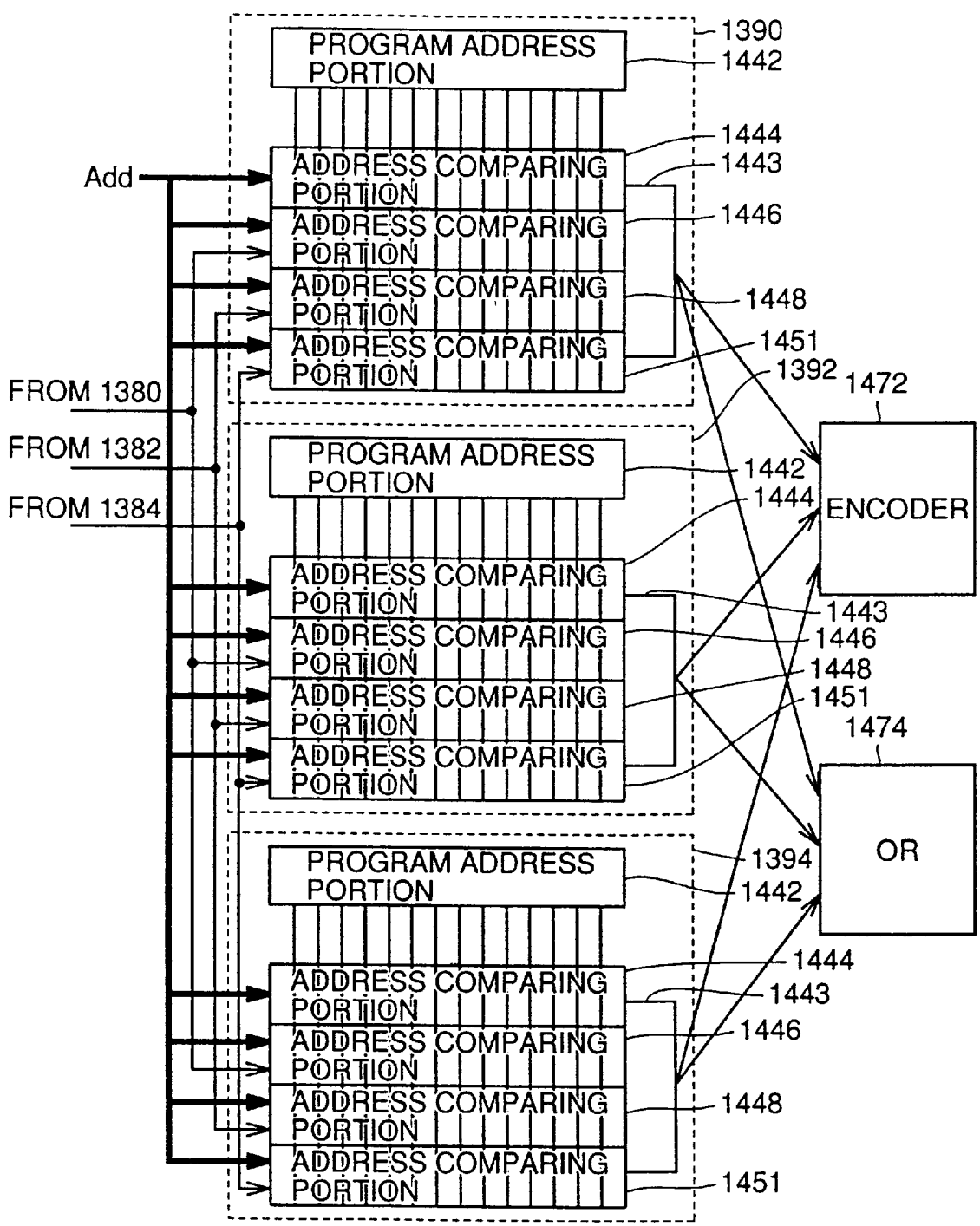
FIG. 49 is a block diagram illustrating configurations of redundancy determining circuits 1390 to 1394 shown in FIG. 48.

FIG. 49 is a block diagram showing configuration of the redundancy determining circuits 1390 to 1394 shown in FIG. 48.

Redundancy determining circuit 1390 includes a program address portion 1442 at which a substitution address for substituting a spare array for a normal array is set, address comparing portions 1444, 1446, 1448 and 1450 for detecting whether an address input upon reception of a signal corresponding to the substitution address set in program address portion 1442 matches the substitution address, and a select gate portion 1443 receiving output from address comparing portions 1444, 1446, 1448 and 1450 and outputting any one of the output signals to encoder 1472.

Address comparing portion 1444 compares the leading address ADD of the input burst address (not subjected to address conversion) with an address set in the program address portion 1442. Address comparing portions 1446, 1448 and 1450 compare the higher fixed address bits of the input address ADD which are not subjected to conversion, with the corresponding bits of the substitution address set in the program address portion 1442. At the same time, address comparing portion 1446 receives the converted first address from logic address generating circuit 1380 and compares the received address with the setting of the corresponding bit of the substitution address. Address comparing portion 1448 receives the converted second address from logic address generating circuit 1382 and compares with the setting of the corresponding bit of the substitution address. Address comparing portion 1450 receives the converted third address from logic address generating circuit 1384 and compares with the setting of the corresponding bit of the substitution address.

Output signals from address comparing portions 1444, 1446, 1448 and 1450 are input to select gate portion 1443, a corresponding output signal is selected in accordance with the progress of the burst cycle, and input to encoder 1472 and OR circuit 1474.

Redundancy determining circuits 1392 and 1394 have similar configuration as redundancy determining circuit 1390, except that different addresses are set in the program address portions, respectively.

Though an address conversion for burst address generation has been described with reference to FIGS. 48 and 49, the same configuration can be utilized when address conversion for other purpose is necessary. Therefore, the address conversion is not limited to redundancy determination with respect to the burst address.

Figure 50:
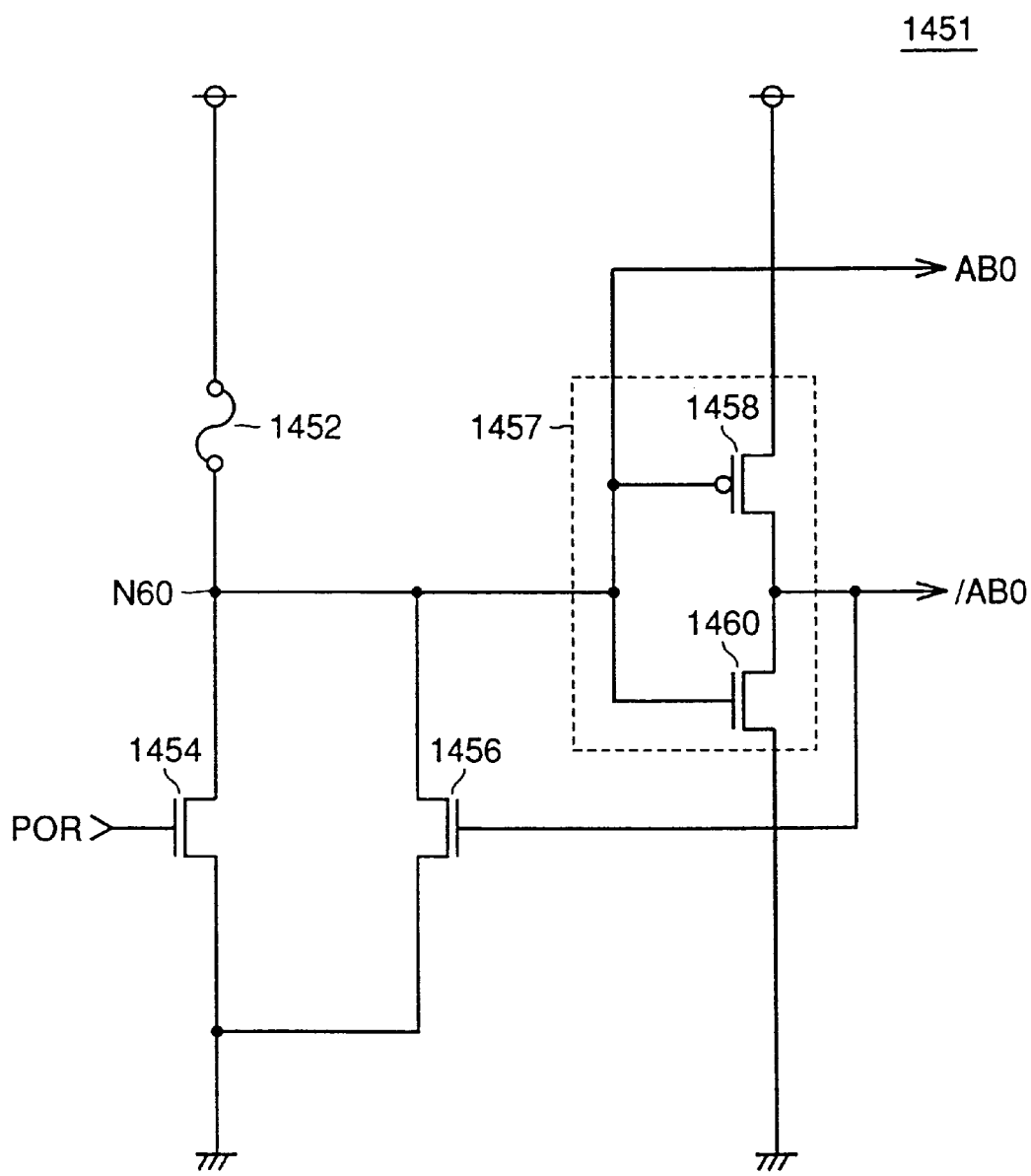
FIG. 50 is a circuit diagram showing a configuration of a setting portion 1450 per 1 bit of an address of a program address portion 1442 shown in FIG. 48.

FIG. 50 is a circuit diagram showing a configuration of the setting portion 1451 per 1 bit of address included in program address portion 1442 of FIG. 49

Referring to FIG. 50, setting portion 1451 includes: an N channel MOS transistor 1454 receiving at its gate a reset signal POR which attains to the H level at the time of power on for initializing setting portion 1451, and connected between the ground node and a node N60; a fuse element 1452 connected between node N60 and the power supply node; an inverter 1457 inverting logic level of node N60 and providing a signal /AB0; and an N channel MOS transistor 1456 receiving at its gate the signal /AB0 and connected between node N60 and the ground node. The signal AB0 is output from node N60.

Inverter 1457 includes a P channel MOS transistor 1458 having its gate connected to node N60 and its source connected to the power supply node, and an N channel MOS transistor 1460 having its gate connected to node N60 and its source connected to the ground node. N channel MOS transistor 1460 has its drain connected to the drain of P channel MOS transistor 1458, and the signal /AB0 is output from the drain of N channel MOS transistor 1460.

DESCRIPTION OF THE PREFERRED EMBODIMENTS

Therefore, when fuse element 1452 is conductive, signals AB and /AB are at the H level and L level, respectively, and when fuse element 1452 is blown off and non-conductive, signals AB and /AB are at the L level and H level, respectively.

Fuse element 1452 is selectively blown off by a laser beam, for example, for setting an address corresponding to the presence of the defective memory cell. Though a fuse element is used for setting in the example shown in FIG. 50, a configuration where a non volatile memory cell storing data electrically may be used.

Figure 51:
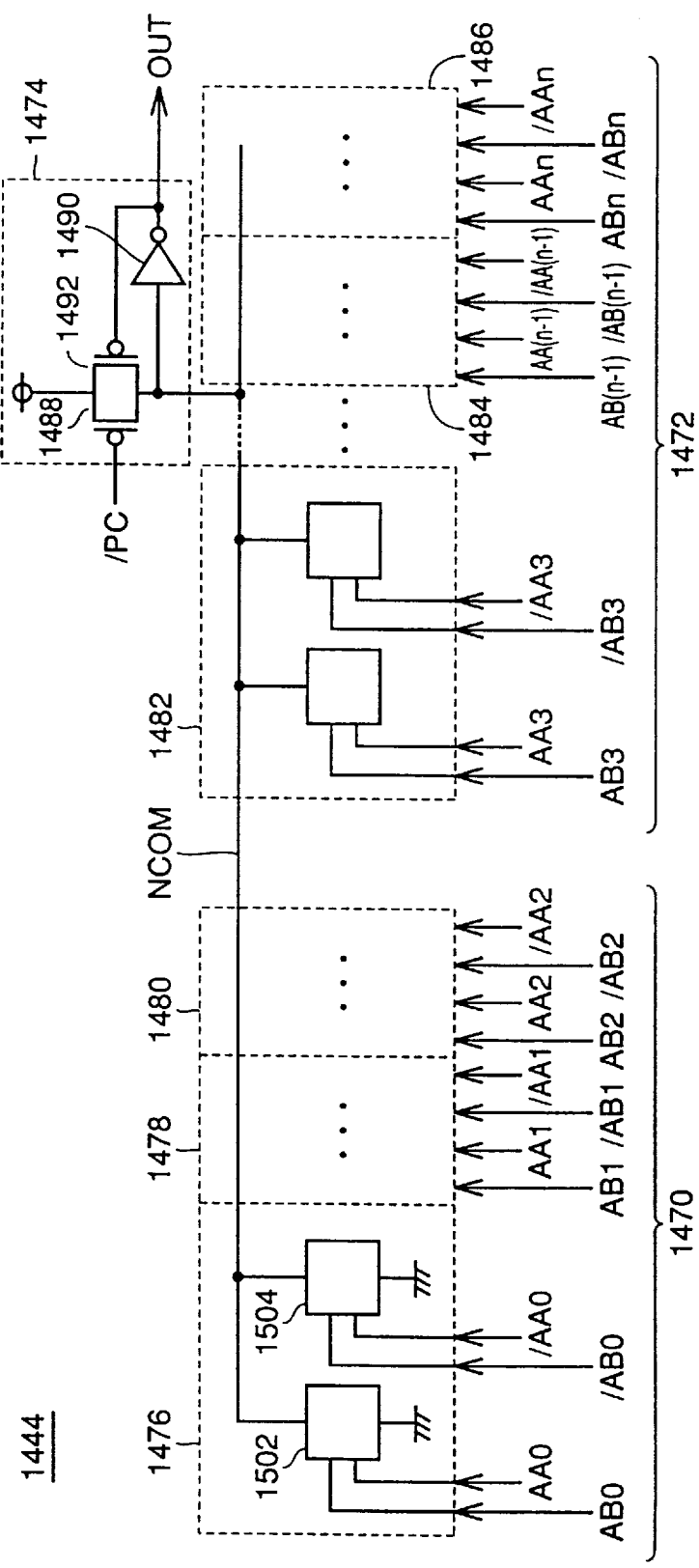
FIG. 51 is a block diagram showing a configuration of an address comparing portion 1444 of FIG. 49.

FIG. 51 is a block diagram showing a configuration of address comparing portion 1444 shown in FIG. 49.

Referring to FIG. 51, address comparing portion 1444 includes: a converted address comparing portion 1470 comparing lower bits converted for address processing such as burst with the corresponding bits of the substitution address; a fixed address comparing portion 1472 for comparing non-converted higher bits and corresponding bits of the substitution address; and a precharge portion 1474 for precharging a common node NCOM provided common to the converted address comparing portion 1470 and fixed address comparing portion 1472 and inverting and inverting and outputting the logic level of common node NCOM.

Converted address comparing portion 1470 includes: a bit comparing portion 1476 comparing complementary signals AA0 and /AA0 of the least significant bit of the address signal with corresponding substitution address signals AB0 and /AB0; a bit comparing portion 1478 comparing complementary signals AA1 and /AA1 of the second least significant bit of the address signal with the corresponding substitution address signals AB1 and /AB1; and a bit comparing portion 1480 comparing complementary signals AA2 and /AA2 of the third least significant bit of the address signal with corresponding substitution address signals AB2 and /AB2.

Fixed address comparing portion 1472 includes: a bit comparing portion 1482 comparing complementary signals AA3 and /AA3 of the fourth least significant bit of the address signal with the corresponding substitution address signals AB3 and /AB3; a bit comparing portion 1484 comparing complementary signals AA (n−1) and /AA (n−1) of nth least significant bit of the address signal with the corresponding substitution address signals AB (n−1) and /AB (n−1); and a bit comparing portion 1486 comparing complementary signals AAn and /AAn of the n+1th least significant bit of the address with corresponding substitution address signals ABn and /ABn.

Here, n is a natural number determined by the number of bits of the address. Though a configuration in which lower 3 bits are input to the converted address comparing portion 1470 has been described, the number of bits is appropriately increased/decreased dependent on the burst length or the like.

Precharge portion 1474 includes a P channel MOS transistor 1488 connected between a power supply node and the common node NCOM and receiving at its gate the precharge signal /PC, an inverter 1490 inverting the logic level of common node NCOM and providing the inverted level as the signal OUT, and a P channel MOS transistor 1492 receiving at its gate the signal OUT, connected between the power supply node and the common node NCOM.

Address comparing portions 1446, 1448 and 1450 of FIG. 49 have similar configuration, and therefore description thereof is not repeated.

Figure 52:
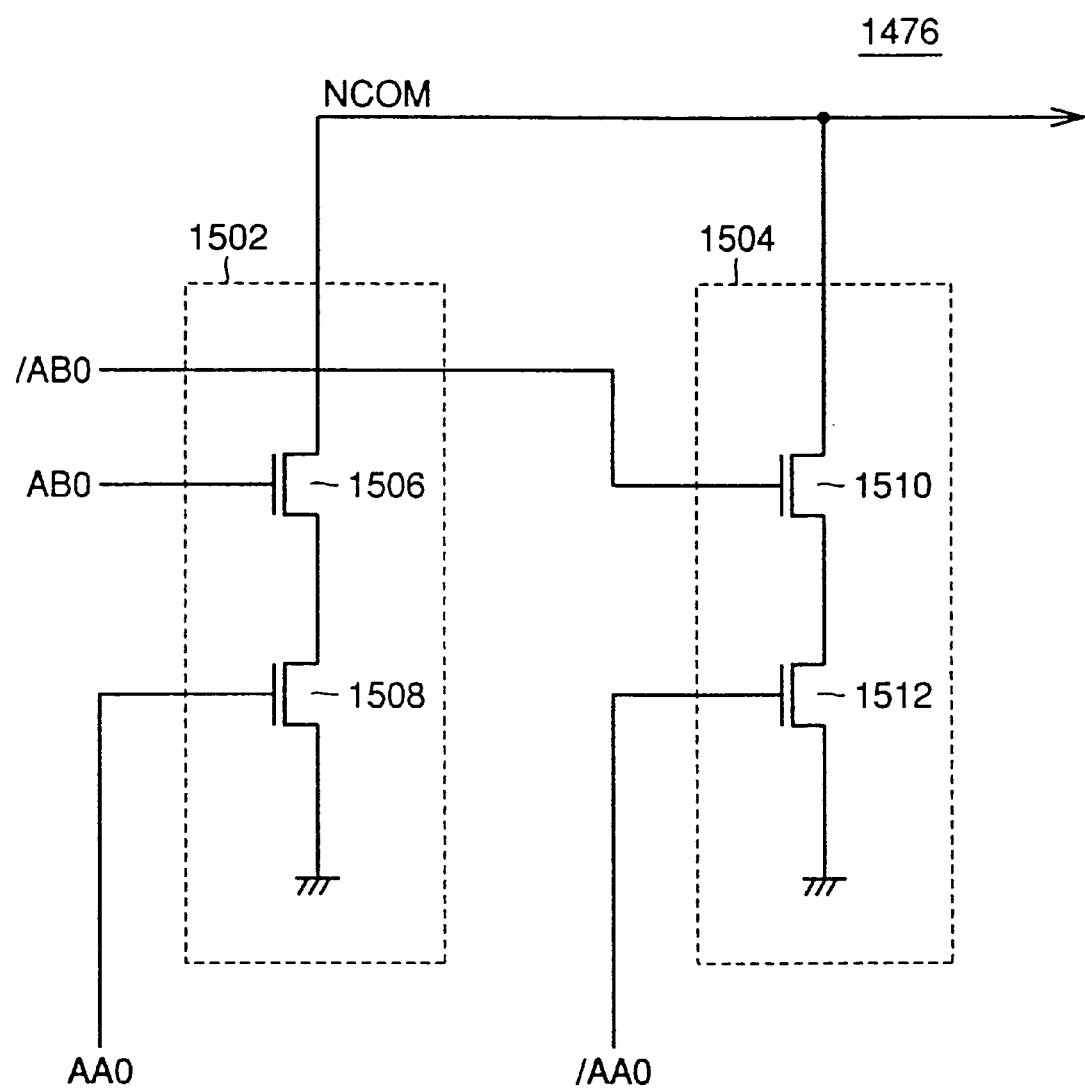
FIG. 52 is a circuit diagram showing a configuration of a bit comparing portion 1476.

FIG. 52 is a circuit diagram showing a configuration of bit comparing portion 1476.

Referring to FIG. 52, bit comparing portion 1476 includes a comparing portion 1502 provided corresponding to the address signal AA0 and a comparing portion 1504 provided corresponding to address signal /AA0.

Comparing portion 1502 includes N channel MOS transistors 1506 and 1508 connected in series between the common node NCOM and the ground node and receiving the signals AB0 and AA0 at their gates, respectively.

Comparing portion 1504 includes N channel MOS transistors 1510 and 1512 connected in series between the common node NCOM and the ground node and receiving the signals /AB0 and /AA0 at their gates, respectively.

Referring to FIGS. 50 and 52, when fuse element 1452 is blown off, the outputs of setting portion 1451 that is, signals AB0 and /AB0 attain to the L level and H level, respectively. At this time, when the signal AA0 is at the H level, the signal /AA0 is at the L level. Therefore, comparing portions 1502 and 1504 are both kept non-conductive. Therefore, the common node NCOM is kept precharged. Conversely, when the signal AA0 is at the L level, the comparing portion 1504 is rendered conductive, and therefore the common node attains to the L level.

When fuse element 1452 is not blown off, the output of setting portion 1451, that is, the signals AB0 and /AB0 are at the H level and L level, respectively. At this time, when the signal AA0 is at the L level, the signal /AA0 is at the H level, and therefore comparing portions 1502 and 1504 are both kept non-conductive. Therefore the common node NCOM is kept precharged. Conversely, when the signal AA0 is at the H level, comparing portion 1502 is rendered conductive, and the common node attains to the L level.

In the above described manner, comparing operation per 1 bit takes place. As the comparing portions corresponding to respective bits are connected in parallel to the common node NCOM, the common is maintained at the H level only when the input address signals of all bits match the settings of the fuse. At this time, an output designating substitution is output from the redundancy determining circuit.

Figure 53:
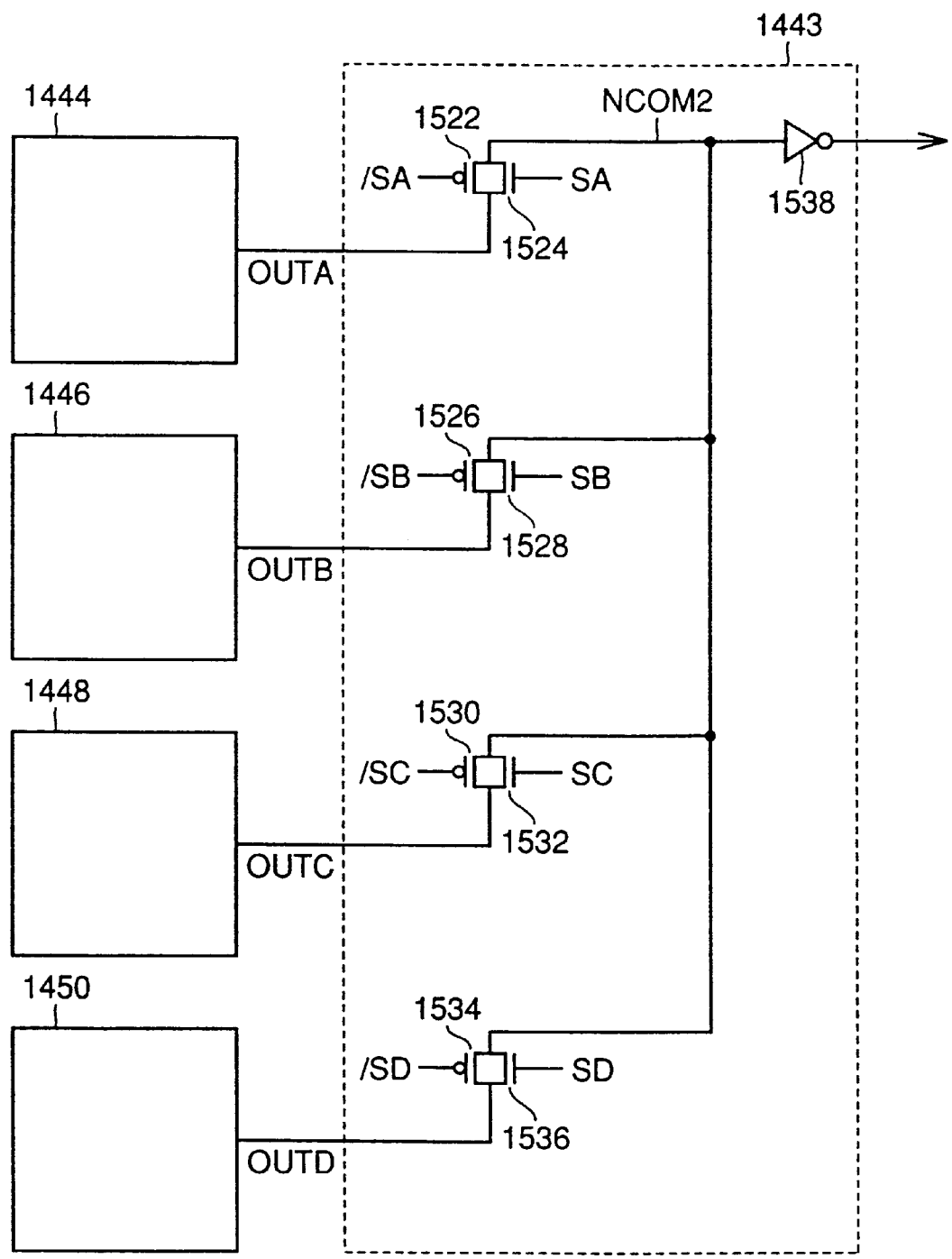
FIG. 53 is a circuit diagram showing a configuration of a select gate portion 1443 shown in FIG. 49.

FIG. 53 is a circuit diagram showing a configuration of select gate portion 1443 shown in FIG. 49.

Referring to FIG. 53, select gate 1443 includes: a P channel MOS transistor 1522 and an N channel MOS transistor 1524 applying a signal OUTA output from address comparing portion 1444 to node NCOM2 when rendered conductive; a P channel MOS transistor 1526 and an N channel MOS transistor 1528 applying a signal OUTB as an output signal from address comparing portion 1446 to the node NCOM2 when rendered conductive; a P channel MOS transistor 1530 and an N channel MOS transistor 1532 applying a signal OUTC as an output signal from address comparing portion 1448 to node NCOM2 when rendered conductive; a P channel MOS transistor 1534 and an N channel MOS transistor 1536 applying a signal OUTD as an output signal from address comparing portion 1450 to node NCOM2 when rendered conductive; and an inverter 1358 inverting the logic level of node NCOM2 and outputting the result as a redundancy activating signal.

P channel MOS transistor 1522 and N channel MOS transistor 1524 receive selecting signals /SA and SA at their gates. P channel MOS transistor 1526 and N channel MOS transistor 1528 receive selecting signals /SB and SB at their gates, respectively. P channel MOS transistor 1530 and N channel MOS transistor 1532 receive selecting signals ISC and SC at their gates, respectively. P channel MOS transistor 1534 and N channel MOS transistor 1536 receive selecting signals /SD and SD at their gates, respectively.

Figure 54:
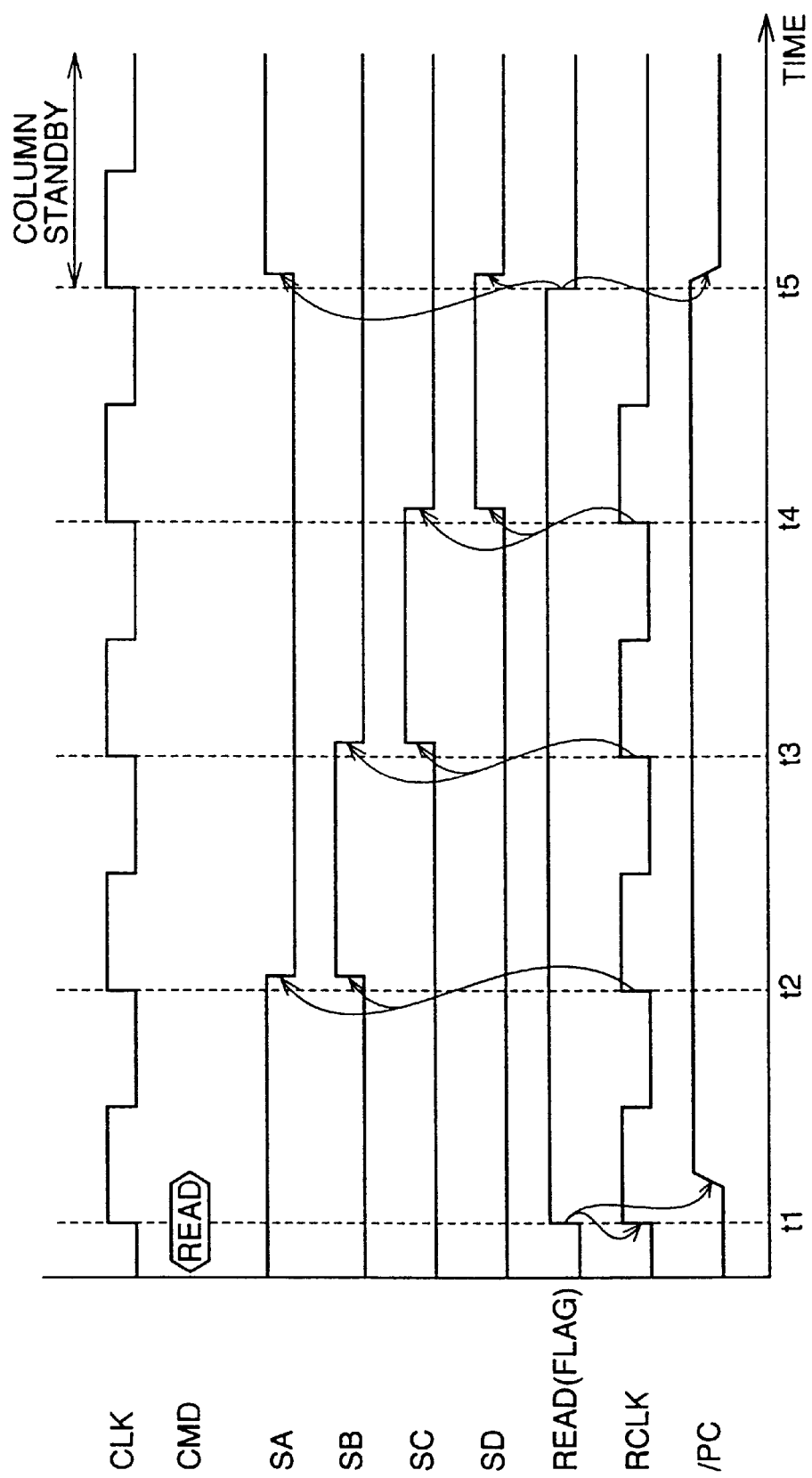
FIG. 54 is a diagram of waveforms illustrating an operation of a redundancy determining circuit.
Figure 55:
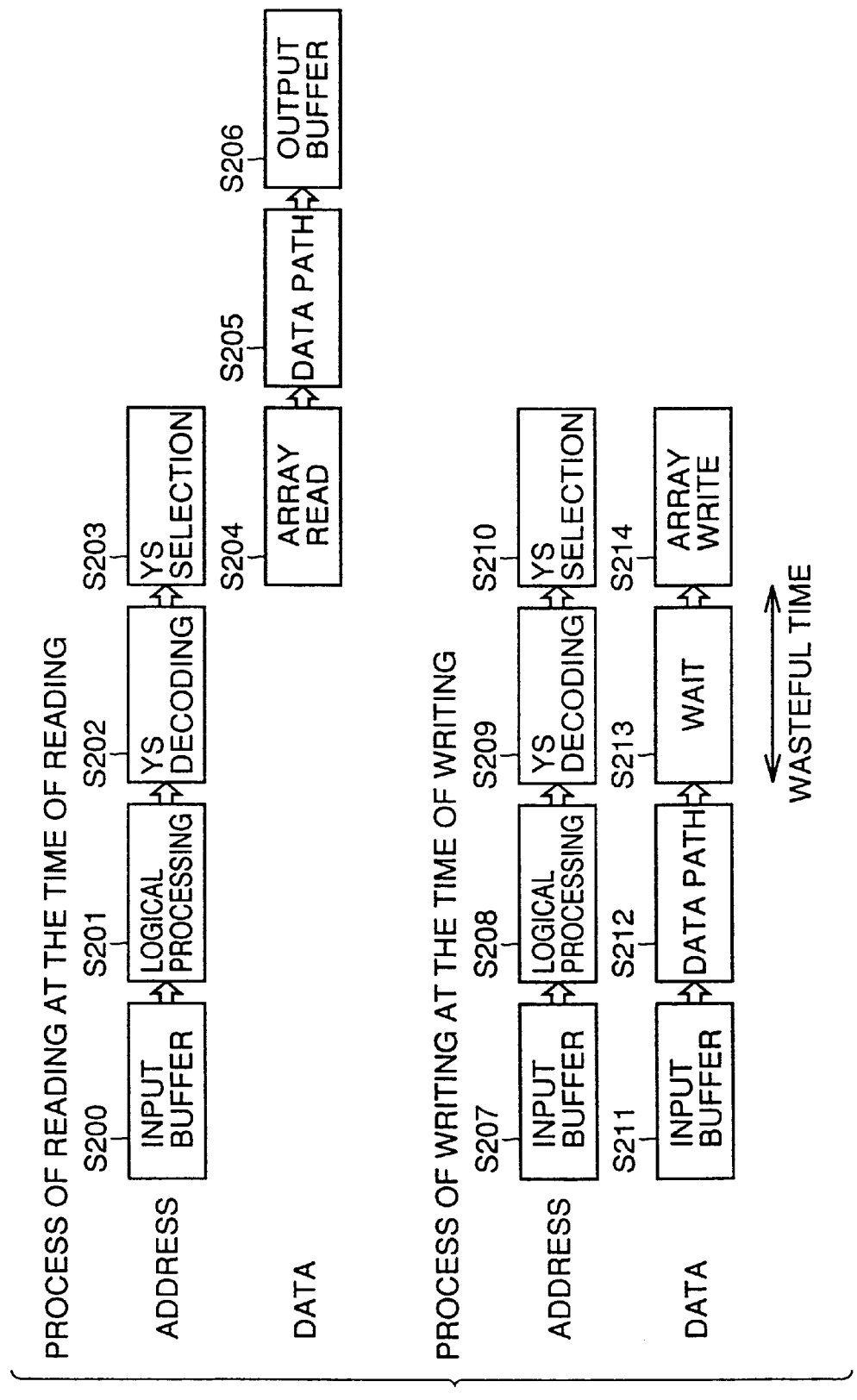
FIG. 55 shows the flow of conventional address processing.

FIG. 54 is a diagram of waveforms related to the operation of the redundancy determining circuit.

Referring to FIGS. 53 and 54, at time t1, a read command is taken in and, in response, a read flag signal READ (FLAG) is activated, and a read clock RCLK is activated.

Between t1 to t2, selecting signal SA is active, the signal OUTA output from address comparing portion 1444 is selected and applied to node NCOM2, and the redundancy activating signal is output.

Between t2 and t3, the selecting signal SB is active, the signal OUTB output from address comparing portion 1446 is selected and applied to node NCOM2, and the redundancy activating signal is output.

Between t3 to t4, the selecting signal SC is active and the signal OUTC output from address comparing portion 1448 is selected and applied to node NCOM2, and the redundancy activating signal is output.

Between t4 to t5, the selecting signal SD is active, the signal OUTD output from address comparing portion 1450 is selected and applied to node NCOM2, and the redundancy activating signal is output.

After the time point t5, output of the read clock RCLK corresponding to the burst length is terminated, the precharge signal /PC is again activated, and common node of each address comparing portion is precharged. At this time, the selecting signal SA is activated, to be ready for next reading.

As the burst cycle precedes in the above described manner, signals from address comparing portions 1444 to 1450 are transmitted in interleaved manner. That the address comparing portions are operated in the interleaved manner means that comparison is performed in all the address comparing portions 1444 to 1450 in the first cycle, and the time necessary for comparison in the second and the following cycles can be ignored. Therefore, the speed of operation of the synchronous semiconductor memory device can be improved.

The feature of address transmission in accordance with the fifth embodiment is that there are a plurality of logic operation portions for burst address generation and the like, and addresses related to the operation are transmitted simultaneously thereto. Accordingly, results of respective logic operations are provided in parallel. The converted addresses are subjected to redundancy determination collectively at one time.

As described above, by this configuration, row related to address transmission can effectively be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device receiving an address signal in synchronization with a clock signal and inputting/outputting data, comprising:
    a memory array having a plurality of memory cells arranged in a matrix of rows and columns, said memory array being divided into a plurality of memory areas; and
    a plurality of delay shift circuits provided corresponding to said plurality of memory areas respectively, each outputting, in a reading operation, a selecting signal selecting a part of corresponding said memory area in response to said address signal, and in a writing operation, each outputting said selecting signal with a delay by a unit of a period of said clock signal as compared with said reading operation, in response to said address signal.

2. The synchronous semiconductor memory device according to claim 1, wherein each of said delay shift circuits includes a shift register latching said selection signal and performing said delay operation in response to said clock signal.

3. The synchronous semiconductor memory device according to claim 1, receiving a mask signal masking a write data, wherein
    each of said delay shift circuits includes a shift register latching said selection signal, performing said delay operation in response to said clock signal, and performing an operation of clearing said selecting signal in response to said mask signal.

4. The synchronous semiconductor memory device according to claim 1, wherein each of said memory areas includes
    a normal memory area including a plurality of normal memory cells, and
    a redundant memory area including a plurality of redundant memory cells; and
    each of said delay shift circuits includes
    a shift register latching an activation signal activating said redundant memory area in response to said address signal and performing said delay operation in response to said clock signal.

5. A synchronous semiconductor memory device receiving an address signal and a control signal in synchronization with a clock signal and inputting/outputting data, comprising:
    a memory array having a plurality of memory cells arranged in a matrix of rows and columns, said memory array being divided into a plurality of memory areas; and
    a plurality of flag holding circuits, each flag holding circuit provided corresponding to a respective memory area in the plurality of memory areas, each holding a read flag indicating a read operation designated by said control signal and a write flag indicating a write operation designated by said control signal.

6. The synchronous semiconductor memory device according to claim 5, further comprising:
    control unit outputting a read signal indicating a read operation and a write signal indicating a write operation to each of said memory areas in response to said control signal; wherein
    each of said flag holding circuit includes
    a read latch circuit receiving and holding as said read flag said read signal, and
    a write latch circuit receiving and holding as said write flag said write signal.

7. The synchronous semiconductor memory device according to claim 5, further comprising:
    a first control unit outputting a read signal indicating a read operation and a write signal indicating a write operation to each of said memory areas in response to said control signal; and
    a second control unit outputting a row access signal indicating activation of a row to each of said memory areas in response to said address signal; wherein
    each of said flag holding circuit includes
    a read latch circuit taking said read signal and holding as said read flag in response to said row access signal, and
    a write latch circuit taking said write signal and holding as said write flag in response to said row access signal.

* * * * *